(12) United States Patent
Nomura

(10) Patent No.: US 7,671,656 B2
(45) Date of Patent: Mar. 2, 2010

(54) LEVEL CONVERTING CIRCUIT

(75) Inventor: Masahiro Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/196,422

(22) Filed: Aug. 22, 2008

(65) Prior Publication Data

US 2009/0033403 A1    Feb. 5, 2009

Related U.S. Application Data

(62) Division of application No. 10/533,304, filed on Apr. 29, 2005, now Pat. No. 7,425,860.

(30) Foreign Application Priority Data

Oct. 31, 2002  (JP) .............................. 2002-319151

(51) Int. Cl.
*H03L 5/00* (2006.01)
(52) U.S. Cl. ..................... 327/333; 326/80; 326/81
(58) Field of Classification Search .................. None
See application file for complete search history.

(56) References Cited

U.S. PATENT DOCUMENTS

| | | | |
|---|---|---|---|
| 5,669,684 A | 9/1997 | Agan | |
| 5,999,033 A | 12/1999 | Keeth et al. | |
| 6,002,290 A | 12/1999 | Avery et al. | |
| 6,091,351 A | 7/2000 | Shimomura | |
| 6,094,083 A | 7/2000 | Noda | |
| 6,249,145 B1 | 6/2001 | Tanaka et al. | |
| 6,369,632 B1 | 4/2002 | Barnes | |
| 6,373,315 B2 | 4/2002 | Tsuji et al. | |
| 6,825,692 B1 | 11/2004 | Chung et al. | |
| 2002/0180508 A1* | 12/2002 | Kanno et al. | 327/333 |
| 2003/0080796 A1 | 5/2003 | Maejima et al. | |

FOREIGN PATENT DOCUMENTS

| | | | |
|---|---|---|---|
| JP | 63-152220 A | 6/1988 |
| JP | 7-264047 A | 10/1995 |
| JP | 9-74348 A | 3/1997 |
| JP | 10-84274 A | 3/1998 |
| JP | 11-195975 A | 7/1999 |
| JP | 11-205140 A | 7/1999 |
| JP | 11-239051 A | 8/1999 |
| JP | 11-261401 A | 9/1999 |
| JP | 2000-124792 A | 4/2000 |
| JP | 2000-174610 A | 6/2000 |
| JP | 2000-349618 A | 12/2000 |
| JP | 2001-68991 A | 3/2001 |
| JP | 2002-185307 A | 6/2002 |

* cited by examiner

*Primary Examiner*—Tuan Lam
(74) *Attorney, Agent, or Firm*—Sughrue Mion, PLLC

(57) ABSTRACT

A level shifter in which short circuit current and the increase in delay are reduced when a first power source is controlled. In a level shifter for converting a signal level of a first logic circuit to which a first power source is supplied into a signal level of a second logic circuit to which a second power source is supplied, the circuit includes a switching circuit between a GND power source terminal of a level shift core circuit and a GND power source. The switching circuit is controlled by a third logic circuit which generates a control signal under control of the first power source, and a pull-up/pull-down circuit at an output of the level shift core circuit. The pull-up and/or pull-down circuit is controlled by the third logic circuit.

16 Claims, 85 Drawing Sheets

LEVEL CONVERTING CIRCUIT

This is a divisional of application Ser. No. 10/533,304 filed Apr. 29, 2005 now U.S. Pat. No. 7,425,860. The entire disclosure of the prior application, application Ser. No. 10/533,304 is hereby incorporated by reference.

TECHNICAL FIELD

The present invention relates to a level shifter, and in particular, to a level shifter in which a leakage current characteristic is improved when a first power source is controlled.

RELATED ART

A level shifter is used in a system LSI including two or more power sources The level shifter receives and out puts a plurality of signals, and operates with a different configuration. For example, as shown in FIG. 1, there has been known a level shifter proposed in Japanese application Laid-Open No. 63-152220 and so on. While a shifter is placed between blocks of different power supply voltages, in order to reduce the system LSI leakage current, it has been required that the level shifter should deal with the situation where one of the blocks goes down and power supply to the block is turned off.

To deal with the requirement, it has been proposed, as disclosed in, for example, U.S. Pat. No. 5,669,684, that a pull-down circuit is disposed on an output side of a level shifter to fix a p-MOS cross-coupled latch state to thereby prevent the leakage current.

The technique disclosed by the article uses, as can be seen from FIG. 1 of the article, a MOS including a drain terminal connected to the output of a level shifter, a gate terminal connected to that of another output of the level shifter, and a source terminal connected to GND.

PROBLEM TO BE SOLVED BY THE INVENTION

However, in the technique disclosed by the U.S. patent, when the first power source turns off and a level shift input signal is indefinite, the pull-down n-MOS is connected to the high state side of a p-MOS cross-coupled latch of the level shifter and hence the gate terminal voltage of the n-MOS possibly exceeds a threshold value of the n-MOS.

In this case, since a conduction path appears between the second power source and a GND power source, there occurs a problem that short circuit current flows.

Additionally, in a case in which the first power source turns on and an input signal is inverted in a hold state, there exits a problem that the short circuit current flows until the power source level increases to a predetermined level and the level shift output is completely changed.

Moreover, the additional n-MOS has a function to enhance the function of the level converter circuit to hold the state of the p-MOS cross-coupled latch. Therefore, the level shift delay increases, particularly, when the potential difference between the first and second power sources becomes large; the level shift margin is lost and hence the level shift cannot be conducted. That is, there also occurs a problem that even the input signal changes, the desired output cannot change.

It is a first object of the present invention to provide a level shifter in which occurrence of short circuit current can be suppressed even when the first power source is controlled and the increase in delay can also be suppressed in the level shift.

DISCLOSURE OF THE INVENTION

In accordance with the invention of a level shifter of a first embodiment, there is provided a level shifter for converting a signal level of a first logic circuit to which a first power source is supplied into a signal level of a second logic circuit to which a second power source is supplied, characterized by including a switching circuit between a GND power source terminal (ground power source terminal) of a level shift core circuit and a GND power source (ground power source), the switching circuit being controlled by a third logic circuit which generates control signals in accordance with control of the first power source, and a pull-up and/or pull-down circuit at an output of the level shift core circuit, the pull-up and/or pull-down circuit being controlled by the third logic circuit.

In accordance with the invention of a level shifter of a second embodiment, there is provided a level shifter for converting a signal level of a first logic circuit to which a first power source is supplied into a signal level of a second logic circuit to which a second power source is supplied, characterized by including a switching circuit between a power source terminal of a level shift core circuit and the second power source, the switching circuit being controlled by a third logic circuit which generates control signals in accordance with control of the first power source, and a pull-up and/or pull-down circuit at outputs of the level shift core circuit, the pull-up and/or pull-down circuit being controlled by the third logic circuit.

In accordance with the invention of a level shifter of a third embodiment, the level shifter in the first and second embodiments is characterized in that the level shift core circuit includes a p-MOS cross-coupled latch including at least two p-MOSs and a differential n-MOS including at least two n-MOSs; each of the p-MOSs includes a source terminal connected to the second power source terminal and a gate terminal connected to a level shift output which is each drain terminal; and each of the n-MOSs includes a source terminal connected to the GND power source terminal, a drain terminal connected to the level shift output, and a gate terminal connected to a level shift input.

In accordance with the invention of a level shifter of a fourth embodiment, the level shifter in the first and second embodiments is characterized in that the level shift core circuit includes: a p-MOS cross-coupled latch including at least two p-MOSs each of which includes a source terminal connected to the second power source and a gate terminal connected to each level shift output; at least two p-MOSs switches in which a source terminal of the other p-MOS is connected to each drain terminal of the p-MOS, each gate terminal of the switches is connected to each level shift input, and each drain terminal of the switches is connected to the level shift output; and a differential n-MOS switch including at least two n-MOSs each of which includes a source terminal connected to the GND power source terminal, a drain terminal connected to the level shift output, and a gate terminal connected to a level shift input.

In accordance with the invention of a level shifter of a fifth embodiment, the level shifter in the first and second embodiments is characterized in that the pull-up and/or pull-down circuit is replaced with a pull-down circuit, the pull-down circuit including one n-MOS or at least two n-MOSs, each of the n-MOSs including a source connected to a GND power source, a gate terminal connected to an inverted signal of a control signal, and a drain terminal connected to at least one of the level shift outputs.

In accordance with the invention of a level shifter of a sixth embodiment, there is provided a level shifter for converting a signal level of a first logic circuit to which a first power source is supplied into a signal level of a second logic circuit to which a second power source is supplied, characterized by including a pull-up and/or pull-down circuit in which the second power source is supplied to level shift outputs of a level shift core circuit, a control circuit to which the second power source is supplied and which receives as inputs thereto a level shift input signal and the level shift output signal, and a switching circuit which is disposed between a power source terminal of the level shift core circuit and the second power source and which is controlled by a third logic circuit, the third logic circuit generating control signals in accordance with control of the first power source, wherein the control circuit is controlled by a control signal from the third logic circuit.

In accordance with the invention of a level shifter of a seventh embodiment, the level shifter in the sixth embodiment is characterized in that the third logic circuit controls the control circuit by control signals from the third logic circuit, and the control circuit produces control signals to control the pull-up and/or pull-down circuit and the level shift core circuit.

In accordance with the invention of a level shifter of an eighth embodiment, the level shifter in the fifth embodiment is characterized in that the control circuit further produces control signals to control the pull-up and/or pull-down circuit to thereby control the pull-up and/or pull-down circuit.

In accordance with the invention of a level shifter of a ninth embodiment, the level shifter in the first, third or sixth embodiments is characterized in that the pull-up and/or pull-down circuit includes at least two p-MOSs each of which including a source terminal connected to the second power source, a gate terminal connected to a control signal, and a drain terminal connected to each of the level shift core outputs.

In accordance with the invention of a level shifter of a tenth embodiment, the level shifter in the first, third or eighth embodiments is characterized in that the pull-up and/or pull-down circuit comprises a p-MOS including a source terminal connected to the second power source, a gate terminal connected to a control signal, and a drain terminal connected to one of the level shift outputs and an n-MOS including a source terminal connected to a GND power source, a gate terminal connected to an inverted signal of a control signal, and a drain terminal connected to other one of the level shift outputs.

In accordance with the invention of a level shifter of an eleventh embodiment, there is provided a level shifter for converting a signal level of a first logic circuit to which a first power source is supplied into a signal level of a second logic circuit to which a second power source is supplied, characterized by comprising a pull-down circuit at level shift output signals of a level shift core circuit and a control circuit to which the second power source is supplied and which receives as inputs thereto level shift input signals and the level shift output signals to produce control signals for the pull-down circuit and the level shift core circuit, wherein the control circuit and the pull-down circuit are controlled by control signals from the third logic circuit In accordance with the invention of a level shifter of a twelfth embodiment, the level shifter in the eleventh embodiment is characterized in that the NAND circuit is of a CMOS circuit configuration and the p-MOS transistor to which the level shift input signal is connected includes a transistor at least having a small ratio of a channel width/a channel length or a high threshold value.

In accordance with the invention of a level shifter of a thirteenth embodiment, the level shifter in the eleventh embodiment is characterized in that the NAND circuit is of a CMOS circuit configuration and the n-MOS transistor to which a control signal output of the third logic circuit is connected includes a source terminal connected to a GND power source.

In accordance with the invention of a level shifter of a fourteenth embodiment, the level shifter in the fifth embodiment is characterized in that the pull-up and/or pull-down circuit includes at least two p-MOSs each of which includes a source terminal connected to the second power source and a gate terminal connected to a control signal from the control circuit, each drain terminal of other p-MOS being connected to each of the level shift outputs; at least two n-MOSs each of which includes a source terminal connected to the GND power source, a gate terminal connected to a control signal from the control circuit, and a drain terminal connected to the level shift outputs; and additionally at least two p-MOSs each of which includes a source terminal connected to the second power source and a gate terminal connected to a control signal from the third logic circuit, a drain terminal of other p-MOS being connected to each of the level shift outputs.

In accordance with the invention of a level shifter of a fifteenth embodiment, the level shifter in the fifth embodiment is characterized in that the pull-up and/or pull-down circuit includes at least two p-MOSs each of which includes a source terminal connected to the second power source and a gate terminal connected to a control signal from the control circuit, each drain terminal of other p-MOS being connected to each of the level shift outputs; at least two n-MOSs each of which includes a source terminal connected to the GND power source, a gate terminal connected to a control signal from the control circuit, and a drain terminal connected to the level shift outputs; and additionally a p-MOS including a source terminal connected to the second power source, a gate terminal connected to a control signal from the third logic circuit, a drain terminal connected to one of the level shift outputs.

In accordance with the invention of a level shifter of a sixteenth embodiment, the level shifter in the seventh embodiment is characterized in that the pull-up and/or pull-down circuit includes at least two p-MOSs each of which includes a source terminal connected to the second power source, a gate terminal connected to a control signal from the control circuit, and a drain terminal connected to each of the level shift outputs; at least two n-MOSs each of which includes a source terminal connected to the GND power source, a gate terminal connected to a control signal from the control circuit, and a drain terminal connected to the level shift outputs; additionally a p-MOS including a source terminal connected to the second power source, a gate terminal connected to a control signal from the third logic circuit, and a drain terminal connected to one of the level shift outputs; and additionally an n-MOS including a source terminal connected to the GND power source, a gate terminal connected to a control signal from the third logic circuit or to an inverted signal of the control signal, and a drain terminal connected to other one of the level shift outputs.

In accordance with the invention of a level shifter of a seventeenth embodiment, the level shifter in the fifth embodiment is characterized in that the pull-up and/or pull-down circuit includes at least two p-MOSs each of which includes a source terminal connected to the second power source and a gate terminal connected to a control signal from the control circuit, a drain terminal of other p-MOS being connected to each of the level shift outputs; at least two n-MOSs each of which includes a source terminal connected to the GND power source, a gate terminal connected to a control signal from the control circuit, and a drain terminal connected to the level shift outputs; and additionally an n-MOS including a source terminal connected to the GND power source, a gate terminal connected to a control signal from the third logic circuit or to an inverted signal of the control signal, and a drain terminal connected to one of the level shift outputs.

In accordance with the invention of a level shifter of an eighteenth embodiment, the level shifter in the fifth embodiment is characterized in that the control circuit comprises a NAND circuit to which the second power source is supplied and which receives as inputs thereto a positively inverted signal of the level shift input signal, an inverted signal of the level shift output signal, and a control output of the third logic circuit and a NAND circuit to which the second power source is supplied and which receives as inputs thereto an inverted signal of the level shift input signal, a positively inverted signal of the level shift output signal, and a control output of the third logic circuit, wherein an output signal of the NAND circuit is produced as a control signal.

In accordance with the invention of a level shifter of a nineteenth embodiment, the level shifter in the eighteenth embodiment is characterized in that the pull-up and/or pull-down circuit further includes at least two p-MOSs each of which includes a source terminal connected to the second power source and a gate terminal connected to a control signal from the control circuit, a drain terminal of other p-MOS being connected to each of the level shift outputs; and additionally at least two p-MOSs each of which includes a source terminal connected to the second power source and a gate terminal connected to a control signal from the third logic circuit, a drain terminal of other p-MOS being connected to each of the level shift outputs.

In accordance with the invention of a level shifter of a twentieth embodiment, the level shifter in the eighteenth embodiment is characterized in that the pull-up and/or pull-down circuit further includes at least two p-MOSs each of which includes a source terminal connected to the second power source, a gate terminal connected to a control signal from the control circuit, and a drain terminal connected to each of the level shift outputs; and additionally a p-MOS including a source terminal connected to the second power source, a gate terminal connected to a control signal from the third logic circuit, and a drain terminal connected to one of the level shift outputs.

In accordance with the invention of a level shifter of a twenty-first embodiment, the level shifter in the eighteenth embodiment is characterized in that the pull-up and/or pull-down circuit includes at least two p-MOSs each of which includes a source terminal connected to the second power source, a gate terminal connected to a control signal from the control circuit, and a drain terminal connected to each of the level shift outputs; additionally a p-MOS including a source terminal connected to the second power source, a gate terminal connected to a control signal from the third logic circuit, and a drain terminal connected to one of the level shift outputs; and additionally an n-MOS including a source terminal connected to the GND power source, a gate terminal connected to a control signal from the third logic circuit or to an inverted signal of the control signal, and a drain terminal connected to other one of the level shift outputs.

In accordance with the invention of a level shifter of a twenty-second embodiment, the level shifter in the eighteenth embodiment is characterized in that the pull-up and/or pull-down circuit includes at least two p-MOSs each of which includes a source terminal connected to the second power source, a gate terminal connected to a control signal from the control circuit, and a drain terminal connected to each of the level shift outputs; and additionally an n-MOS including a source terminal connected to the GND power source, a gate terminal connected to a control signal from the third logic circuit or an inverted signal of the control signal, and a drain terminal connected to one of the level shift outputs.

In accordance with the invention of a level shifter of a twenty-third embodiment, the level shifter in the fifth embodiment is characterized in that the control circuit comprises a NAND circuit to which the second power source is supplied and which receives as inputs thereto a positively inverted signal of the level shift input signal, an inverted signal of the level shift output signal, and a control output of the third logic circuit, a NAND circuit to which the second power source is supplied and which receives as inputs thereto an inverted signal of the level shift input signal, a positively inverted signal of the level shift output, and a control output of the third logic circuit, and at least two inverters to which the second power source is supplied and which respectively receive as inputs thereto outputs from the NAND circuits, wherein each output signal from the inverters is produced as a control signal.

In accordance with the invention of a level shifter of a twenty-fourth embodiment, the level shifter in the eighteenth embodiment is characterized in that the pull-up and/or pull-down circuit includes at least two n-MOSs each of which includes a source terminal connected to the GND power source, a gate terminal connected to a control signal from the control circuit, and a drain terminal connected to the level shift outputs and additionally at least two p-MOSs each of which includes a source terminal connected to the second power source and a gate terminal connected to a control signal from the third logic circuit, a drain terminal of other p-MOS being connected to each of the level shift outputs.

In accordance with the invention of a level shifter of a twenty-fifth embodiment, the level shifter in the twenty-third embodiment is characterized in that the pull-up and/or pull-down circuit includes at least two n-MOSs each of which includes a source terminal connected to the GND power source, a gate terminal connected to a control signal from the control circuit, and a drain terminal connected to the level shift outputs and additionally a p-MOS including a source terminal connected to the second power source, a gate terminal connected to a control signal from the third logic circuit, and a drain terminal connected to one of the level shift outputs.

In accordance with the invention of a level shifter of a twenty-sixth embodiment, the level shifter in the twenty-third embodiment is characterized in that the pull-up and/or pull-down circuit includes at least two n-MOSs each of which includes a source terminal connected to the GND power source, a gate terminal connected to a control signal from the control circuit, and a drain terminal connected to the level shift outputs; additionally a p-MOS including a source terminal connected to the second power source, a gate terminal connected to a control signal from the third logic circuit, and a drain terminal connected to one of the level shift outputs; and additionally an n-MOS including a source terminal connected to the GND power source, a gate terminal connected to a control signal from the third logic circuit or an inverted signal of the control signal, and a drain terminal connected to other one of the level shift outputs.

In accordance with the invention of a level shifter of a twenty-seventh embodiment, the level shifter in the twenty-third embodiment is characterized in that the pull-up and/or pull-down circuit includes at least two n-MOSs each of which includes a source terminal connected to the GND power source, a gate terminal connected to a control signal from the control circuit, and a drain terminal connected to the level shift outputs and additionally an n-MOS including a source terminal connected to the GND power source, a gate terminal connected to a control signal from the third logic circuit or to an inverted signal of the control signal, and a drain terminal connected to other one of the level shift outputs.

In accordance with the invention of a level shifter of a twenty-eighth embodiment, the level shifter in the fourteenth to seventeenth embodiments is characterized in that the control circuit comprises a NOR circuit to which the second power source is supplied and which receives as inputs thereto an inverted signal of the level shift input signal, a positively inverted signal of the level shift output signal, and a control output of the third logic circuit or an inverted signal of the control output, a NOR circuit to which the second power source is supplied and which receives as inputs thereto a positively inverted signal of the level shift input signal, an inverted signal of the level shift output, and a control output of the third logic circuit or an inverted signal of the control output, and at least two inverters to which the second power source is supplied and which respectively receive as inputs thereto outputs from the NOR circuits, wherein output signals respectively from the at least two NOR circuits and the at least two inverters are produced as control signals.

In accordance with the invention of a level shifter of a twenty-ninth embodiment, the level shifter in the twenty-eighth embodiment is characterized in that the NOR circuits are of a CMOS circuit configuration and a p-MOS to which the level shift input signal is connected includes a transistor at least having a small ratio of a channel width/a channel length or a threshold value which is of a negative polarity and which is a large absolute value.

In accordance with the invention of a level shifter of a thirtieth embodiment, the level shifter in the twenty-eighth embodiment is characterized in that the NOR circuits are of a CMOS circuit configuration and a control signal from the third logic circuit or an inverted signal thereof is connected to a p-MOS on a power source side.

In accordance with the invention of a level shifter of a thirty-first embodiment, the level shifter in the nineteenth to twenty-second embodiments is characterized in that the control circuit comprises a NOR circuit to which the second power source is supplied and which receives as inputs thereto an inverted signal of the level shift input signal, a positively inverted signal of the level shift output signal, and a control output of the third logic circuit or an inverted signal of the control output, a NOR circuit to which the second power source is supplied and which receives as inputs thereto a positively inverted signal of the level shift input signal, an inverted signal of the level shift output, and a control output of the third logic circuit or an inverted signal of the control output, and at least two inverters to which the second power source is supplied and which receive as inputs thereto outputs from the respective NOR circuits, wherein each output signal from the inverters is produced as a control signal.

In accordance with the invention of a level shifter of a thirty-second embodiment, the level shifter in the twenty-fourth to twenty-seventh embodiments is characterized in that the control circuit comprises a first NOR circuit to which the second power source is supplied and which receives as inputs thereto an inverted signal of the level shift input signal, a positively inverted signal of the level shift output signal, and a control output of the third logic circuit or an inverted signal of the control output and a second NOR circuit to which the second power source is supplied and which receives as inputs thereto a positively inverted signal of the level shift input signal, an inverted signal of the level shift output, and a control output of the third logic circuit or an inverted signal of the control output, wherein each output signal from the first and second NOR circuits is produced as a control signal.

In accordance with the invention of a level shifter of a thirty-third embodiment, the level shifter in the sixth embodiment is characterized in that the control circuit comprises an AND-NOR circuit to which the second power source is supplied and which receives as inputs thereto a positively inverted signal of the level shift input signal, an inverted signal of the level shift output signal, and a control output of the third logic circuit or an inverted signal of the control output, a NAND circuit to which the second power source is supplied and which receives as inputs thereto an inverted signal of the level shift input signal, a positively inverted signal of the level shift output, and a control output of the third logic circuit, and at least two inverters to which the second power source is supplied and which receive as inputs thereto outputs from the respective NAND circuits, wherein output signals from the AND-NOR circuit, the NAND circuit, and the inverters are produced as control signals.

In accordance with the invention of a level shifter of a thirty-fourth embodiment, the level shifter in the sixth and eighth embodiments is characterized in that the pull-up and/or pull-down circuit includes at least two p-MOSs each of which includes a source terminal connected to the second power source and a gate terminal connected to a control signal from the control circuit, a drain terminal of other p-MOS being connected to each of the level shift outputs and at least two n-MOSs each of which includes a source terminal connected to the GND power source, a gate terminal connected to a control signal from the control circuit, and a drain terminal connected to the level shift outputs.

In accordance with the invention of a level shifter of a thirty-fifth embodiment, the level shifter in the sixth embodiment is characterized in that the control circuit comprises an AND-NOR circuit to which the second power source is supplied and which receives as inputs thereto a positively inverted signal of the level shift input signal, an inverted signal of the level shift output signal, and a control output of the third logic circuit or an inverted signal of the control output and a NAND circuit to which the second power source is supplied and which receives as inputs thereto an inverted signal of the level shift input signal, a positively inverted signal of the level shift output, and a control output of the third logic circuit, wherein respective output signals from the AND-NOR circuit and the NAND circuit are produced as control signals.

In accordance with the invention of a level shifter of a thirty-sixth embodiment, the level shifter in the thirty-fifth embodiment is characterized in that the pull-up and/or pull-down circuit includes at least two p-MOSs each of which includes a source terminal connected to the second power source and a gate terminal connected to a control signal from the control circuit, a drain terminal of other p-MOS being connected to each of the level shift outputs.

In accordance with the invention of a level shifter of the thirty-seventh embodiment, the level shifter in the sixth embodiment is characterized in that the control circuit comprises an AND-NOR circuit to which the second power source is supplied and which receives as inputs thereto a positively inverted signal of the level shift input signal, an inverted signal of the level shift output signal, and a control output of the third logic circuit or an inverted signal of the control output, a NAND circuit to which the second power source is supplied and which receives as inputs thereto an inverted signal of the level shift input signal, a positively inverted signal of the level shift output, and a control output of the third logic circuit, and at least two inverters to which the second power source is supplied and which receive as inputs thereto outputs from the respective NAND circuits, wherein each output signal from the inverters is produced as a control signal.

In accordance with the invention of a level shifter of a thirty-eighth embodiment, the level shifter in the thirty-seventh embodiment is characterized in that the pull-up and/or pull-down circuit includes at least two n-MOSs each of which includes a source terminal connected to the GND power source, a gate terminal connected to a control signal from the control circuit, and a drain terminal connected to the level shift outputs.

In accordance with the invention of a level shifter of a thirty-ninth embodiment, the level shifter in the thirty-fourth embodiment is characterized in that the control circuit comprises an OR-NAND circuit to which the second power source is supplied and which receives as inputs thereto an inverted signal of the level shift input signal, a positively inverted signal of the level shift output signal, and a control output of the third logic circuit, a NOR circuit to which the second power source is supplied and which receives as inputs thereto a positively inverted signal of the level shift input signal, an inverted signal of the level shift output, and a control output of the third logic circuit or an inverted signal of the control output, and at least two inverters to which the second power source is supplied and which receive as inputs thereto outputs from the each of the NOR circuits, wherein each output signal from the OR-NAND circuit, the NOR circuits, and the inverters is produced as a control signal.

In accordance with the invention of a level shifter of a fortieth embodiment, the level shifter in the thirty-ninth embodiment is characterized in that the OR-NAND circuit is of a CMOS circuit configuration and a p-MOS to which the level shift input signal is connected has at least one condition that the p-MOS has a small ratio of a channel width/a channel length or a threshold value which is of a negative polarity and which is a large absolute value.

In accordance with the invention of a level shifter of a forty-first embodiment, the level shifter in the thirty-ninth embodiment is characterized in that the OR-NAND circuit is of a CMOS circuit configuration and a control signal from the third logic circuit is connected to an n-MOS on a GND power source side.

In accordance with the invention of a level shifter of a forty-second embodiment, the level shifter in the thirty-sixth embodiment is characterized in that the control circuit comprises an OR-NAND circuit to which the second power source is supplied and which receives as inputs thereto an inverted signal of the level shift input signal, a positively inverted signal of the level shift output signal, and a control output of the third logic circuit, a NOR circuit to which the second power source is supplied and which receives as inputs thereto a positively inverted signal of the level shift input signal, an inverted signal of the level shift output, and a control output of the third logic circuit or an inverted signal of the control output, and at least two inverters to which the second power source is supplied and which receive as inputs thereto outputs from the respective NOR circuits, wherein each output signal from the inverters is produced as a control signal.

In accordance with the invention of a level shifter of a forty-third embodiment, the level shifter in the thirty-eighth embodiment is characterized in that the control circuit comprises an OR-NAND circuit to which the second power source is supplied and which receives as inputs thereto an inverted signal of the level shift input signal, a positively inverted signal of the level shift output signal, and a control output of the third logic circuit and a NOR circuit to which the second power source is supplied and which receives as inputs thereto a positively inverted signal of the level shift input signal, an inverted signal of the level shift output, and a control output of the third logic circuit or an inverted signal of the control output, wherein each output signal from the OR-NAND circuit and the NOR circuit is produced as a control signal.

In accordance with the invention of a level shifter of a forty-fourth embodiment, the level shifter in the thirty-sixth embodiment is characterized in that the control circuit comprises an AND-NOR circuit to which the second power source is supplied and which receives as inputs thereto a positively inverted signal of the level shift input signal, an inverted signal of the level shift output signal, and a control output of the third logic circuit or an inverted signal of the control output and an AND-NOR circuit to which the second power source is supplied and which receives as inputs thereto an inverted signal of the level shift input signal, a positively inverted signal of the level shift output, and a control output of the third logic circuit or an inverted signal of the control output, wherein each output signal from the AND-NOR circuits is produced as a control signal.

In accordance with the invention of a level shifter of a forty-fifth embodiment, the level shifter in the thirty-sixth embodiment is characterized in that the control circuit comprises an OR-NAND circuit to which the second power source is supplied and which receives as inputs thereto an inverted signal of the level shift input signal, a positively inverted signal of the level shift output signal, and a control output of the third logic circuit, an OR-NAND circuit to which the second power source is supplied and which receives as inputs thereto a positively inverted signal of the level shift input signal, an inverted signal of the level shift output, and a control output of the third logic circuit, and at least two inverters to which the second power source is supplied and which receive as inputs thereto outputs from the respective OR-NAND circuits, wherein each output signal from the inverters is produced as a control signal.

In accordance with the invention of a level shifter of a forty-sixth embodiment, the level shifter in the thirty-eighth embodiment is characterized in that the control circuit comprises an AND-NOR circuit to which the second power source is supplied and which receives as inputs thereto a positively inverted signal of the level shift input signal, an inverted signal of the level shift output signal, and a control output of the third logic circuit or an inverted signal of the control output, an AND-NOR circuit to which the second power source is supplied and which receives as inputs thereto an inverted signal of the level shift input signal, a positively inverted signal of the level shift output, and a control output of the third logic circuit or an inverted signal of the control output, and at least two inverters to which the second power source is supplied and which receive as inputs thereto outputs from the respective AND-NOR circuits, wherein each output signal from the inverters is produced as a control signal.

In accordance with the invention of a level shifter of a forty-seventh embodiment, the level shifter in the thirty-eighth embodiment is characterized in that the control circuit comprises an OR-NAND circuit to which the second power source is supplied and which receives as inputs thereto an inverted signal of the level shift input signal, a positively inverted signal of the level shift output signal, and a control output of the third logic circuit and an OR-NAND circuit to which the second power source is supplied and which receives as inputs thereto a positively inverted signal of the level shift input signal, an inverted signal of the level shift output, and a control output of the third logic circuit, wherein each output signal from the OR-NAND circuits is produced as a control signal.

In accordance with the invention of a level shifter of a forty-eighth embodiment, the level shifter in the forty-seventh embodiment is characterized in that the level shift core circuit comprises a p-MOS cross-coupled latch including at least two of the p-MOS in which each source terminal is connected to the second source and a gate terminal of other p-MOS is connected to each of the level shift outputs, at least two p-MOS switches including a source terminal connected of a drain terminal of the p-MOS, each gate terminal connected to a control signal from the control circuit, and each drain terminal connected to the level shift outputs, and a differential n-MOS switch including at least two n-MOSs each of which includes a source terminal connected to a GND power source, a drain terminal connected to the respective level shift outputs, and a gate terminal connected to a level shift input.

In accordance with the invention of a level shifter of a forty-ninth embodiment, the level shifter in claim one of the fourteenth to seventeenth, nineteenth to twenty-second, and twenty-fourth to twenty-seventh embodiments, characterized in that the control circuit comprises a first NAND circuit to which the second power source is supplied and which receives as inputs thereto a positively inverted signal of the level shift input signal, an inverted signal of the level shift output signal, and a control output of the third logic circuit, a second NAND circuit to which the second power source is supplied and which receives as inputs thereto an inverted signal of the level shift input signal, a positively inverted signal of the level shift output, and a control output of the third logic circuit, and at least two inverters to which the second power source is supplied and which receive as inputs thereto outputs from the respective NAND circuits, wherein each output signal from the first and second NAND circuits and the at least two inverters is produced as a pull-up and/or pull-down control signal and each output signal of the inverters is produced as a control signal of the level shift core circuit.

In accordance with the invention of a level shifter of a fiftieth embodiment, the level shifter in one of the fourteenth to seventeenth, nineteenth to twenty-second and twenty-fourth to twenty-seventh embodiments, characterized in that the control circuit comprises a NOR circuit to which the second power source is supplied and which receives as inputs thereto an inverted signal of the level shift input signal, a positively inverted signal of the level shift output signal, and a control output of the third logic circuit or an inverted signal of the control output, a NOR circuit to which the second power source is supplied and which receives as inputs thereto a positively inverted signal of the level shift input signal, an inverted signal of the level shift output, and a control output of the third logic circuit or an inverted signal of the control output, and at least two inverters to which the second power source is supplied and which respectively receive as inputs thereto outputs from the respective NOR circuits, wherein each output signal from the NOR circuits and the inverters is produced as a pull-up and/or pull-down control signal and each output signal of the NOR circuits is produced as a control signal of the level shift core circuit.

In accordance with the invention of a level shifter of a fifty-first embodiment, the level shifter in claim one of the first, third and sixth to the ninth embodiments characterized in that the switching circuit comprises an n-MOS including a source terminal connected to a GND power source, a gate terminal connected to a control signal, and a drain terminal connected to a GND power source terminal of the level shift core circuit.

In accordance with the invention of a level shifter of a fifty-second embodiment, the level shifter in the thirty-fourth embodiment, characterized in that the control circuit comprises an AND-NOR circuit to which the second power source is supplied and which receives as inputs thereto a positively inverted signal of the level shift input signal, an inverted signal of the level shift output signal, and a control output of the third logic circuit or an inverted signal of the control output, a NAND circuit to which the second power source is supplied and which receives as inputs thereto an inverted signal of the level shift input signal, a positively inverted signal of the level shift output, and a control output of the third logic circuit, and at least two inverters to which the second power source is supplied and which receive as inputs thereto outputs from the respective NAND circuits, wherein each output signal from the AND-NOR circuit, the NAND circuit, and the at least two inverters is produced as a pull-up and/or pull-down control signal and each output signal of the inverters is produced as a control signal of the level shift core circuit.

In accordance with the invention of a level shifter of a fifty-third embodiment, the level shifter in the thirty-ninth embodiment, characterized in that each output signal from the OR-NAND circuit, the NOR circuit, and the inverters is produced as a pull-up and/or pull-down control signal and each output signal of the OR-NAND circuit and the NOR circuit is produced as a control signal of the level shift core circuit.

In accordance with the invention of a level shifter of a fifty-fourth embodiment, the level shifter in the eighth embodiment, characterized in that the control circuit comprises a first AND-NOR circuit to which the second power source is supplied and which receives as inputs thereto a positively inverted signal of the level shift input signal, an inverted signal of the level shift output signal, and a control output of the third logic circuit or an inverted signal of the control output, a second AND-NOR circuit to which the second power source is supplied and which receives as inputs thereto an inverted signal of the level shift input signal, a positively inverted signal of the level shift output, and a control output of the third logic circuit or an inverted signal of the control output, and at least two inverters to which the second power source is supplied and which receive as inputs thereto outputs from the first and second AND-NOR circuits, wherein each output signal from the first and second AND-NOR circuits is produced as a pull-up and/or pull-down control signal and each output signal of the inverters is produced as a control signal of the level shift core circuit, and the pull-up and/or pull-down circuit includes at least two p-MOSs each of which includes a source terminal connected to the second power source and a gate terminal connected to a control signal from the control circuit, a drain terminal of other p-MOS being connected to each of the level shift outputs.

In accordance with the invention of a level shifter of a fifty-fifth embodiment, the level shifter in the eighth embodiment, characterized in that the control circuit comprises a first OR-NAND circuit to which the second power source is supplied and which receives as inputs thereto an inverted signal of the level shift input signal, a positively inverted signal of the level shift output signal, and a control output of the third logic circuit, a second OR-NAND circuit to which the second power source is supplied and which receives as inputs thereto a positively inverted signal of the level shift input signal, an inverted signal of the level shift output, and a control output of the third logic circuit, and at least two inverters to which the second power source is supplied and which receive as inputs thereto outputs from the first and second OR-NAND circuits, wherein each output signal from the at least two inverters is produced as a pull-up and/or pull-down control signal and each output signal from the OR-NAND circuits is produced as a control signal of the level shift core circuit, and the pull-up and/or pull-down circuit includes at least two p-MOSs each of which includes a source terminal connected to the second power source and a gate terminal connected to a control signal from the control circuit, a drain terminal of other p-MOS being connected to each of the level shift outputs.

In accordance with the invention of a level shifter of a fifty-sixth embodiment, the level shifter in one of the fourth to seventh and ninth to eleventh embodiments, characterized in that the control circuit comprises an AND-NOR circuit to which the second power source is supplied and which receives as inputs thereto a positively inverted signal of the level shift input signal, an inverted signal of the level shift output signal, and a control output of the third logic circuit or an inverted signal of the control output, an AND-NOR circuit to which the second power source is supplied and which receives as inputs thereto an inverted signal of the level shift input signal, a positively inverted signal of the level shift output, and a control output of the third logic circuit or an inverted signal of the control output, and at least two inverters to which the second power source is supplied and which receive as inputs thereto outputs from the respective AND-NOR circuits, wherein each output signal from the inverters is produced as a pull-up and/or pull-down control signal, each output signal from the inverters is produced as a control signal of the level shift core circuit, and the pull-up and/or pull-down circuit includes at least two n-MOS each of which includes a source terminal connected to the GND power source, a gate terminal connected to a control signal from the control circuit, and a drain terminal connected to the level shift outputs.

In accordance with the invention of a level shifter of a fifty-seventh embodiment, the level shifter in one of the fourth to seventh and ninth to eleventh embodiments, characterized in that the control circuit comprises a first OR-NAND circuit to which the second power source is supplied and which receives as inputs thereto an inverted signal of the level shift input signal, a positively inverted signal of the level shift output signal, and a control output of the third logic circuit and a second OR-NAND circuit to which the second power source is supplied and which receives as inputs thereto a positively inverted signal of the level shift input signal, an inverted signal of the level shift output, and a control output of the third logic circuit, wherein each output signal from the first and second OR-NAND circuits is produced as a pull-up and/or pull-down control signal, each output signal from the OR-NAND circuits is produced as a control signal of the level shift core circuit, and the pull-up and/or pull-down circuit includes at least two n-MOSs each of which includes a source terminal connected to the GND power source, a gate terminal connected to a control signal from the control circuit, and a drain terminal connected to the level shift outputs.

In accordance with the invention of a level shifter of a fifty-eighth embodiment, the level shifter in one of the fourth to seventh and ninth to eleventh embodiments, characterized in that the control circuit comprises an AND-NOR circuit to which the second power source is supplied and which receives as inputs thereto a positively inverted signal of the level shift input signal, an inverted signal of the level shift output signal, and a control output of the third logic circuit or an inverted signal of the control output, an AND-NOR circuit to which the second power source is supplied and which receives as inputs thereto an inverted signal of the level shift input signal, a positively inverted signal of the level shift output, and a control output of the third logic circuit or an inverted signal of the control output, and at least two inverters to which the second power source is supplied and which receive as inputs thereto outputs from the respective AND-NOR circuits, wherein each output signal of the inverters is produced as a control signal of the level shift core circuit.

In accordance with the invention of a level shifter of claim 59 a fifty-ninth embodiment, the level shifter in one of the fourth to seventh and ninth to eleventh embodiments, characterized in that the control circuit comprises an OR-NAND circuit to which the second power source is supplied and which receives as inputs thereto an inverted signal of the level shift input signal, a positively inverted signal of the level shift output signal, and a control output of the third logic circuit and an OR-NAND circuit to which the second power source is supplied and which receives as inputs thereto a positively inverted signal of the level shift input signal, an inverted signal of the level shift output, and a control output of the third logic circuit, wherein each output signal from the OR-NAND circuits is produced as a control signal of the level shift core circuit.

In accordance with the invention of a level shifter of a sixtieth embodiment, the level shifter in one of the first, third, tenth, fifty-ninth and the sixtieth embodiments, characterized in that: the level shift core circuit comprises a p-MOS cross-coupled latch including at least two first p-MOS, a differential n-MOS including at least two n-MOSs, and at least two second p-MOS, wherein: the p-MOS cross-coupled latch includes a source terminal connected to the second power source and a gate terminal connected to a level shift output which is each drain terminal; the differential n-MOS includes each source terminal connected to the GND power source, each drain terminal connected to the level shift output, and each gate terminal connected to a level shift input; and the second p-MOS includes each drain terminal connected to the second power source, each gate terminal connected to the level shift input, and each source terminal connected to the level shift output.

In accordance with the invention of a level shifter of a sixty-first embodiment, there is provided a level shifter for converting a signal level of a first logic circuit to which a first power source is supplied into a signal level of a second logic circuit to which a second power source is supplied, characterized by including a pull-down circuit at level shift outputs of a level shift core circuit and a control circuit to which the second power source is supplied and which receives as inputs thereto level shift input signals and the level shift output signals to produce control signals for a pull-down circuit and a level shift core circuit, wherein the control circuit is also connected to control signals from the third logic circuit.

In accordance with the invention of a level shifter of a sixty-second embodiment, the level shifter in the sixty-first embodiment, characterized in that the control circuit, the control circuit comprises a first OR-NAND circuit to which the second power source is supplied and which receives as inputs thereto an inverted signal of the level shift input signal, a positively inverted signal of the level shift output signal, and a control output of the third logic circuit and a second OR-NAND circuit to which the second power source is supplied and which receives as inputs thereto a positively inverted signal of the level shift input signal, an inverted signal of the level shift output, and a control output of the third logic circuit, wherein each output signal from the first and second OR-NAND circuits is produced as a pull-up and/or pull-down control signal, each output signal from the OR-NAND circuits is produced as a control signal of the level shift core circuit, and the pull-down circuit, the pull-up and/or pull-down circuit include at least two n-MOSs each of which includes a source terminal connected to the GND power source, a gate terminal connected to a control signal from the control circuit, and a drain terminal connected to the level shift outputs.

In accordance with the invention of a level shifter of a sixty-third embodiment, the level shifter in the sixty-first embodiment, characterized in that the control circuit, the control circuit comprises a first OR-NAND circuit to which the second power source is supplied and which receives as inputs thereto an inverted signal of the level shift input signal, a positively inverted signal of the level shift output signal, and a control output of the third logic circuit and a second OR-NAND circuit to which the second power source is supplied and which receives as inputs thereto a positively inverted signal of the level shift input signal, an inverted signal of the level shift output, and a control output of the third logic circuit or an inverted signal of the control output, wherein each output signal from the first and second OR-NAND circuits is produced as a pull-up and/or pull-down control signal, each output signal from the OR-NAND circuits is produced as a control signal of the level shift core circuit, and the pull-down circuit, the pull-up and/or pull-down circuit include at least two n-MOSs each of which includes a source terminal connected to the GND power source, a gate terminal connected to a control signal from the control circuit, and a drain terminal connected to the level shift outputs.

In accordance with the invention of a level shifter of a sixty-fourth embodiment, the level shifter in one of the second, seventh to the ninth and sixty-first embodiments, characterized in that the switching circuit comprises a p-MOS including a source terminal connected to the second power source, a gate terminal connected to a control signal or an inverted signal thereof, and a drain terminal connected to a power source terminal of the level shift core circuit.

In accordance with the invention of a level shifter of a sixty-fifth embodiment, the level shifter in one of the third, fifth, sixth and sixty-first embodiments, characterized in that the control circuit comprises at least two NOR circuits to which the second power source is supplied and which receives as inputs thereto an inverted signal of the level shift input signal, a positively inverted signal of the level shift output signal, and a control output of the third logic circuit or an inverted signal of the control output and a NOR circuit to which the second power source is supplied and which receives as inputs thereto a positively inverted signal of the level shift input signal, an inverted signal of the level shift output, and a control output of the third logic circuit or an inverted signal of the control output, wherein each output signal from the NOR circuits is produced as a control signal of the level shift core circuit.

In accordance with the invention of a level shifter of a sixty-sixth embodiment, the level shifter in one of the third, eleventh, twelfth and sixty-first embodiments, characterized in that the control circuit comprises at least two NAND circuits to which the second power source is supplied and which receives as inputs thereto a positively inverted signal of the level shift input signal, an inverted signal of the level shift output signal, and a control output of the third logic circuit, a NAND circuit to which the second power source is supplied and which receives as inputs thereto an inverted signal of the level shift input signal, a positively inverted signal of the level shift output signal, and a control output of the third logic circuit, and at least two inverters to which the second power source is supplied and which receives as inputs thereto outputs from the respective NAND circuits, wherein each output signal from the inverters is produced as a control signal of the level shift core circuit.

BRIEF DESCRIPTION OF DRAWINGS

FIG. 5 is a circuit diagram showing an example of a level shift core circuit used in the first embodiment and so on.

FIG. 6 is a circuit diagram showing another example of a level shift core circuit used in the first embodiment and so on.

FIG. 7 is a circuit diagram showing an example of a switching circuit used in the first embodiment and so on.

FIG. 8 is a circuit diagram showing an example of a pull-up/pull-down circuit used in the first embodiment and so on.

FIG. 11 is a circuit diagram showing another example of a pull-up/pull-down circuit used in the first embodiment and so on.

FIG. 12 is a circuit diagram showing further another example of a pull-up/pull-down circuit used in the first embodiment and so on.

FIG. 13 is a circuit diagram showing still another example of a pull-up/pull-down circuit used in the first embodiment and so on.

FIG. 14 is a circuit diagram showing another example of a level shift core circuit used in the first embodiment and so on.

FIG. 15 is a circuit diagram showing another example of FIG. 12 of a level shift core circuit used in the first embodiment and so on.

FIG. 16 is a circuit diagram showing another example of a level shift core circuit used in the first embodiment and so on.

FIG. 17 is a circuit diagram showing another example of FIG. 13 of a level shift core circuit used in the first embodiment and so on.

FIG. 18 is a circuit diagram showing further another example of a level shift core circuit used in the first embodiment and so on.

FIG. 19 is a circuit diagram showing another example of FIG. 15 of a level shift core circuit used in the first embodiment and so on.

FIG. 21 is a circuit diagram showing an example of a level shift core circuit used in the second embodiment and so on.

FIG. 22 is a circuit diagram showing an example of a pull-down circuit used in the second embodiment and so on.

FIG. 23 is a circuit diagram showing another example of a pull-down circuit used in the second embodiment and so on.

FIG. 25 is a circuit diagram showing an example of a control circuit used in the third embodiment and so on.

FIG. 26 is a circuit diagram showing an example of a pull-up/pull-down circuit used in the third embodiment and so on.

FIG. 27 is a circuit diagram showing an example of a NAND circuit constituting a control circuit used in the third embodiment and so on.

FIG. 29 is a circuit diagram showing another example of a pull-up/pull-down circuit used in the third embodiment and so on.

FIG. 30 is a circuit diagram showing further another example of a pull-up/pull-down circuit used in the third embodiment and so on.

FIG. 31 is a circuit diagram showing still another example of a pull-up/pull-down circuit used in the third embodiment and so on.

FIG. 32 is a circuit diagram showing another example of a control circuit used in the third embodiment and so on.

FIG. 33 is a circuit diagram showing an example of a pull-up/pull-down circuit used in the third embodiment and so on.

FIG. 34 is a circuit diagram showing another example of a pull-up/pull-down circuit used in the third embodiment and so on.

FIG. 35 is a circuit diagram showing further another example of a pull-up/pull-down circuit used in the third embodiment and so on.

FIG. 36 is a circuit diagram showing still another example of a pull-up/pull-down circuit used in the third embodiment and so on.

FIG. 37 is a circuit diagram showing an example of a level shift core circuit used in a fifth embodiment and so on.

FIG. 38 is a circuit diagram showing another example of a control circuit used in the third embodiment and so on.

FIG. 39 is a circuit diagram showing still another example of a pull-up/pull-down circuit used in the third embodiment and so on.

FIG. 40 is a circuit diagram showing still another example of a pull-up/pull-down circuit used in the third embodiment and so on.

FIG. 41 is a circuit diagram showing still another example of a pull-up/pull-down circuit used in the third embodiment and so on.

FIG. 42 is a circuit diagram showing still another example of a pull-up/pull-down circuit used in the third embodiment and so on.

FIG. 43 is a circuit diagram showing further another example of a control circuit used in the third embodiment and so on.

FIG. 44 is a circuit diagram showing still another example of a control circuit used in the third embodiment and so on.

FIG. 45 is a circuit diagram showing still another example of a control circuit used in the third embodiment and so on.

FIG. 46 is a circuit diagram showing another example of a NOR circuit constituting a control circuit used in the third embodiment and so on.

FIG. 48 is a circuit diagram showing an example of a control circuit used in the fourth embodiment and so on.

FIG. 49 is a circuit diagram showing an example of a pull-up/pull-down circuit used in the fourth embodiment and so on.

FIG. 50 is a circuit diagram showing an example of an AND-NOR circuit constituting a control circuit used in the fourth embodiment and so on.

FIG. 52 is a circuit diagram showing another example of a control circuit used in the fourth embodiment and so on.

FIG. 53 is a circuit diagram showing another example of a pull-up/pull-down circuit used in the fourth embodiment and so on.

FIG. 54 is a circuit diagram showing another example of a control circuit used in the fourth embodiment and so on.

FIG. 55 is a circuit diagram showing another example of a pull-up/pull-down circuit used in the fourth embodiment and so on.

FIG. 56 is a circuit diagram showing another example of a control circuit used in the fourth embodiment and so on.

FIG. 57 is a circuit diagram showing further another example of a control circuit used in the fourth embodiment and so on.

FIG. 58 is a circuit diagram showing still another example of a control circuit used in the fourth embodiment and so on.

FIG. 59 is a circuit diagram showing an example of an OR-NAND circuit constituting a control circuit used in the fourth embodiment and so on.

FIG. 60 is a circuit diagram showing still another example of a control circuit used in the fourth embodiment and so on.

FIG. 61 is a circuit diagram showing still another example of a control circuit used in the fourth embodiment and so on.

FIG. 62 is a circuit diagram showing another example of a control circuit used in the fourth embodiment and so on.

FIG. 63 is a circuit diagram showing still another example of a control circuit used in the fourth embodiment and so on.

FIG. 65 is a circuit diagram showing an example of a level shift core circuit used in the fifth embodiment and so on.

FIG. 66 is a circuit diagram showing an example of a control circuit used in the fifth embodiment and so on.

FIG. 67 is a circuit diagram showing another example of a control circuit used in the fifth embodiment and so on.

FIG. 68 is a circuit diagram showing still another example of a control circuit used in the fifth embodiment and so on.

FIG. 69 is a circuit diagram showing still another example of a control circuit used in the fifth embodiment and so on.

FIG. 70 is a circuit diagram showing still another example of a control circuit used in the fifth embodiment and so on.

FIG. 71 is a circuit diagram showing still another example of a control circuit used in the fifth embodiment and so on.

FIG. 72 is a circuit diagram showing still another example of a control circuit used in the fifth embodiment and so on.

FIG. 73 is a circuit diagram showing still another example of a control circuit used in the fifth embodiment and so on.

FIG. 75 is a circuit diagram showing an example of a control circuit used in the sixth embodiment and so on.

FIG. 76 is a circuit diagram showing another example of a control circuit used in the sixth embodiment and so on.

FIG. 77 is a circuit diagram showing another example of a control circuit used in the sixth embodiment and so on.

FIG. 78 is a circuit diagram showing still another example of a control circuit used in the sixth embodiment and so on.

FIG. 79 is a circuit diagram showing still another example of a control circuit used in the sixth embodiment and so on.

FIG. 80 is a circuit diagram showing still another example of a control circuit used in the sixth embodiment and so on.

FIG. 81 is a circuit diagram showing still another example of a control circuit used in the sixth embodiment and so on.

FIG. 82 is a circuit diagram showing still another example of a control circuit used in the sixth embodiment and so on.

Figure 1:
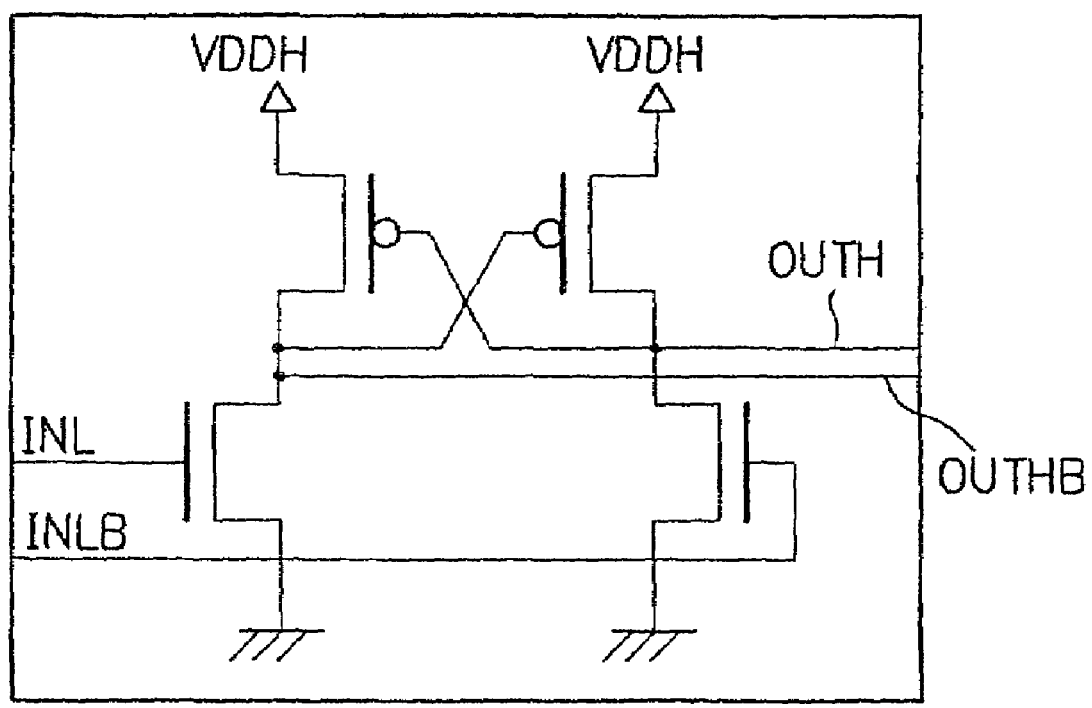
FIG. 1 is a circuit diagram showing an example of a conventional level shifter.
Figure 2:
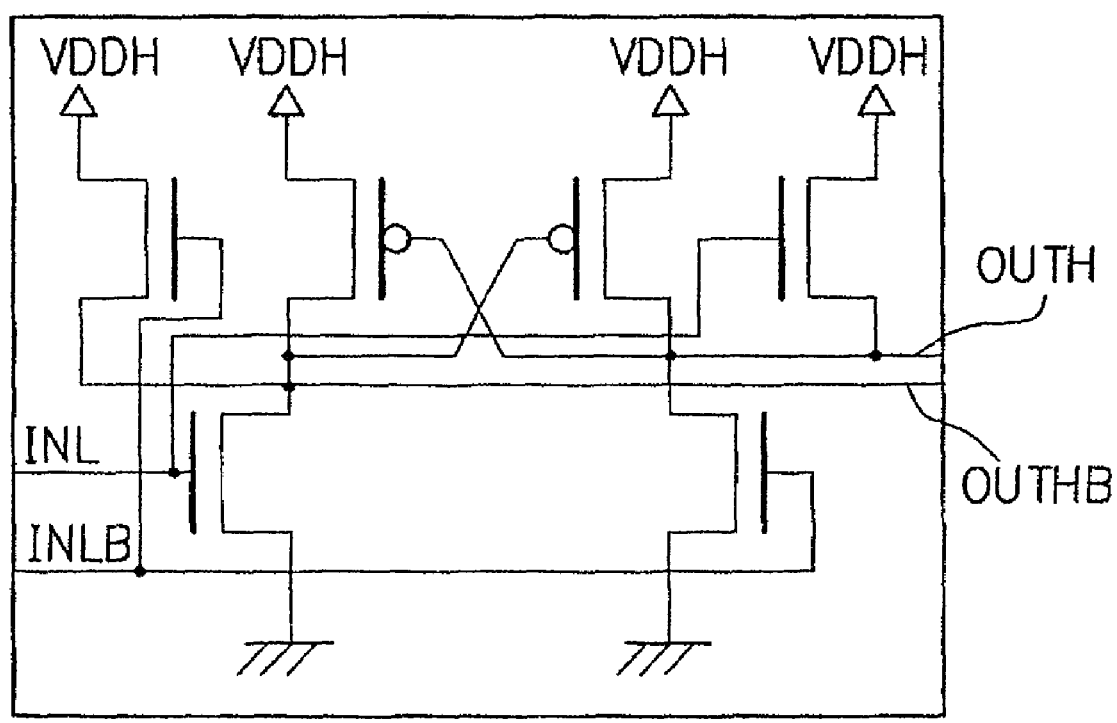
FIG. 2 is a circuit diagram showing an example of a conventional level shifter.
Figure 3:
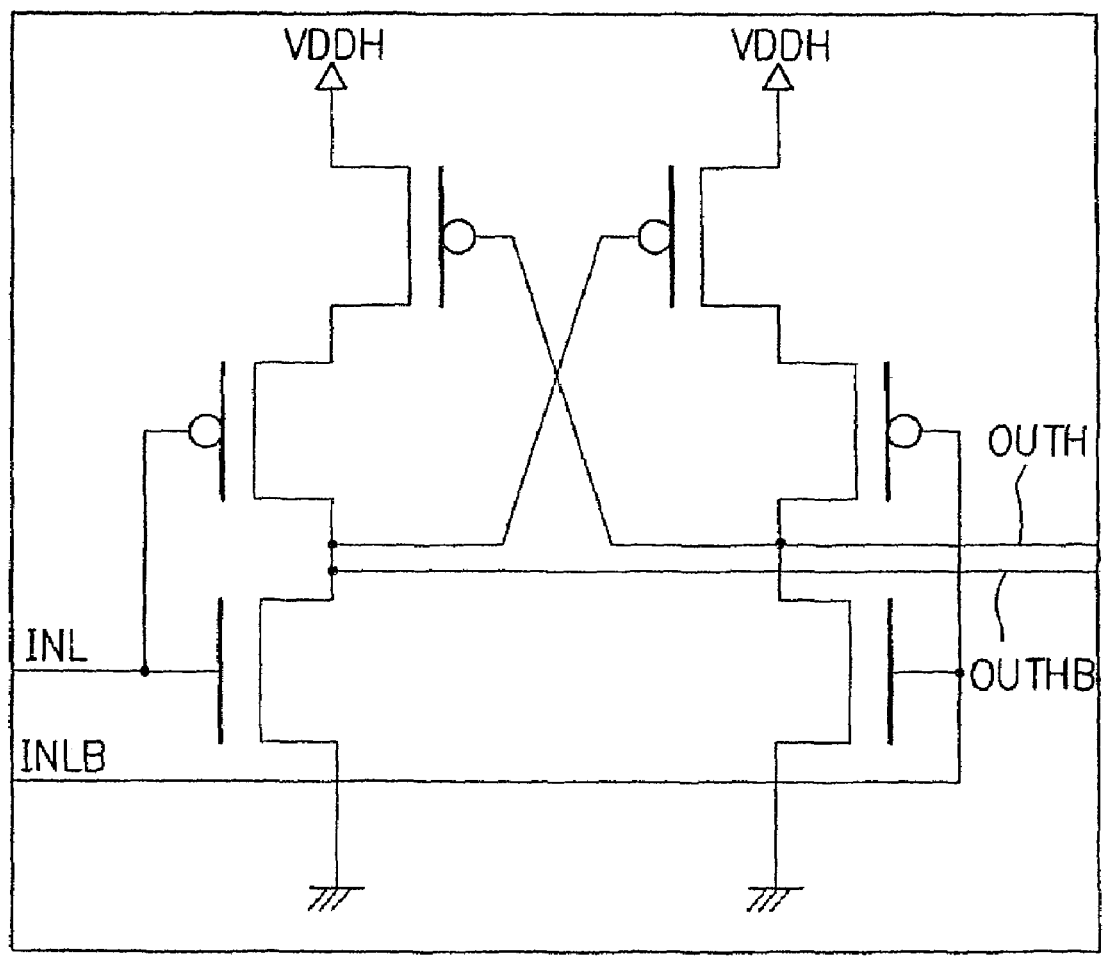
FIG. 3 is a circuit diagram showing an example of a conventional level shifter.

Incidentally, reference numeral 1 is a level shift core circuit. Reference numeral 2 is a control circuit. Reference numeral 3 is a pull-up/pull-down circuit. Reference numeral 3-1 is a pull-up circuit. Reference numeral 3-2 is a pull-down circuit. Reference numeral 10 is a switching circuit. Reference numeral 11 is a first logic circuit. Reference numeral 12 is a second logic circuit. Reference numeral 13 is a third logic circuit.

BEST MODE FOR CARRYING OUT THE INVENTION

Referring to the accompanying drawings, description will be given in detail of an embodiment of the present invention.

The level shifter of the present invention is characterized in that a switching circuit controlled by a control signal is disposed between a GND power source terminal of a level shift core circuit and a GND power source, and a pull-up and/or pull-down circuit controlled by a control signal is connected to a level shift output.

Each of the switching circuit and the pull-up and/or pull-down circuit conducts an operation (function) in which to control a first power source, each of the circuit exclusively turns off (on); and to turn the first power source off, each of the circuit prevents short circuit current and fixes a level shift output signal. There are hence obtained advantages of reliable suppression of the short circuit current and suppression of the delay increase in the level shift.

FIRST EMBODIMENT

Figure 4:
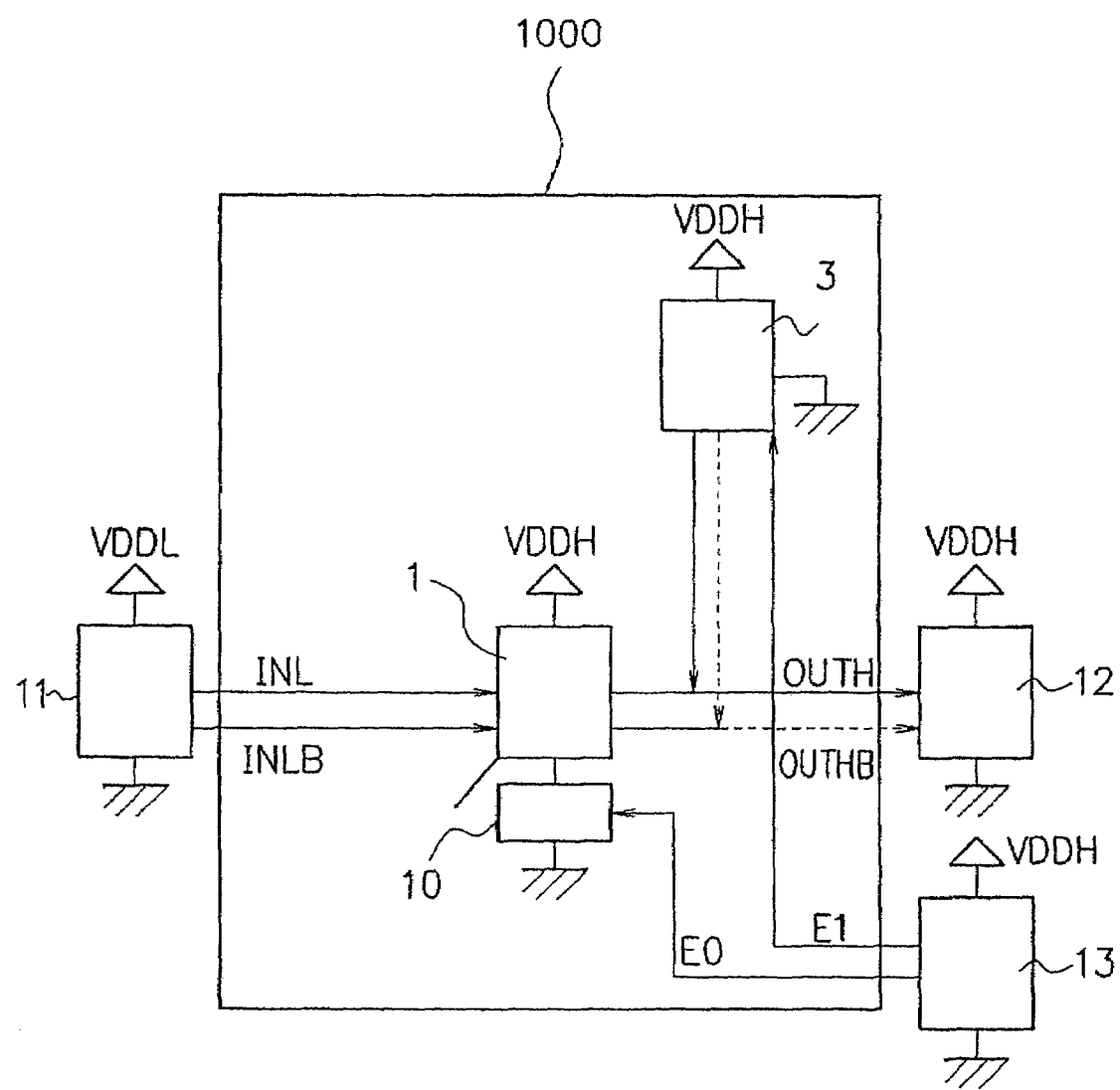
FIG. 4 is a circuit diagram showing a configuration example in a first embodiment of a level shifter of the present invention.

FIG. 4 shows an embodiment of a level converter circuit of the present invention.

The level converter circuit converts a signal level of a first logic circuit 11 supplied with a first power source (VDDL) into a signal level of a second logic circuit 12 supplied with a second power source (VDDH), and the level converter includes a level shift core circuit 1.

A signal (data; INL,INLB) at the first power source level is fed from the first logic circuit 11 to the core circuit 1 to be converted into a signal at the second power source level (the level shift output is indicated by OUTH,OUTHB in FIG. 4).

Moreover, in the first embodiment of the level converter in accordance with the present invention, a switching circuit 10 controlled by a control signal (E0) from a third logic circuit and a pull-up and/or pull-down circuit 3 connected to a level shift output and controlled by a control signal (E1) from the third logic circuit 13 are disposed between a GND power source terminal of the core circuit 1 and a GND power source. To control the first power source (VDDL), the switching circuit 10 and the pull-up and/or pull-down circuit 3 are controlled by the third logic circuit 13; to turn the first power source (VDDL) off, the switching circuit 10 is beforehand turned off and the pull-up and/or pull-down circuit 3 is turned on to prevent short circuit current and to determine a level shift output signal when the level shift input is indefinite. Additionally, to turn the first power source (VDDL) on, when the first power source and the level shift input are stabilized thereafter, the pull-up and/or pull-down circuit 3 is turned off and the switching circuit 10 is turned on to conduct the level shift. The level shift output signal (OUTH, OUTHB) thus obtained is supplied to the second logic circuit 12.

Figure 5:
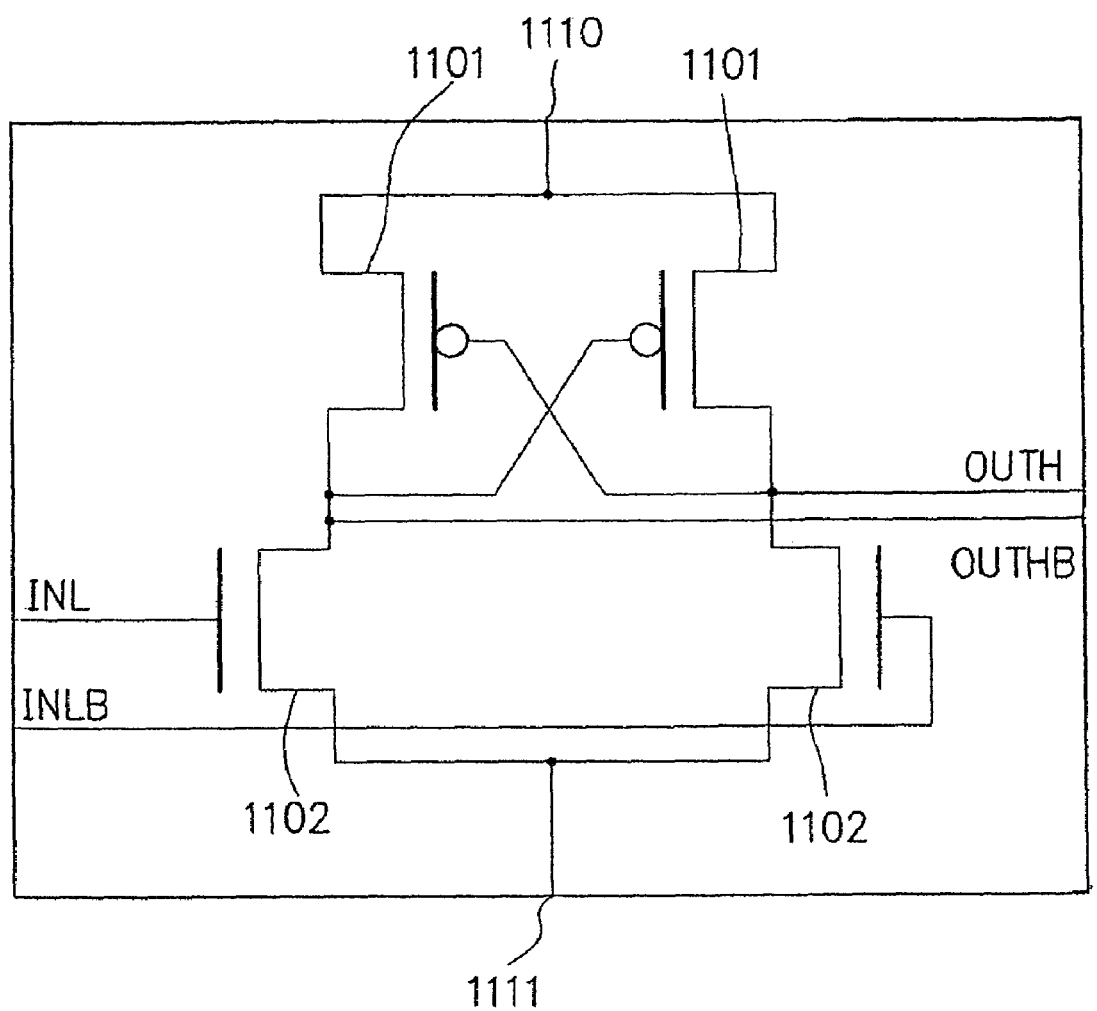
Figure 6:
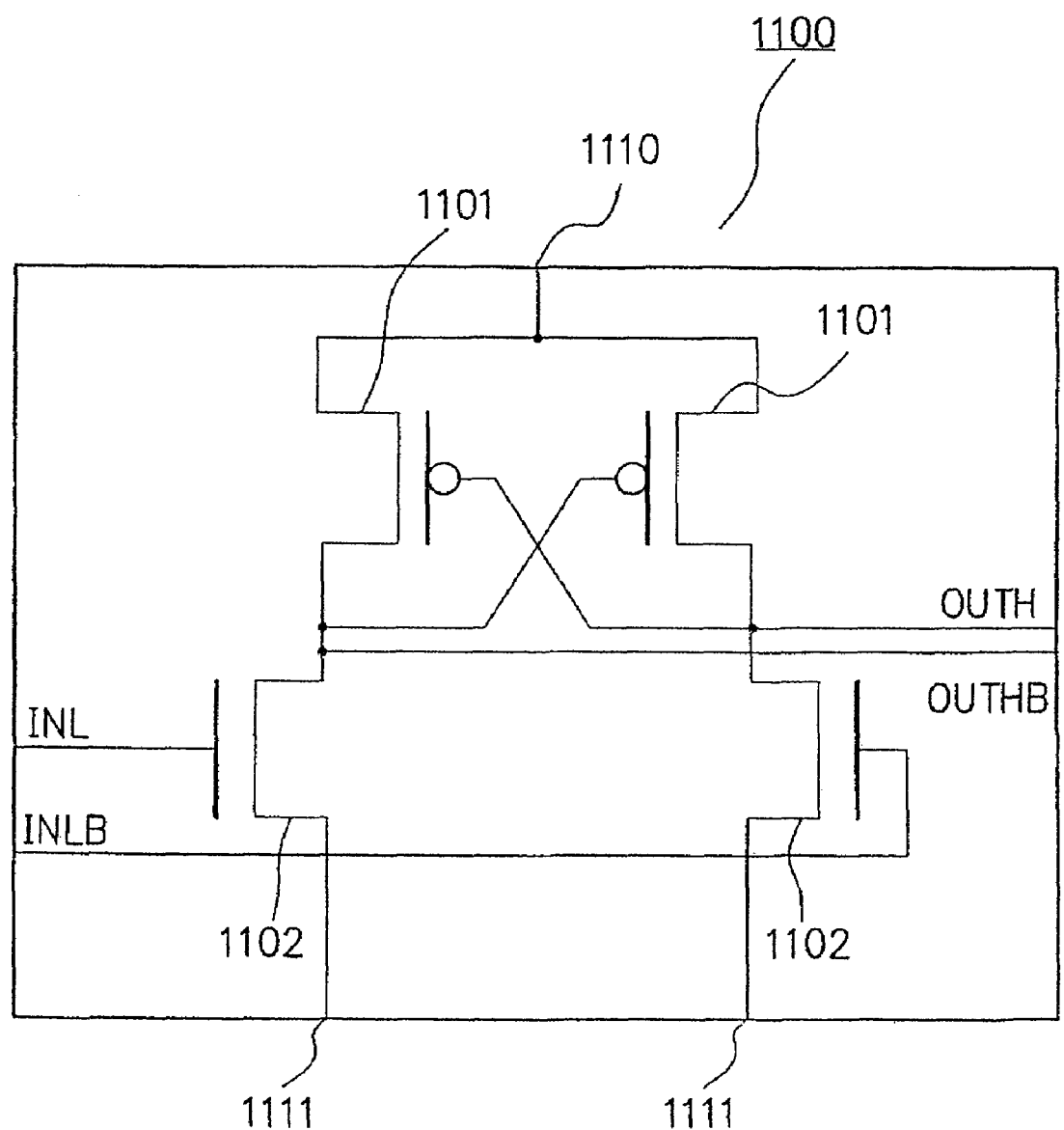

FIG. 5 shows a configuration example of a level shift core circuit 1 used in the level converter of FIG. 4. That is, the level shift core circuit 1 used in the embodiment includes at least two p-MOSs (p-MOS transistors; to be simply referred to as p-MOS hereinbelow; n-MOS transistors are similarly referred to as n-MOS) 1101 whose source terminals are connected to a second power source (VDDH) and whose drain terminals respectively connected to level shift outputs (OUTHB, OUTH) are connected in cross-coupled connection and n-MOS 1102 whose drain terminals are respectively connected to the level shift outputs (OUTHB, OUTH), whose gate terminal is connected to INL, and whose source terminals are connected to a GND power source terminal 111. FIG. 5 shows a circuit diagram in which the GND power source side 1111 on the source side of the n-MOS 1102 is shared therebetween. FIG. 6 shows a circuit diagram in which the GND power source side 1111 on the source side of the n-MOS 1102 is independently wired.

Figure 7:
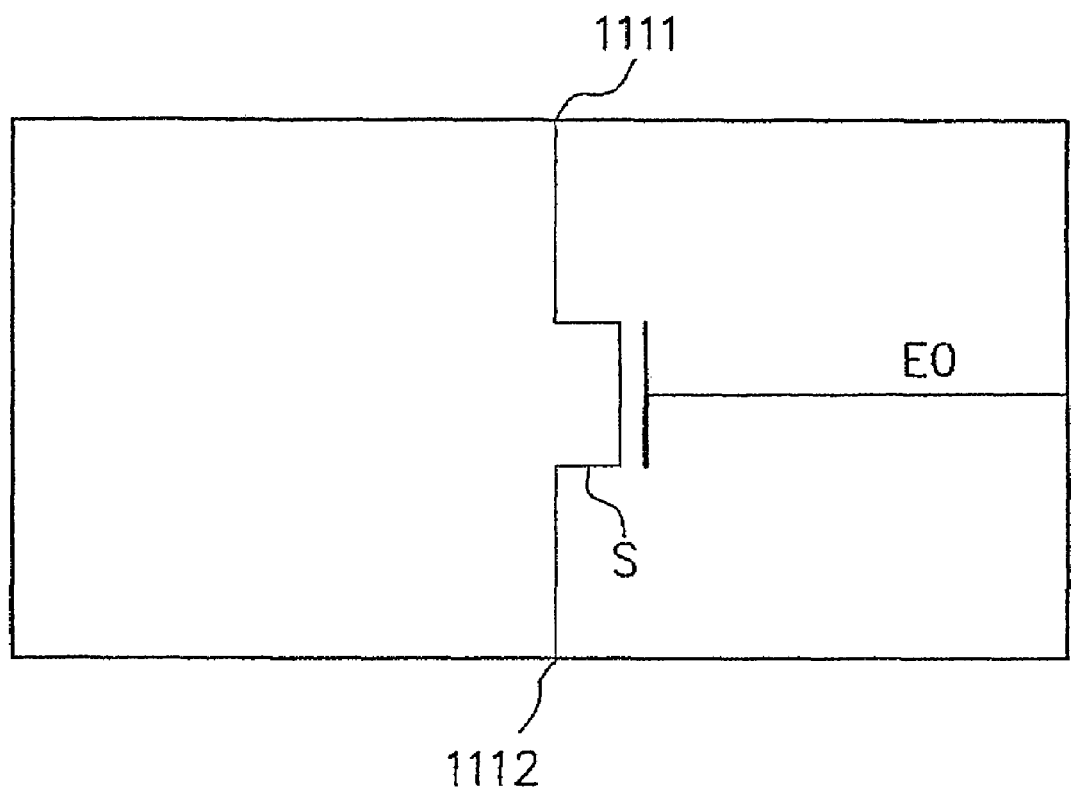

In the configuration of the switching circuit 10 shown in FIG. 7 and used in the level converter of FIG. 4, the GND power source terminal side of the switching circuit 10 shown in FIG. 7 is independently (in parallel) connected to independent wires of the GND side on the source side of the n-MOS in FIG. 6. That is, while one switching circuit is disposed in FIG. 5, two (or more) switching circuits are connected in parallel to each n-MOS of the core circuit 1, and the source side of the n-MOS 101-1 is connected to GND (ground) in the level shift core circuit 1 shown in FIG. 6. In this situation, the connection 1112 to the n-MOS 101-1 of the switching circuit can be separately conducted or can be conducted after a common connection is established (wiring lines are connected into one common connection wiring line).

Figure 8:
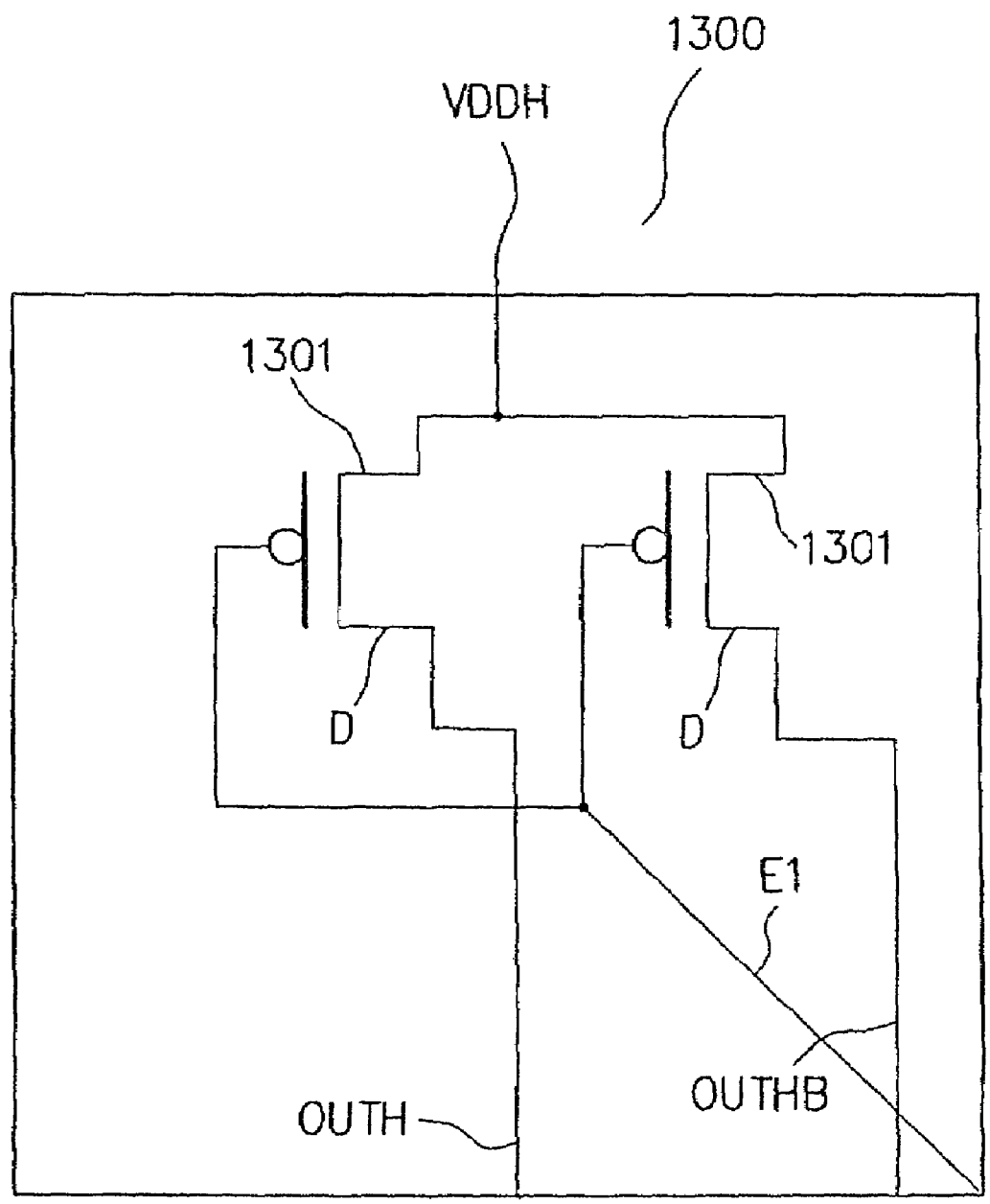

As shown in FIG. 8, a pull-up circuit 3-1 used in the first embodiment of the level converter of the present invention is configured as below. That is, the configuration includes at least two (or two) p-MOS 1301 of which respective source terminals are connected to a second power source terminal (VDDH), of which respective gate electrodes are connected to a control signal E1 from a third logic circuit 13, and of which respective drain terminals are connected respectively to level shift outputs (OUTH: out-high signal, OUTHB: out-high bar signal). By adopting the above configuration, the level shifter using the pull-up circuit in accordance with the first embodiment of the present invention executes processing similar to that described above.

Each logic circuit of FIG. 4, particularly, the third logic circuit 13 has a function to output control signals E0 and E1 according to control of the first power source (VDDL). However, details thereof are not directly related to the present invention and hence description thereof will be avoided. Incidentally, for the logic circuits such as the third logic circuit 13 to output the control signals E0 and E1, known configurations can be used.

Figure 9:
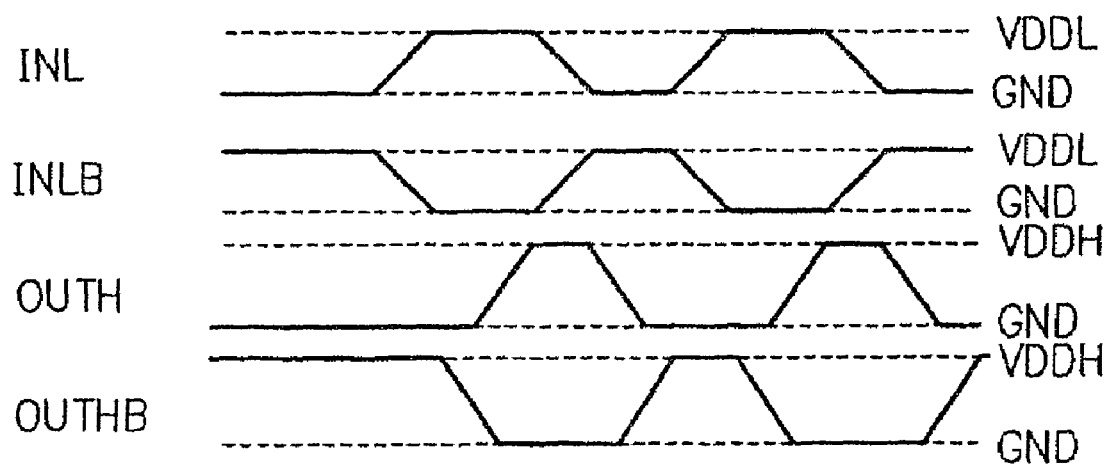
FIG. 9 is a timing chart showing an operation example of a level shift core circuit section of the present invention.

Next, description will be given of an operation example of the first embodiment. First, operation of the level shift core circuit 1 will be described using the timing chart shown in FIG. 9. In the level converting operation using a differential power source level, level shift inputs INL (IN low signal) and INLB (IN low bar signal) are differentially inputted at a first power source level, the output (OUTH or OUTHB) on the side connected to the n-MOS receiving a high-level input is reduced to Low, and an opposite-side output (OUTHB or OUTH) is increased to a second power source level, i.e., High level.

Figure 10:
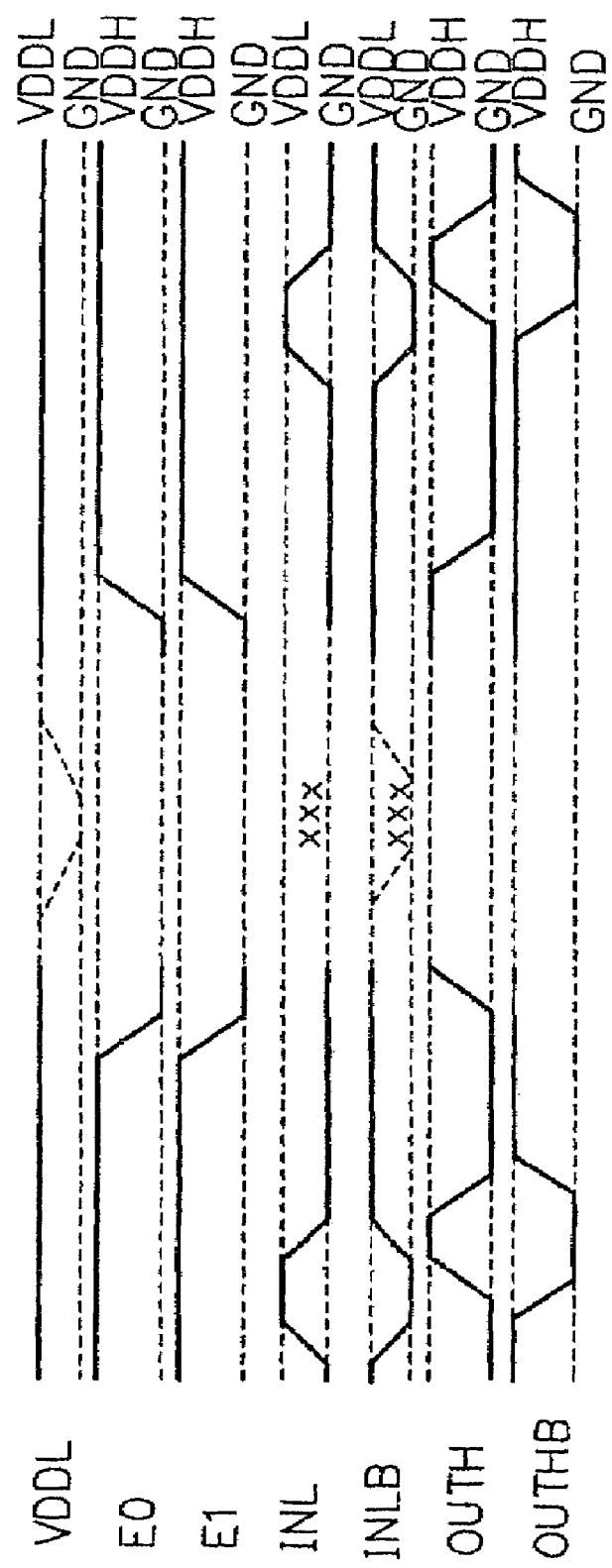
FIG. 10 is a timing chart showing an operation example of the first embodiment of the level shift core circuit section of the present invention.

On the other hand, the operation of the level converter including the switching circuit 10 and the pull-up/pull-down circuit 3 is conducted according to the timing chart shown in FIG. 10. That is, when the first power source VDDL is in an on state, the control signals E0 and E1 from the third logic circuit 13 are High; when the switching circuit 10 is in an on state and the circuit 3 is in an off state, the level converter conducts a level converting operation similar to that of FIG. 9.

At transition of the first power source VDDL 12 to "off", the control signals E0 and E1 are first changed to Low and the switching circuit 10 is set to off such that the pull-up/pull-down circuit 3 is in an on state, which prevents short circuit current of the level converter and which fixes the level shift outputs (OUTH,OUTHB) respectively to High.

As a result, even when the level shift inputs (INL,INLB) are indefinite when VDDL is set to off, the short circuit current and random output changes (random change-over between "on" and "off") can be prevented. Next, to turn the first power source VDDL on, VDDL is first turned on to a stable state and then the control signals E0 and E1 are changed to High; the pull-up/pull-down circuit is turned off, the switching circuit is turned on; when one (OUTH) of the level shift outputs rises up according to a level shift input, the level converting operation is conducted in a way similar to that of FIG. 9.

As above, in the operation to control the first power source VDDL, since the switching circuit 10 is changed to off and the pull-up/pull-down circuit 3 is changed to on, it is possible to prevent the short circuit current and the random change of the output associated with the indefinite level shift input.

Therefore, even in an LSI having many power sources, reduction in leakage current can be achieved by turning the power source of an unused block off while suppressing the overhead as described above.

Figure 11:
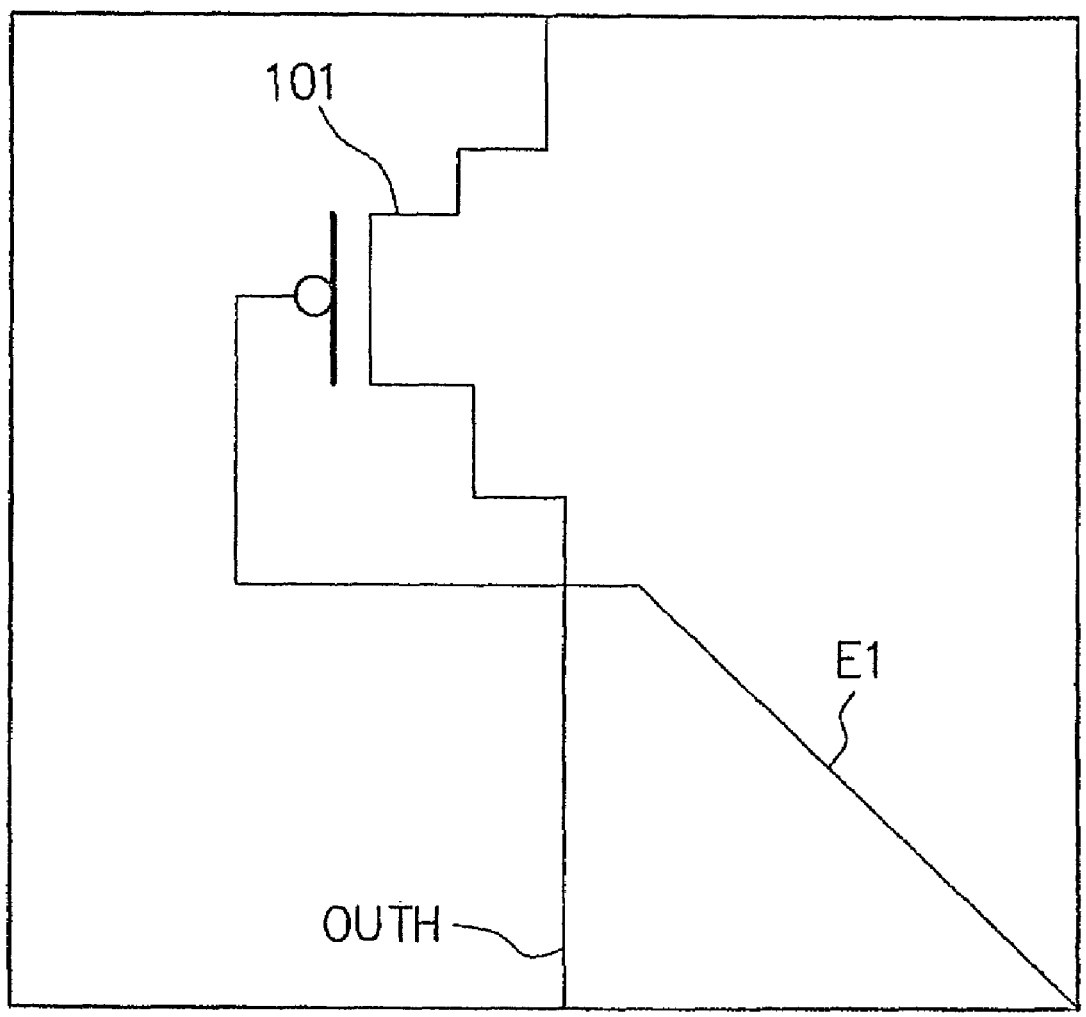
Figure 12:
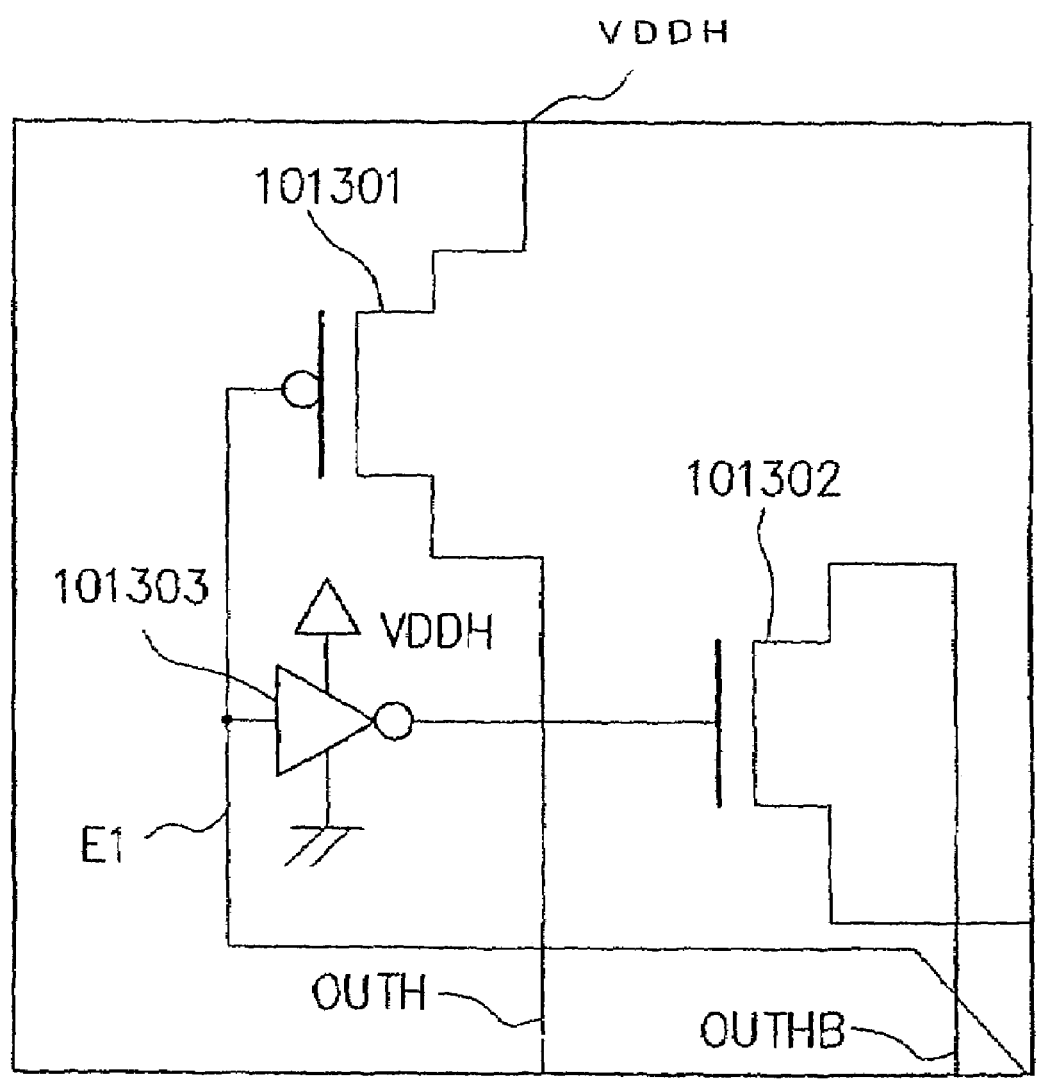
Figure 13:
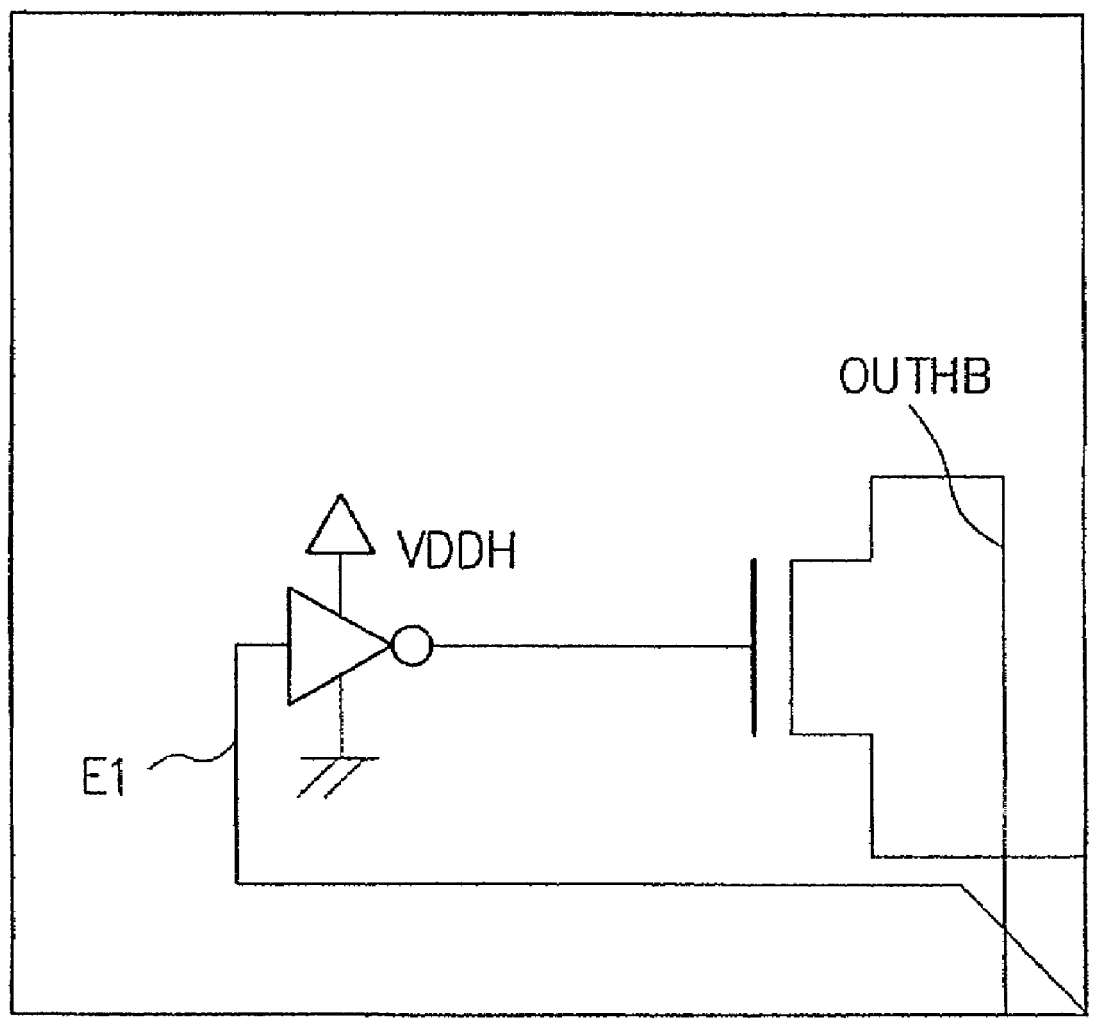
Figure 14:
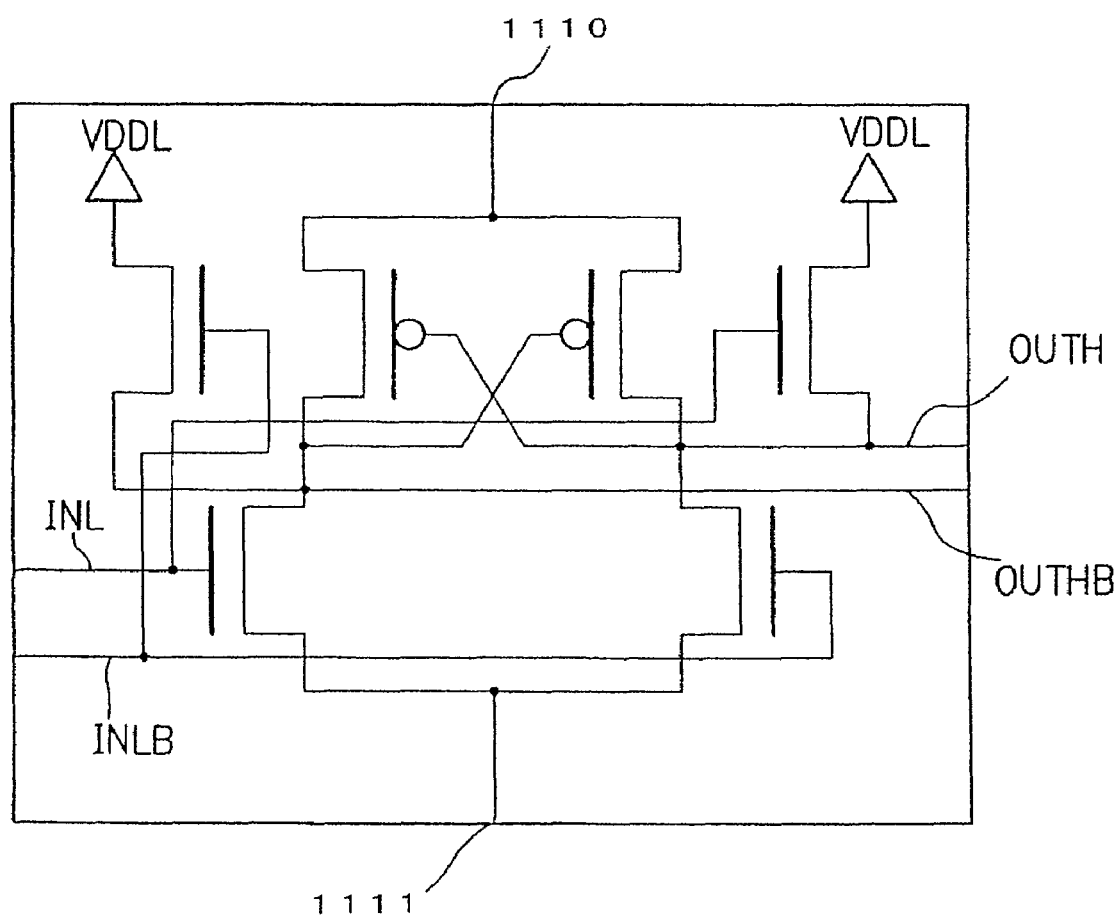

When only the level shift output OUTH is connected to the second logic circuit 11 (e.g., only the output of OUTH or OUTHB is inputted as shown in FIGS. 11 and 13), the pull-up/pull-down circuit 3 used in the embodiment may be replaced by a circuit using only one p-MOS 101 as shown in FIG. 11. Additionally, when complementarity of the level shift outputs is required (two signal inputs of OUTH and OUTHB are required and these two signals are logically inverted), the circuit may be replaced using one pull-up p-MOS 101301, one pull-down n-MOS 101302, and a control signal logic inverting inverter 101303 disposed in a preceding stage of the gate of n-MOS 101302 as shown in FIG. 12.

Furthermore, when the level shift output OUTH or OUTHB is required to be Low, the circuit may be replaced by a pull-down circuit including one n-MOS 101302 and an inverter 101303 to invert a control signal as shown in FIG. 13. When the pull-down circuit is adopted as a pull-up and/or pull-down circuit of the level converter of the present invention, if an inverted control signal is outputted from the third logic circuit side, the inverter 101303 of the pull-down circuit of FIG. 13 is not required.

Figure 15:
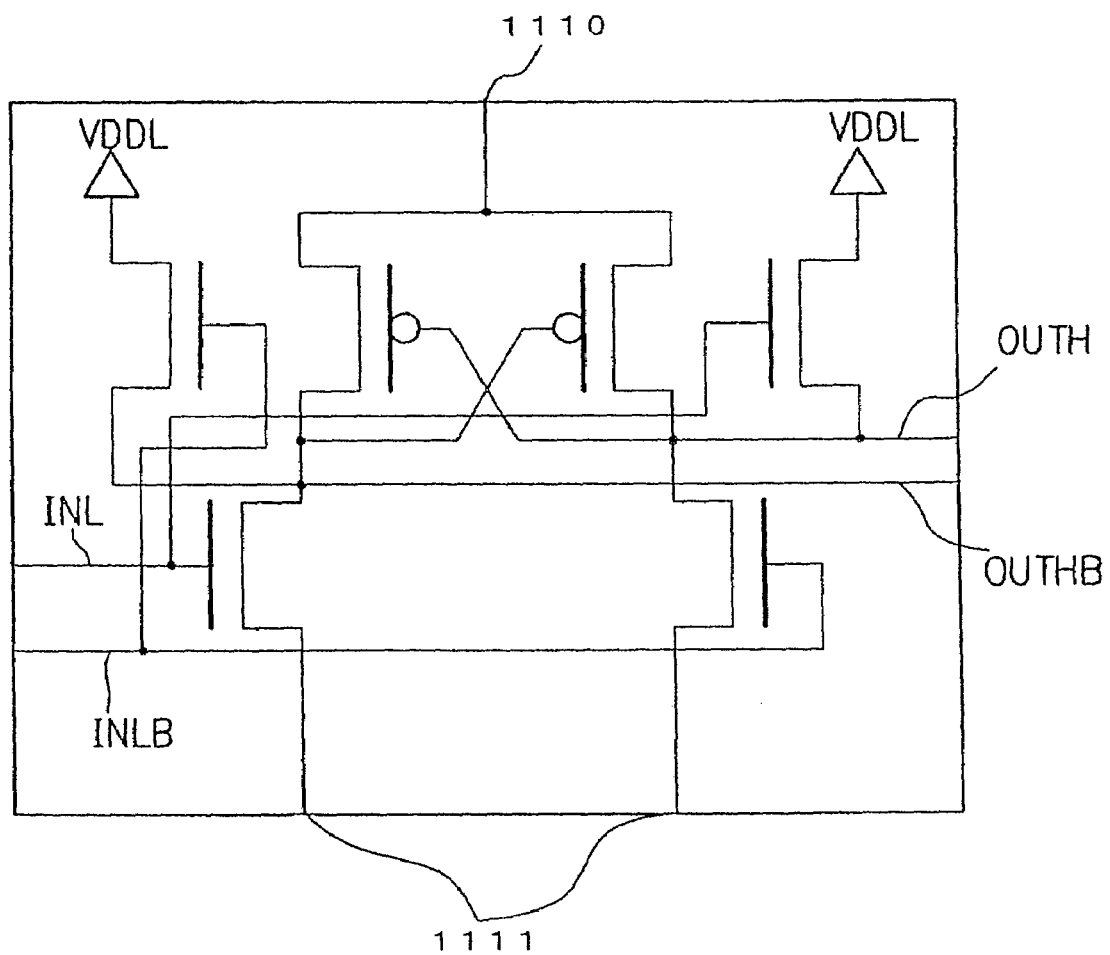
Figure 16:
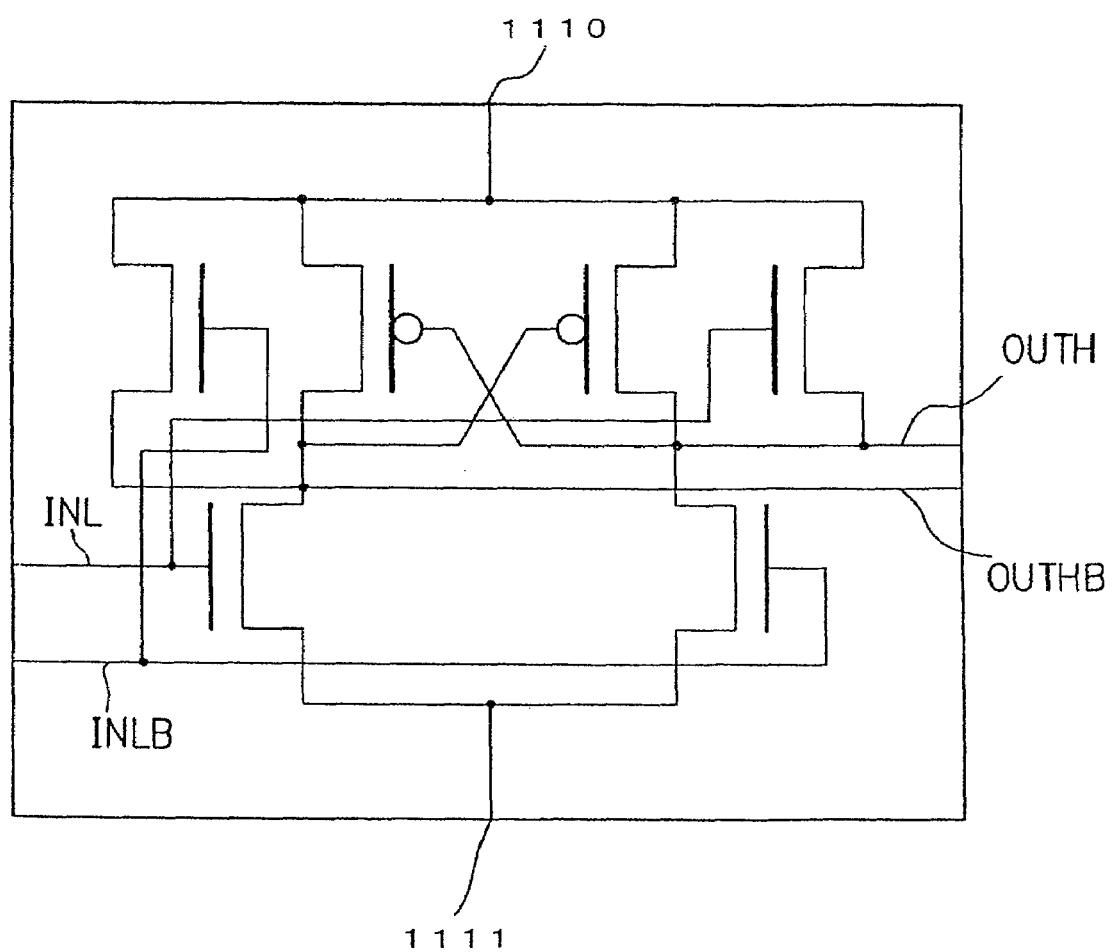
Figure 17:
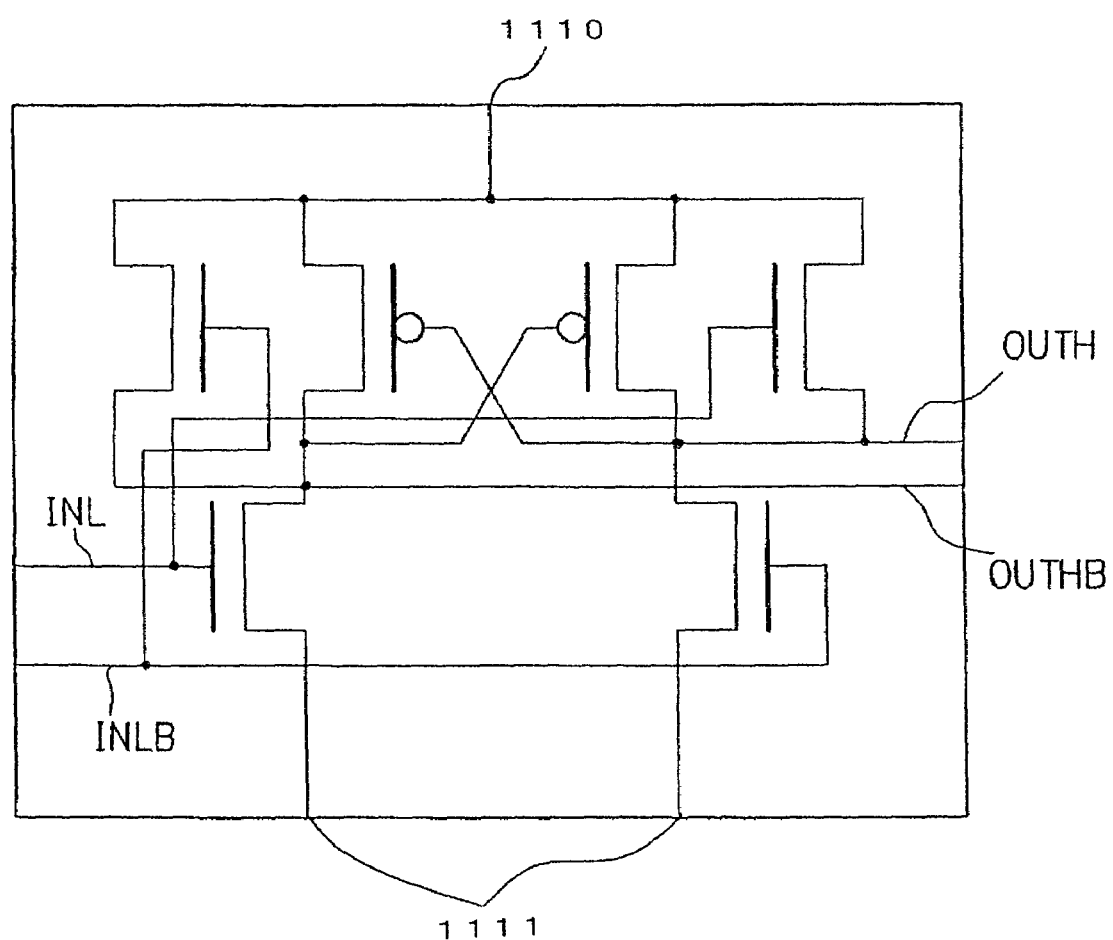
Figure 18:
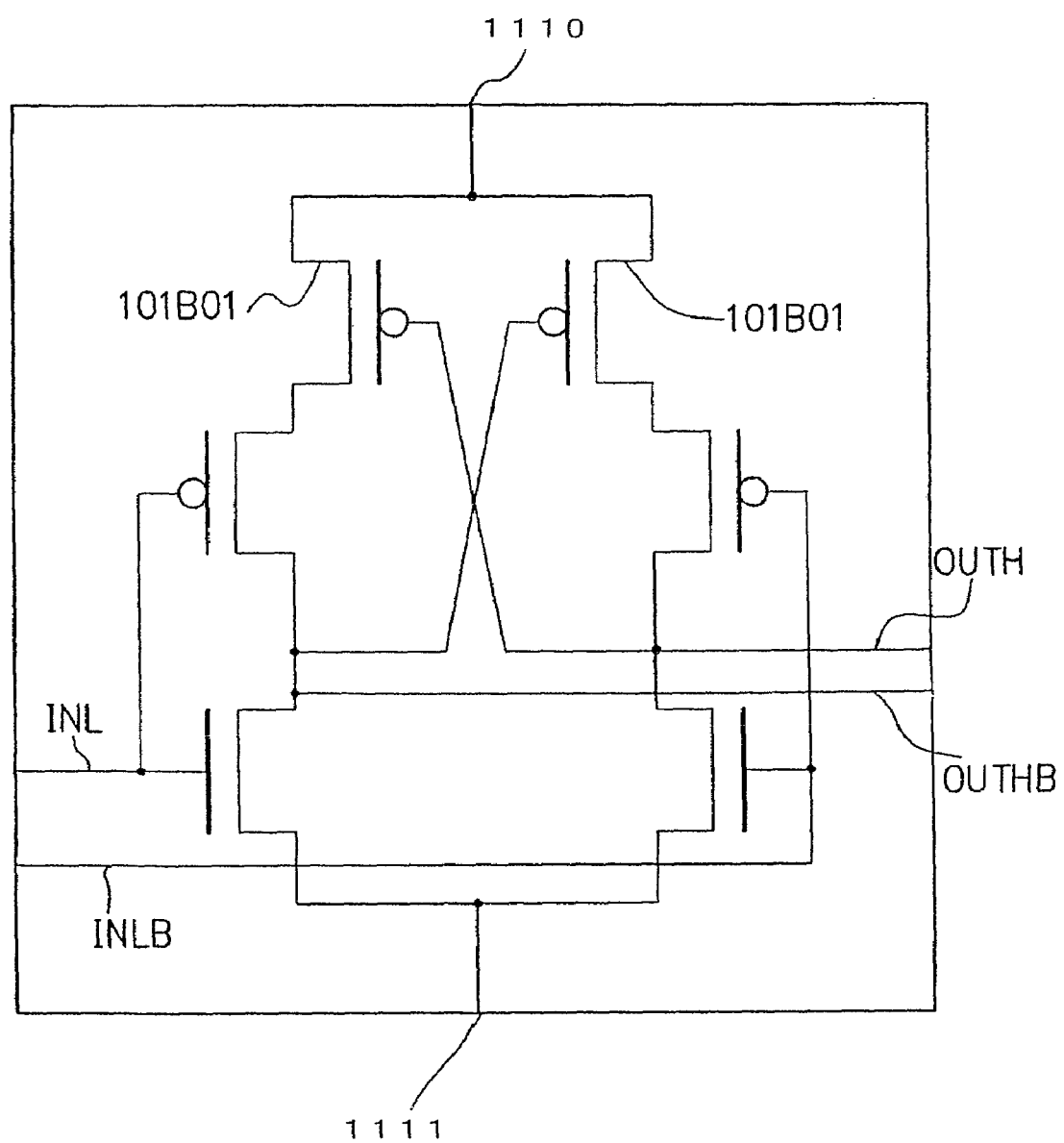
Figure 19:
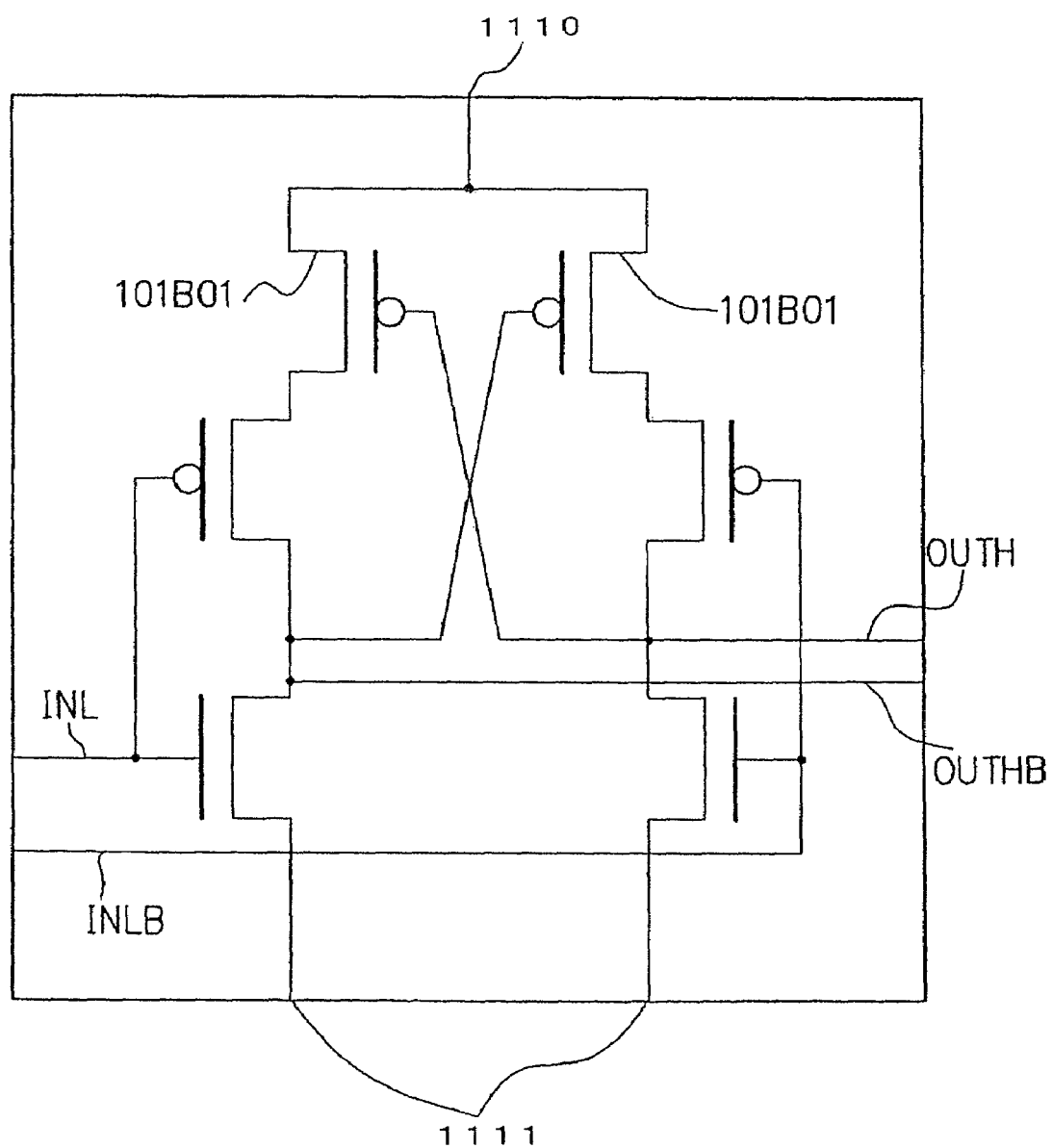

As the level shift core circuit 1 used in the embodiment, one of the circuits of FIGS. 14 to 19 may replace the level shift core circuit 1 shown in FIG. 5 or 6. Incidentally, when the circuit shown in FIG. 15, 17, or 19 is used, the switching circuit 10 shown in FIG. 7 is connected in parallel to outputs from n-MOS branched in two toward the GND side. In this situation, connection 1112 on the output side, i.e., the switching circuit 10 to GND may be separately conducted or may be conducted in a shared way using one shared wiring line to GND.

Moreover, although the switching circuit is controlled using the control signal E0 of the third logic circuit in the embodiment, the control signal E1 may be adopted without using E0; or, inverted signals thereof (E0B, E1B) may also be used. Incidentally, in another embodiment, control signals E1 and E2 other than the control signal E0 and inverted signals thereof (E0B, E1B, E2B) may also be employed appropriately.

In addition, although the switching circuit is controlled using the control signal E0 from the third logic circuit 13 in the embodiment, the control signal E1 may be adopted in place of E0. The replacement of the control signal can also be used in embodiments described below; furthermore, in the following embodiments, E2 may be adopted in place of E0 in the control operation.

SECOND EMBODIMENT

Figure 20:
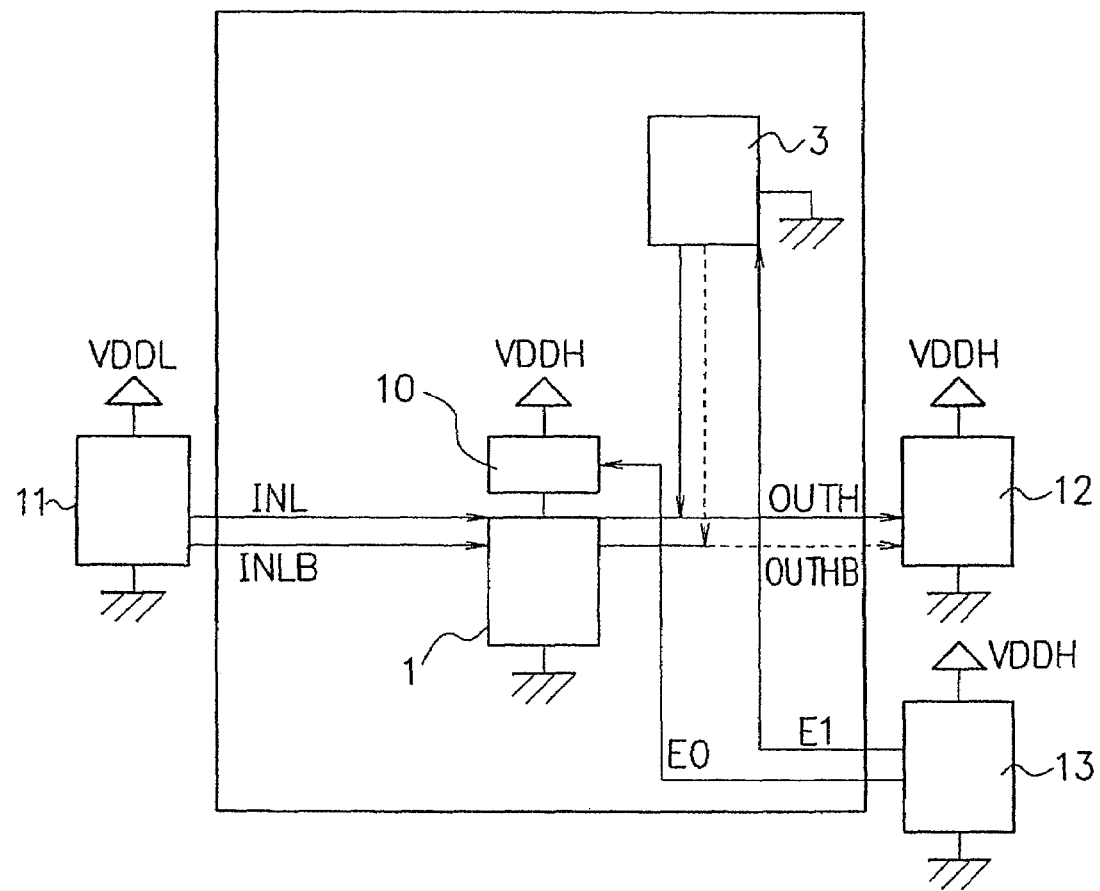
FIG. 20 is a circuit diagram showing a configuration example in a second embodiment of a level shifter of the present invention.

The second embodiment of a level shifter in accordance with the present invention has a basic configuration similar to that of the first embodiment as shown in FIG. 20. That is, like the first embodiment, the second embodiment includes a level shift core circuit 1, a pull-up and/or pull-down circuit 3, and a switching circuit 10. In the embodiment, the switching circuit 10 is disposed between the second power source (VDDH) and the power source terminal of the level shift core circuit 1, and the pull-up and/or pull-down circuit 3 may be replaced only by a pull-down circuit (for example, FIG. 22 or 23). FIG. 20 shows an overall configuration example of the level converter circuit as configured in the second embodiment. In the embodiment, unlike the configuration of the first embodiment in which the switching circuit is disposed between the level converter and GND, the switching circuit is disposed between VDDH and the level converter, and the level shift core circuit receives INL and INLB outputted from the first logic circuit and outputs OUTH or OUTHB to the second logic circuit.

Figure 21:
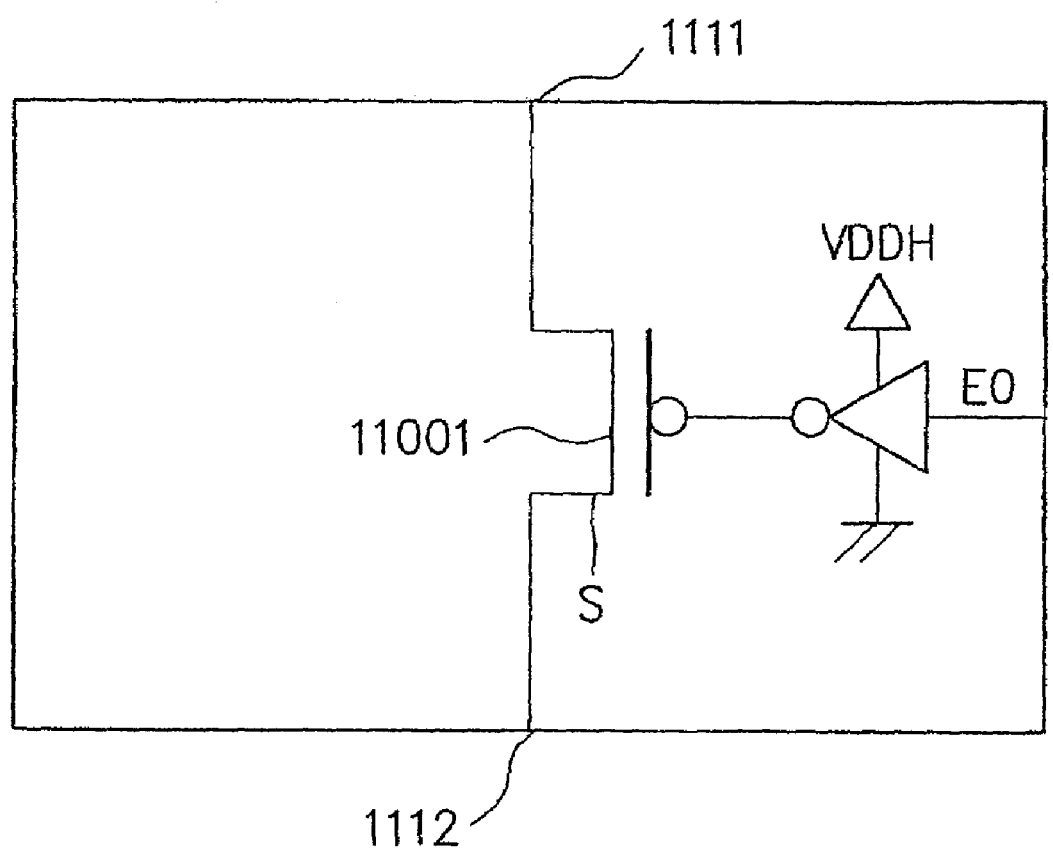

FIG. 21 shows a configuration example of the switching circuit 10 used in the level converter in accordance with the second embodiment shown in FIG. 20. The switching circuit 10 includes a p-MOS 11001 including a drain terminal connected to the power source terminal of the core circuit 1, a gate electrode connected to an inverter output of the control signal E0 from the third logic circuit 13, and a source terminal (reference is to be made to S of FIG. 21) connected to the second power source VDDH.

Figure 22:
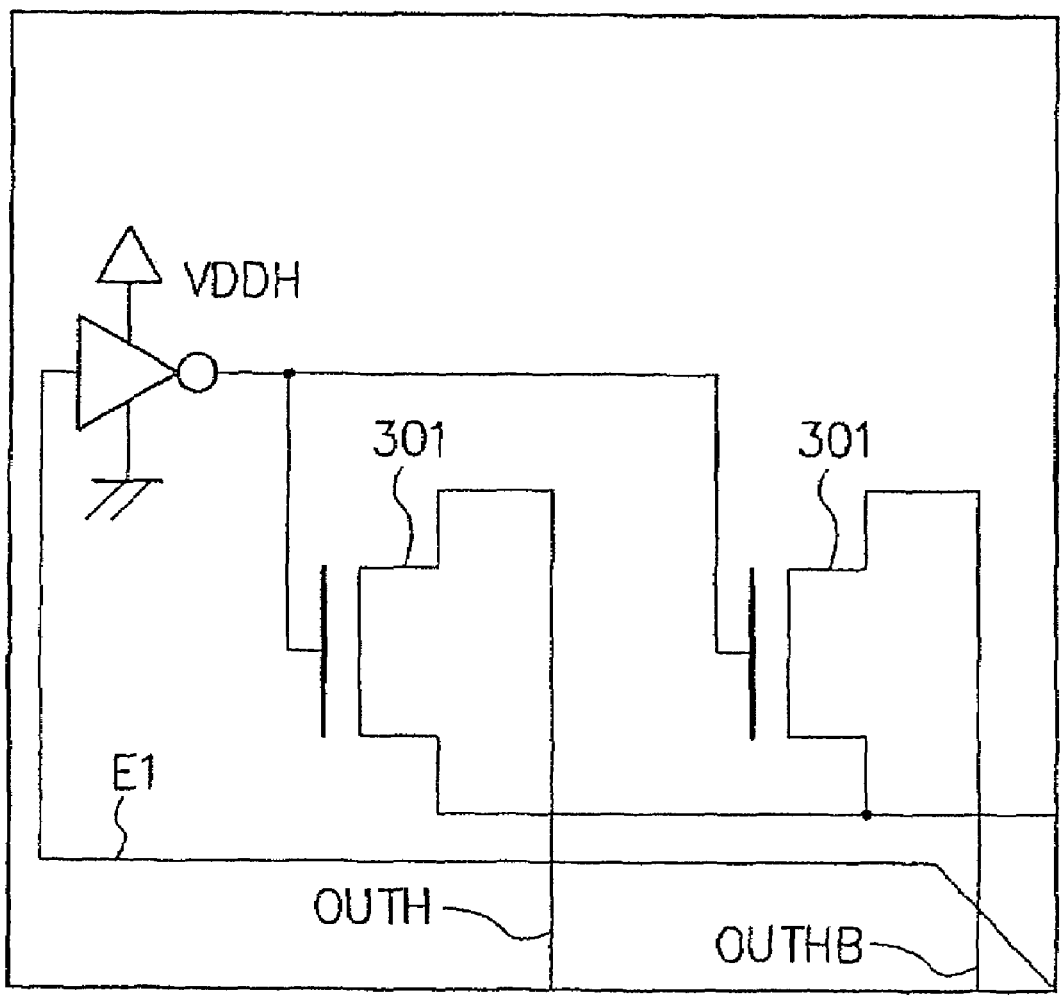

Moreover, as shown in FIG. 22, the pull-down circuit 3-2 used in the level converter shown in FIG. 20 is configured as below. That is, the circuit 3-2 includes two (at least two) n-MOS 301 including source terminals connected to the GND power source, gate terminals respectively connected to an inverter output of the control signal E1 from the third logic circuit 13, and drain terminals respectively connected to the level shift outputs (OUTH, OUTHB).

In the above configuration, the system executes processing similar to that of the first embodiment described above.

Figure 23:
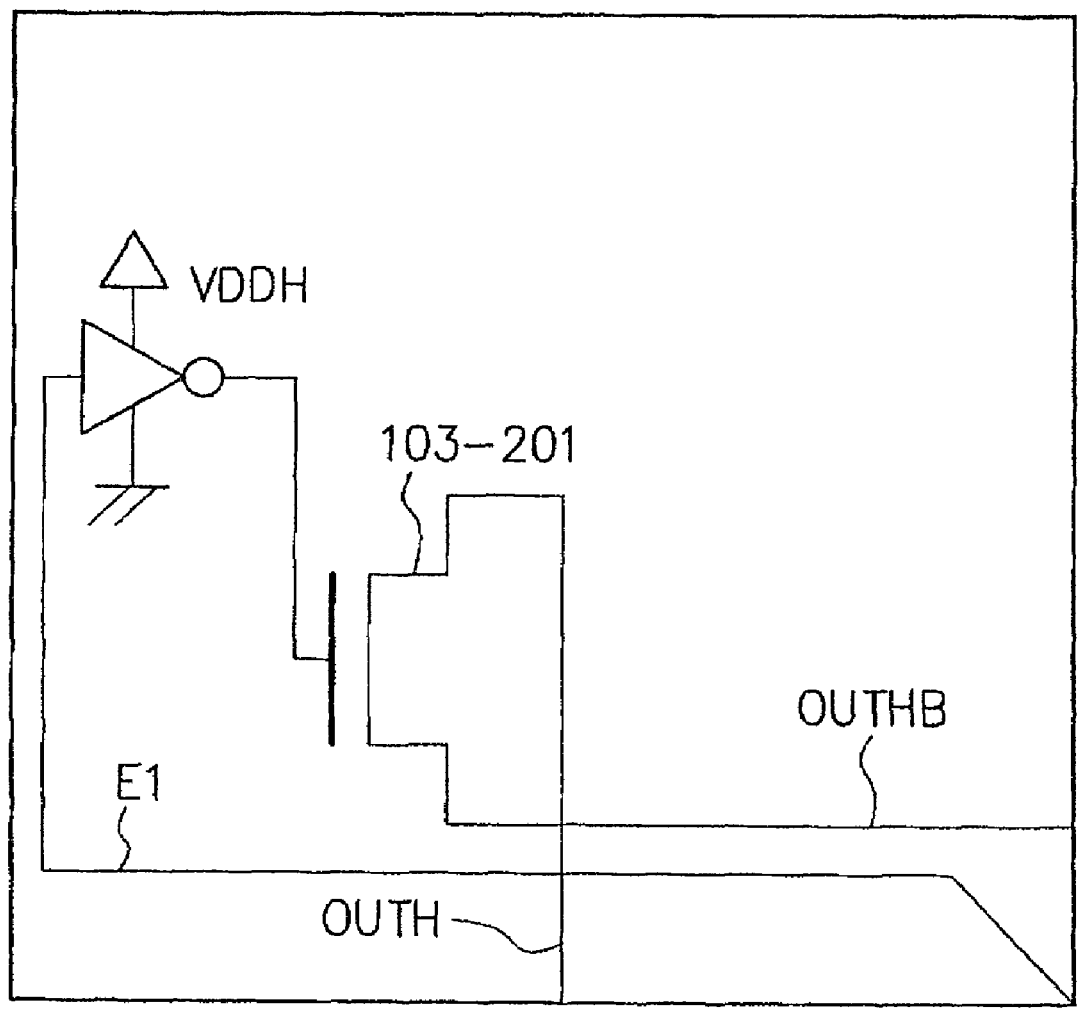

When only the level shift output OUTH is connected to the second logic circuit, the pull-down circuit 3-2 used in the embodiment may be replaced by a circuit including an (only one) n-MOS 103-201 and an inverter as in the pull-down circuit shown in FIG. 23. As indicated by the embodiment, there can be adopted a configuration in which one of the control signals (OUTH or OUTHB) is fed to the second logic circuit. Furthermore, depending on cases, there may be used a configuration in which both signals (OUTH and OUTHB) are produced. Incidentally, although the switching circuit is controlled using the control signal E0 from the third logic circuit also in the third embodiment, the control operation can be achieved using the control signal E1 in place of E0. This similarly applies to embodiments described below. As above, the modification from the first embodiment to the second embodiment with respect to the layout and the configuration of the switching circuit 10 and the level shift core circuit 1 (the modification to dispose the switching circuit 10 between the second power source (VDDH) and the level shift core circuit 1) can be adopted also in the third to the seventh embodiments, which will be described below. Incidentally, when the polarities of E0 and E1 are selected to be reversed, the inverter is not required.

THIRD EMBODIMENT

Figure 24:
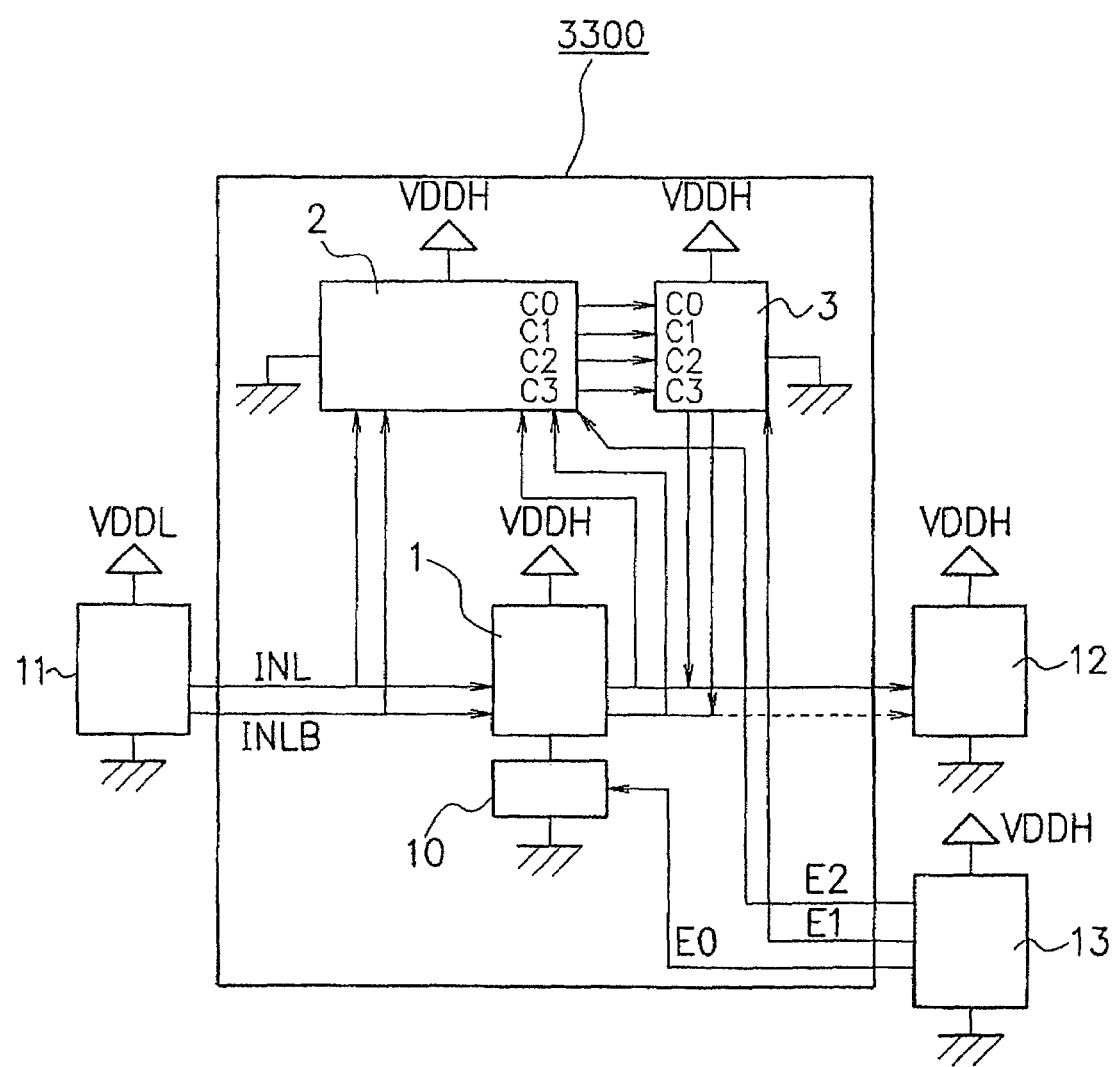
FIG. 24 is a circuit diagram showing a configuration example in a third embodiment of a level shifter of the present invention.

Description will be given of, as the third embodiment of a level shifter in accordance with the present invention, a level shifter capable of improving a level shift margin when a large potential difference exists between the first and second power sources. In the embodiment, control has been devised for the control circuit 2 to which the second power source is supplied and the pull-up/pull-down circuit 3 to which the second power source (VDDH) is supplied. FIG. 24 shows a configuration example of the embodiment. FIG. 24 includes a level shift input to which the second power source is supplied, a level shift output, a control circuit 2 which receives the control signal E2 from the third logic circuit 13 and which outputs control signals (C0, C1, C2, C3) to a pull-up/pull-down circuit 3, and the pull-up/pull-down circuit 3 which is supplied with the second power source, which receives the control signals (C0, C1, C2, C3) from the control circuit 2 and the control signal E1 from the third logic circuit 13, and which connects an output therefrom to a level shift output.

Figure 25:
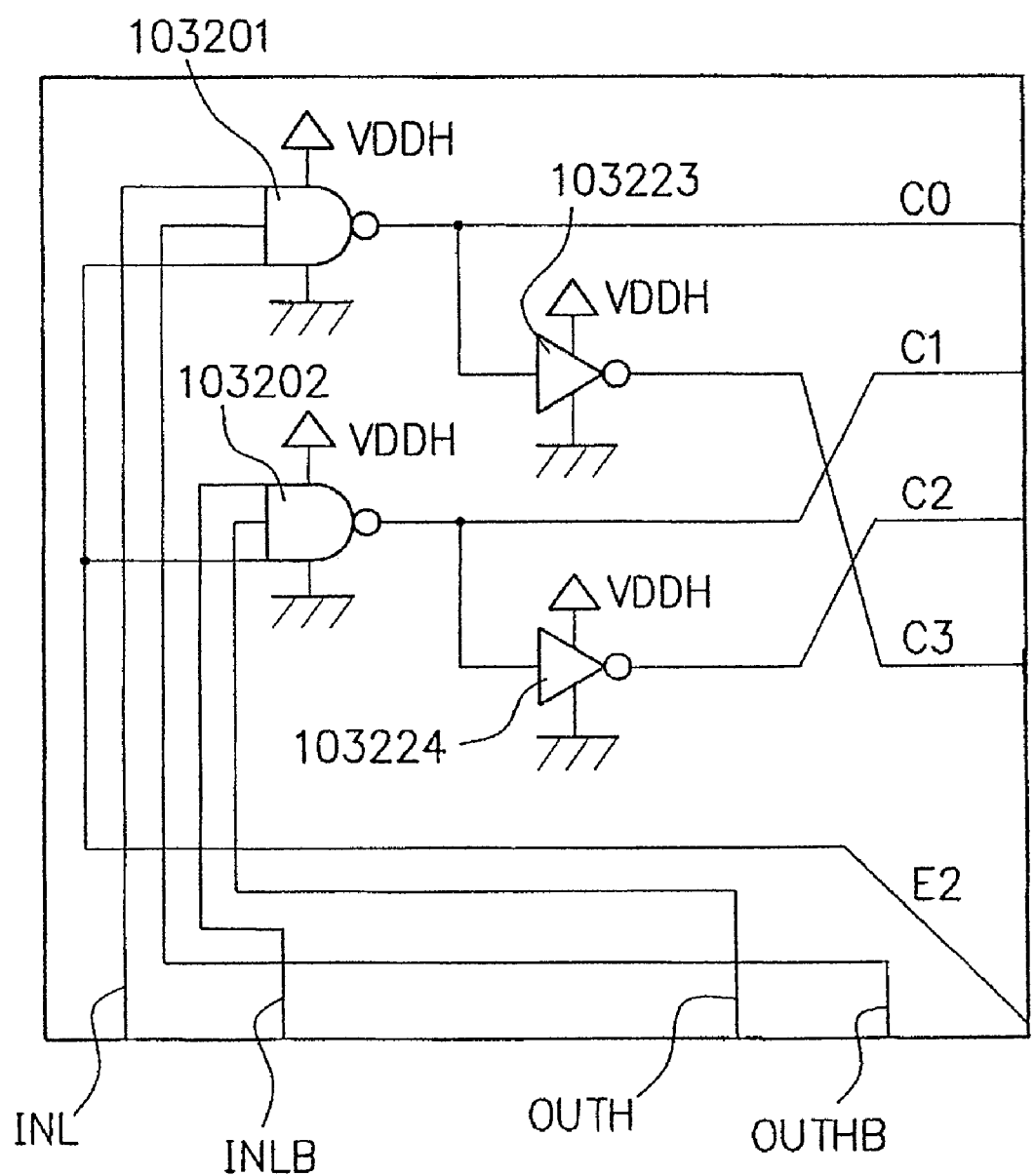

As shown in FIG. 25, the control circuit 2 used in the level converter shown in FIG. 24 is configured as below. That is, the configuration includes a first NAND circuit 103201 which is supplied with the second power source (VDDH) and which receives INL, OUTHB, and E2 as inputs thereto to output C0 therefrom, an NAND circuit 103202 which is supplied with the second power source and which receives INLB, OUTH, and E2 as inputs thereto to produce C1 therefrom, an inverter 103223 which receives C0 as an input thereto to output C3 therefrom, and an inverter 103224 which receives C1 as an input thereto to produce C2 therefrom.

The short circuit current of the logic gate which is a problem when the level shift input (INL, INLB) of which the state changes depending on the first power source to conduct power source control is indefinite is solved by disposing the NAND circuits 103201 and 103202 to receive the control input E2 as an input thereto.

Figure 26:
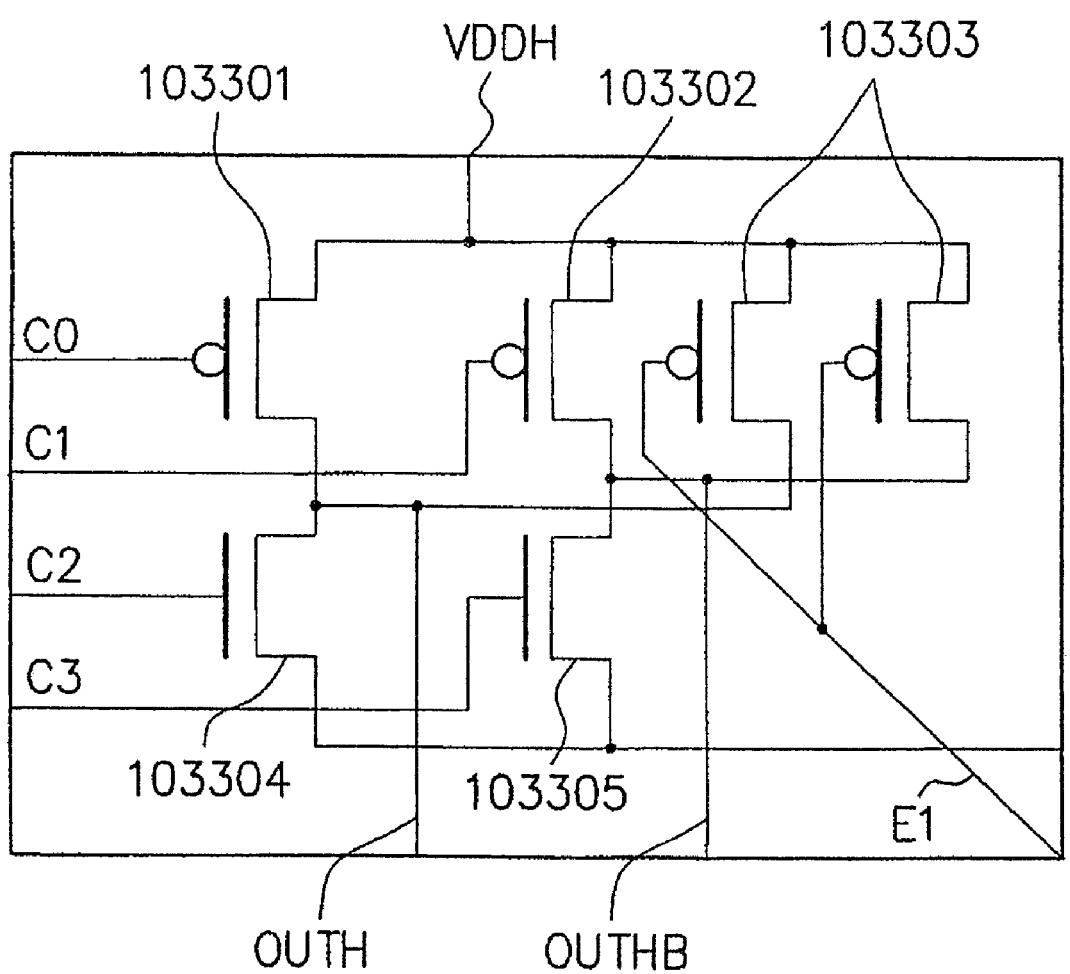

As shown in FIG. 26, an example of a pull-up/pull-down circuit 3 (pull-up/pull-down circuit 3 capable of conducting 5-control-signal (C0-C3, E1) input and two-signal (OUTH and/or OUTHB) output operation) used in the level converter shown in FIG. 24 is configured as below. That is, the circuit includes a p-MOS 103301 including a source terminal connected to the second power source (VDDH), a gate terminal connected to C0, and a drain terminal connected to OUTH; a p-MOS 103302 including a source terminal connected to the second power source (VDDH), a gate terminal connected to C1, and a drain terminal connected to OUTHB; at least two (two) p-MOS 103303 including source terminals respectively connected to the second power source (VDDH), gate terminals connected to E1, and drain terminal connected to OUTH and OUTHB; an n-MOS 103304 including a source terminal connected to the GND power source, a gate terminal connected to C2, and a drain terminal connected to OUTH; and an n-MOS 103305 including a source terminal connected to the GND power source, a gate terminal connected to C3, and a drain terminal connected to OUTHB.

Operation of the embodiment will be described. When E2 shown in the control circuit 2 of FIG. 25 is set to low (Low), all of the MOS transistors (103301 and 103302 as well as 103304 and 103305) receiving C0 to C3 of FIG. 26 as inputs thereto are set to off (OFF); at this point of time, the two (at least two; plural) p-MOS 103303 of the pull-up/pull-down circuit 2 connected to E1 which is similarly set to Low turn on (ON) to pull up both of OUTH and OUTHB to high (High).

Moreover, as shown in FIG. 10, when the first power source VDDL is in an on state, the control signals E0 and E1 from the third logic circuit 13 are High; in a case in which the switching circuit 10 is in an ON state and the pull-up/pull-down circuit 3 is in an OFF state, when the level shift input signals INL and INLB are differentially inputted at a first-power-source level to the level shift core circuit 1, an operation is conducted in which the output (OUTH or OUTHB) from the side of the core circuit 2 connected to an n-MOS to which high (High) is inputted is reduced to low (Low) and the other output is increased to a second power source level, i.e., High. The operation of the level shift core circuit in this situation is similar to that of the level shift core circuit shown in FIG. 9.

To turn the first power source VDDL to off, the control signals E0 and E1 are first changed to Low, the switching circuit 10 is turned off, and the pull-up/pull-down circuit 3 is set to an ON state to prevent the short circuit current of the level converter on one hand and to fix the level shift outputs (OUTH, OUTHB) respectively to High on the other.

As a result, even when conversion outputs (OUTH, OUTHB) are indefinite when VDDL is turned off, the short circuit current and the random changes in the output (random change-over between on and off) can be prevented. Next, to turn the first power source VDDL on, VDDL is first turned on to be stabilized, the control signals E0 and E1 are then changed to High, the pull-up/pull-down circuit is turned off (OFF), the switching circuit is turned on (ON); after one (OUTH) of the level shift outputs rises up according to the level shift input, the level shift is conducted in a way similar to that of FIG. 9 described above.

As above, to control the first power source VDDL, the switching circuit 10 is set to OFF and the pull-up/pull-down circuit 3 is set to ON, and hence the short circuit current and the random changes in the output associated with the indefinite level shift input can be prevented.

Therefore, even in an LSI having many power sources, the leakage current caused by turning off a power source of an unused block can be reduced while the overhead is suppressed as described above.

Figure 27:
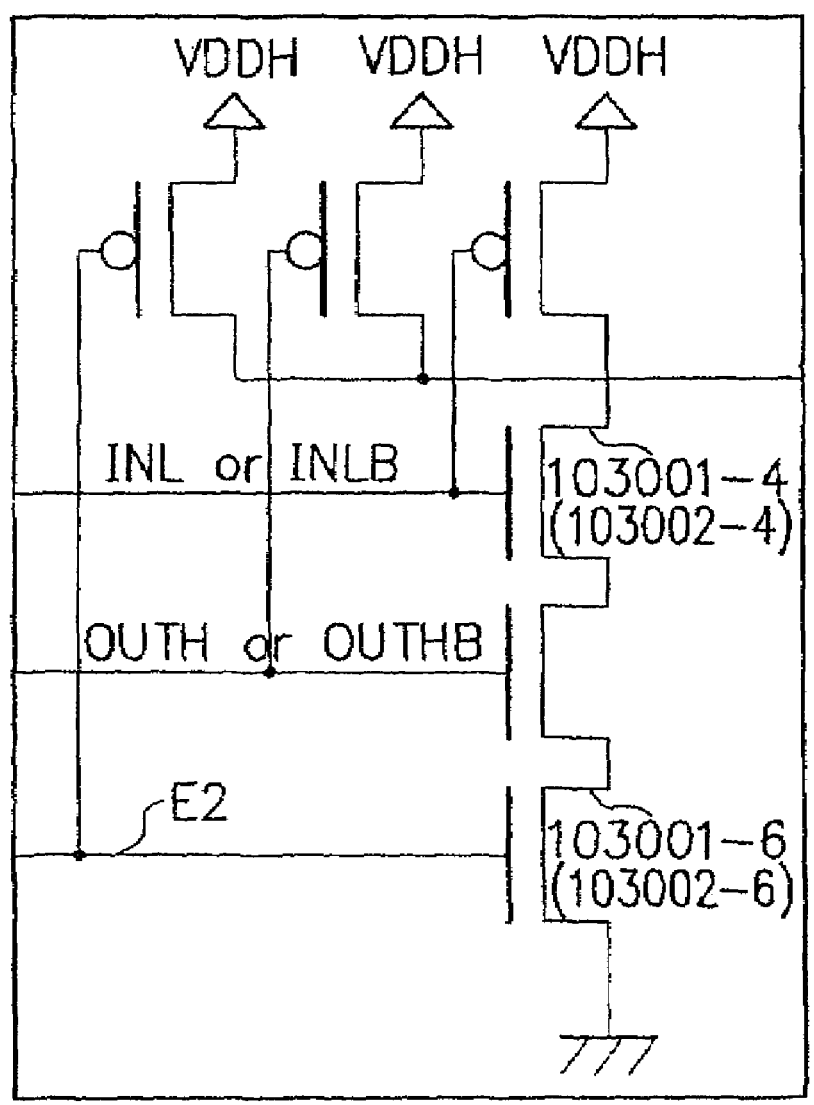

FIG. 27 shows a configuration example of the NAND circuits 103201 and 103202 shown in FIG. 25, the NAND circuits constituting the control circuit 2 used in the level converter of the present invention described above. In FIG. 27, the control signal E2 is connected to an n-MOS 103001-6 (or 103002-6) most apart from the output terminal. This connection is possible because the E2 signal has a weak restriction with respect to delay. Contrarily, the level shift input (INL, INLB) has a strong restriction with respect to delay and is connected to an n-MOS 103001-4 (or 103002-4) near the output terminal. This is because the gate delay can be reduced as compared with a case in which the input is connected to an n-MOS apart from the output terminal. However, the level shift input is at a first power source level; when the potential difference with respect to the second power source becomes large or when the threshold value of the n-MOS is large, particularly, when the influence of increase in the n-MOS threshold value due to a substrate effect becomes strong, the delay becomes increased when the input is connected to an n-MOS near the output terminal depending on cases. In this case, the delay elongation can be prevented by connecting the input to an n-MOS which is apart from the output terminal and which is less influenced by the substrate effect. It is not necessarily required to follow the input order of FIG. 27. Moreover, a p-MOS connected to the level shift input does not turn off depending on the p-MOS threshold value since the high level of the level shift input is less than that of the second power source, and the n-MOS does not fully turn on and hence there exists a chance in which the NAND operation is difficult. In this case, the NAND operation can be guaranteed by reducing a ratio of p-MOS channel width/length (W/L), by reducing the threshold value (by increasing the absolute value when the polarity is negative), by increasing W/L of the associated n-MOS, or by changing the threshold value by reducing the absolute value when the polarity is positive. Additionally, even when the logic operation is possible, the NAND leakage can be suppressed by reducing W/L of the p-MOS or by reducing the threshold value (e.g., by setting the threshold value to VDDL-VDDH or less, that is, by increasing the absolute value when the polarity is negative).

Figure 28:
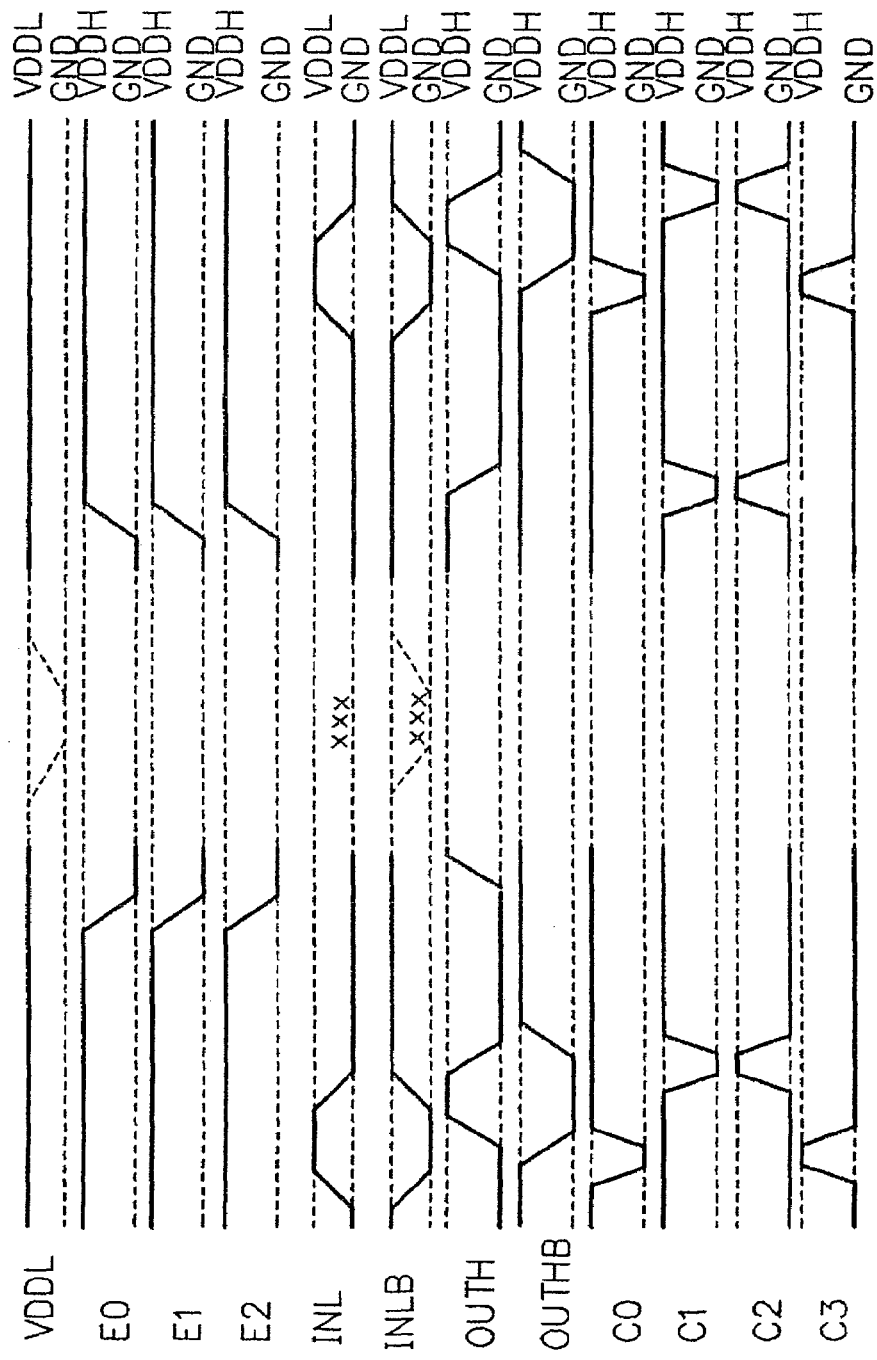
FIG. 28 is a timing chart showing an operation example of the third embodiment of the level shift core circuit of the present invention.

FIG. 28 shows a timing chart of the operation of the level converter. When the first power source (VDDL) is on and the control signals (E0, E1, E2) from the third logic circuit 13 are High, the level shift outputs (OUTHB, OUTH) are obtained according to changes in the level shift inputs (INL, INLB). Particularly, the control circuit 2 controls the pull-up/pull-down circuit 3 to enhance the state change.

In a case in which the first power source (VDDL) is turned off, E0 is beforehand set to Low to turn the switching circuit 10 off and E1 is set to Low to fix the level shift output (either one of OUTH and OUTHB) to High, and then the first power source (VDDL) is turned off.

To turn the first power source (VDDL) on, the first power source is first turned on; after the power source is stabilized, the control signals are controlled.

Figure 29:
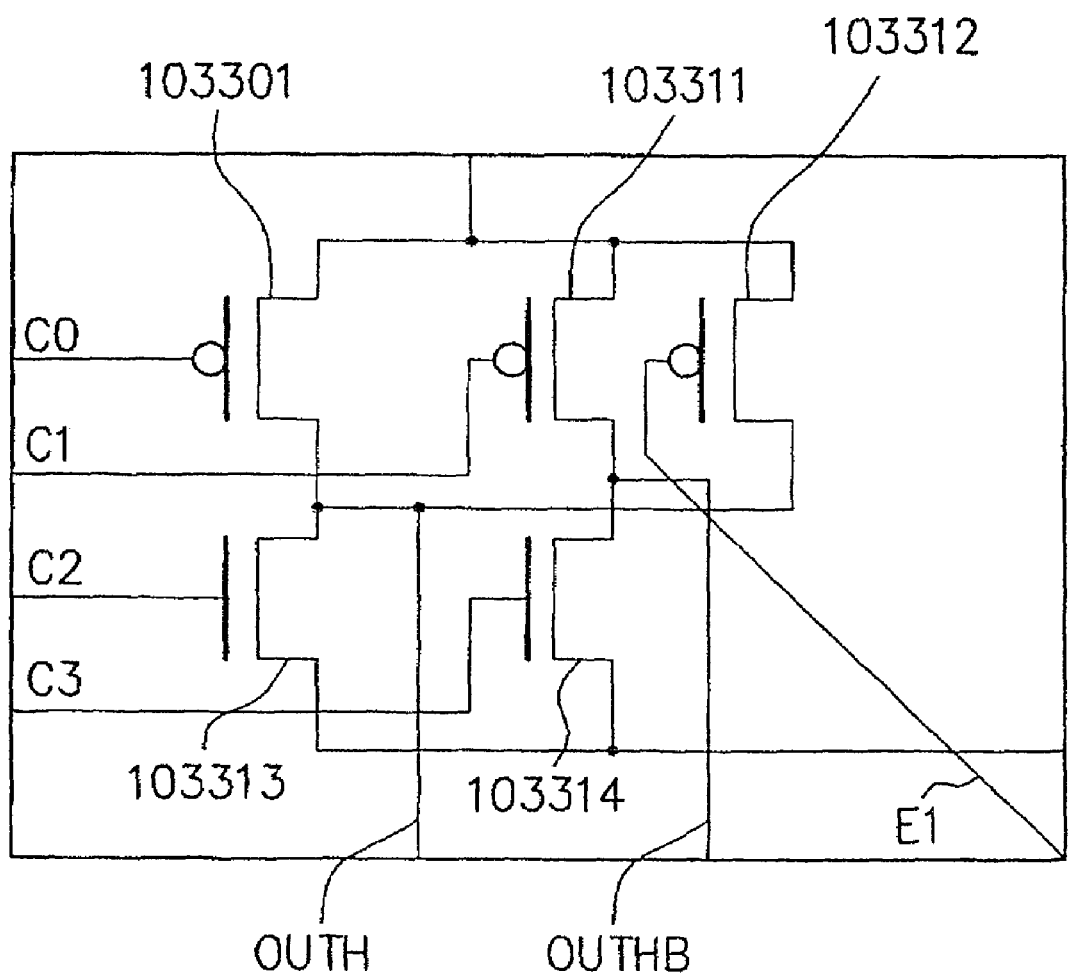

When the level converter and the second logic circuit 11 are only connected (input) to OUTH, the pull-up and/or pull-down circuit 3 used in the embodiment may be replaced with the pull-up/pull-down circuit 3 shown in FIG. 29. When the converter and the circuit 11 are only connected (input) to OUTHB, the drain terminal of the p-MOS including a gate terminal connected to the control signal E1 is connected to OUTHB, not OUTH.

Figure 30:
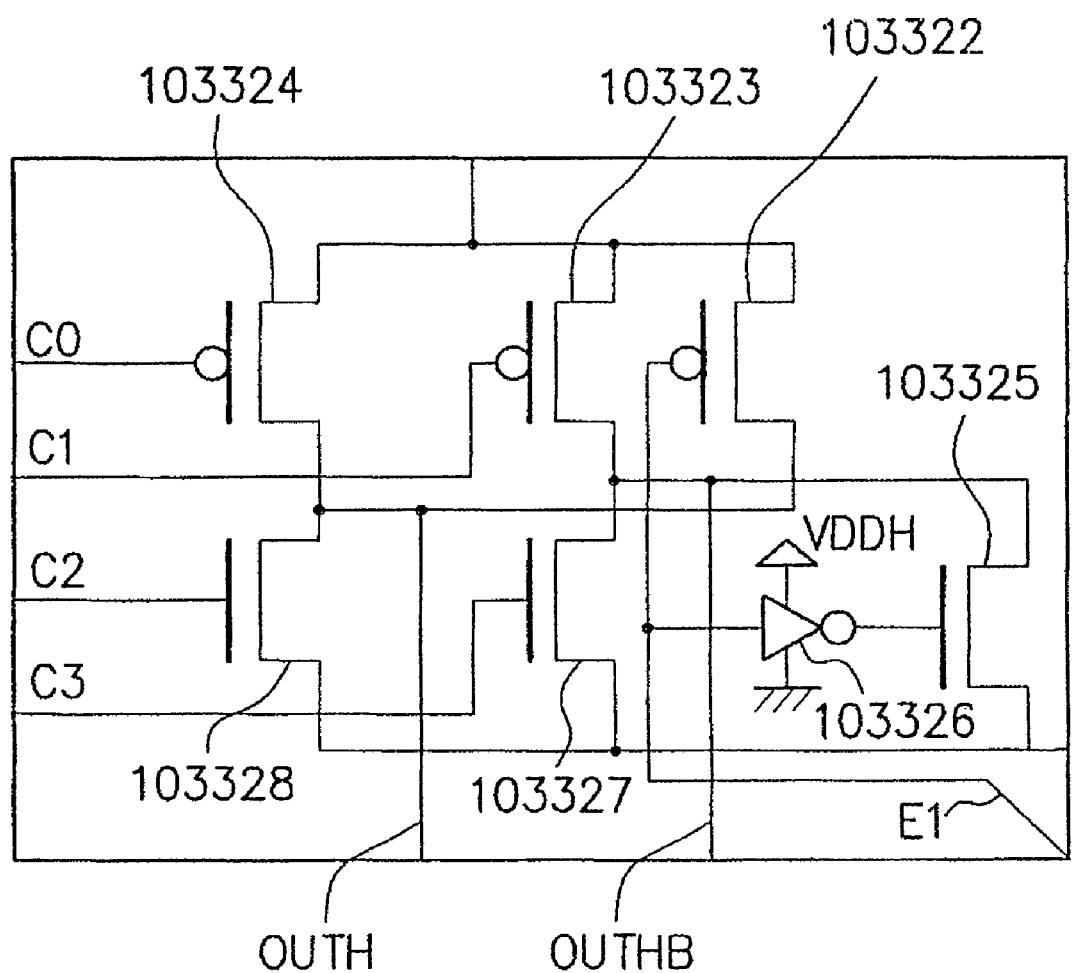
Figure 31:
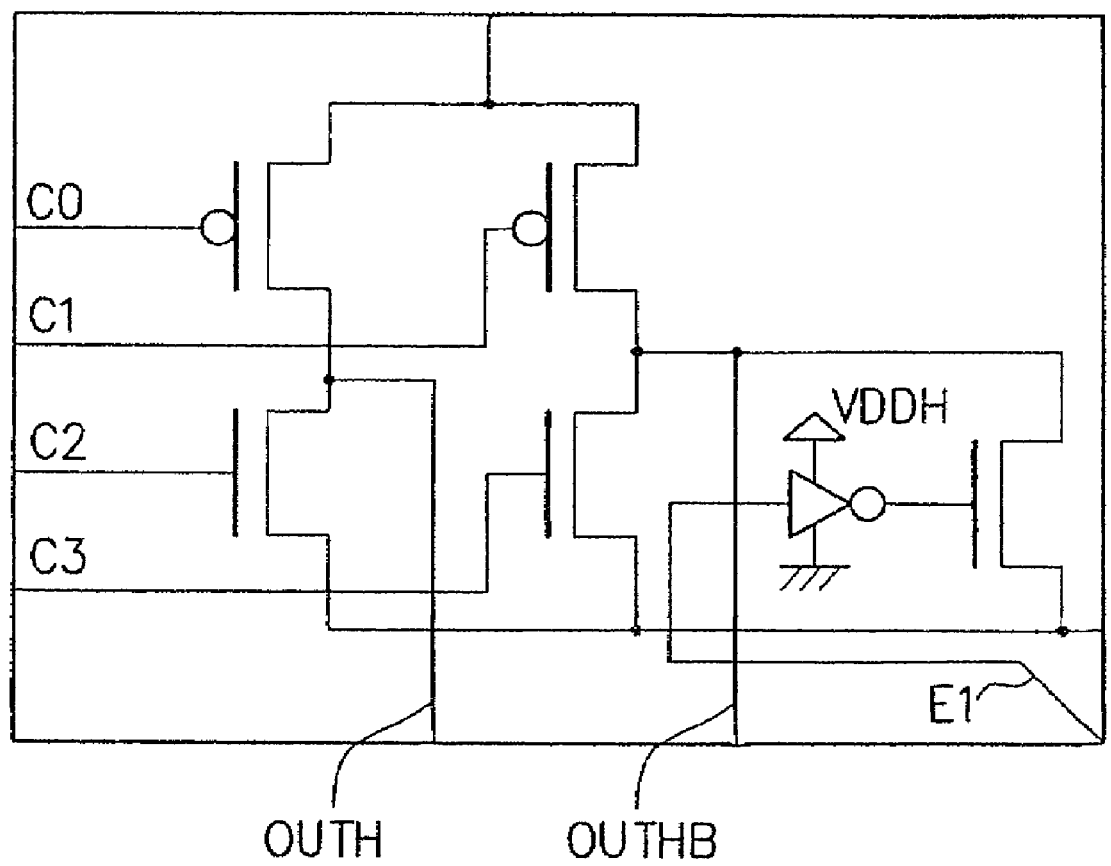
Figure 32:
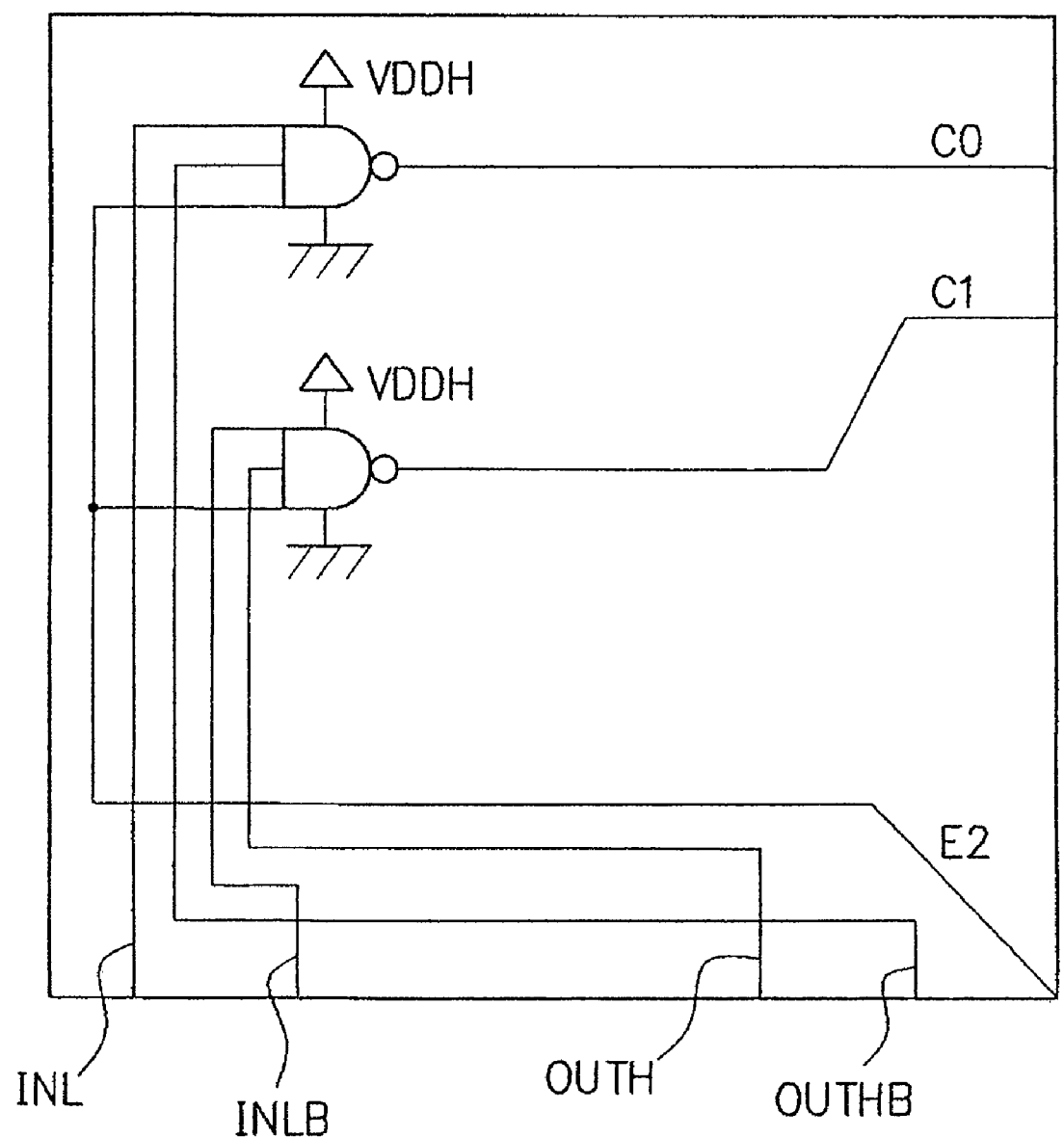
Figure 33:
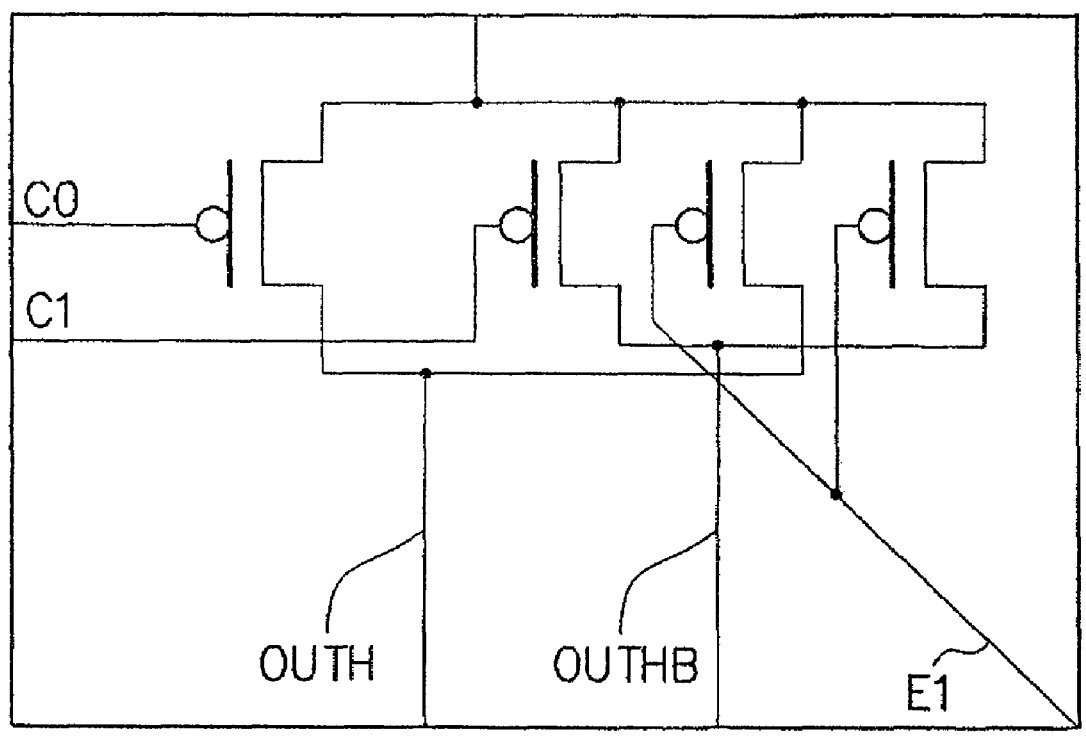
Figure 34:
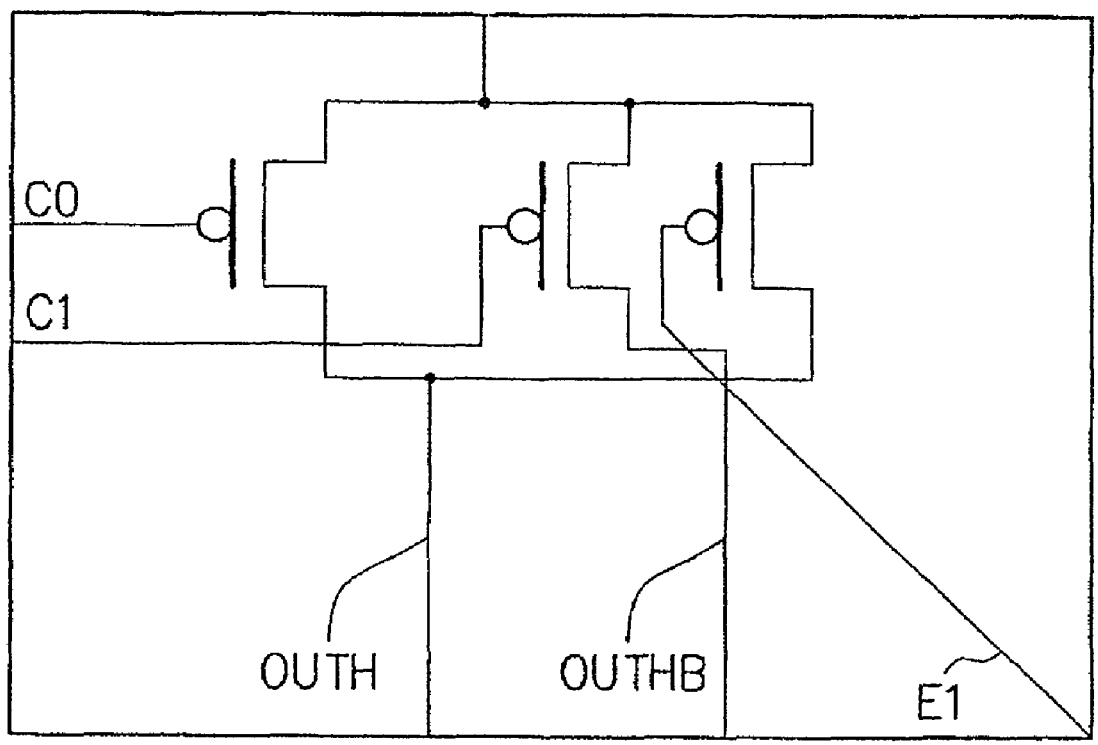
Figure 35:
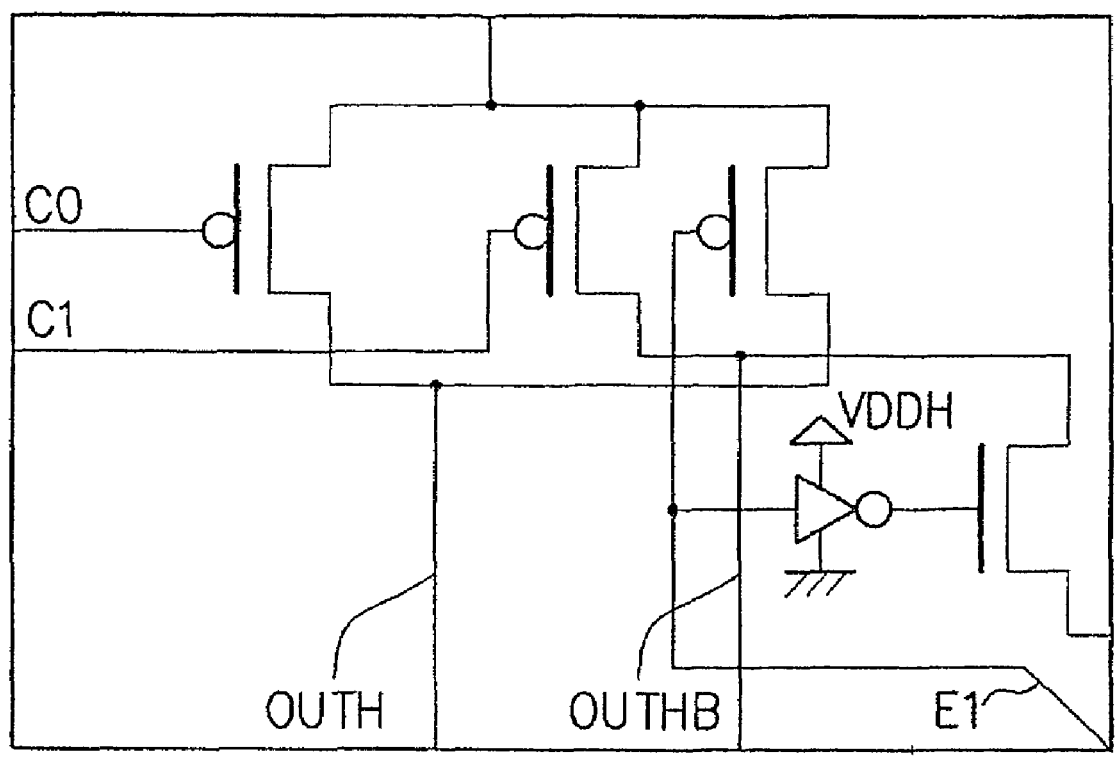
Figure 36:
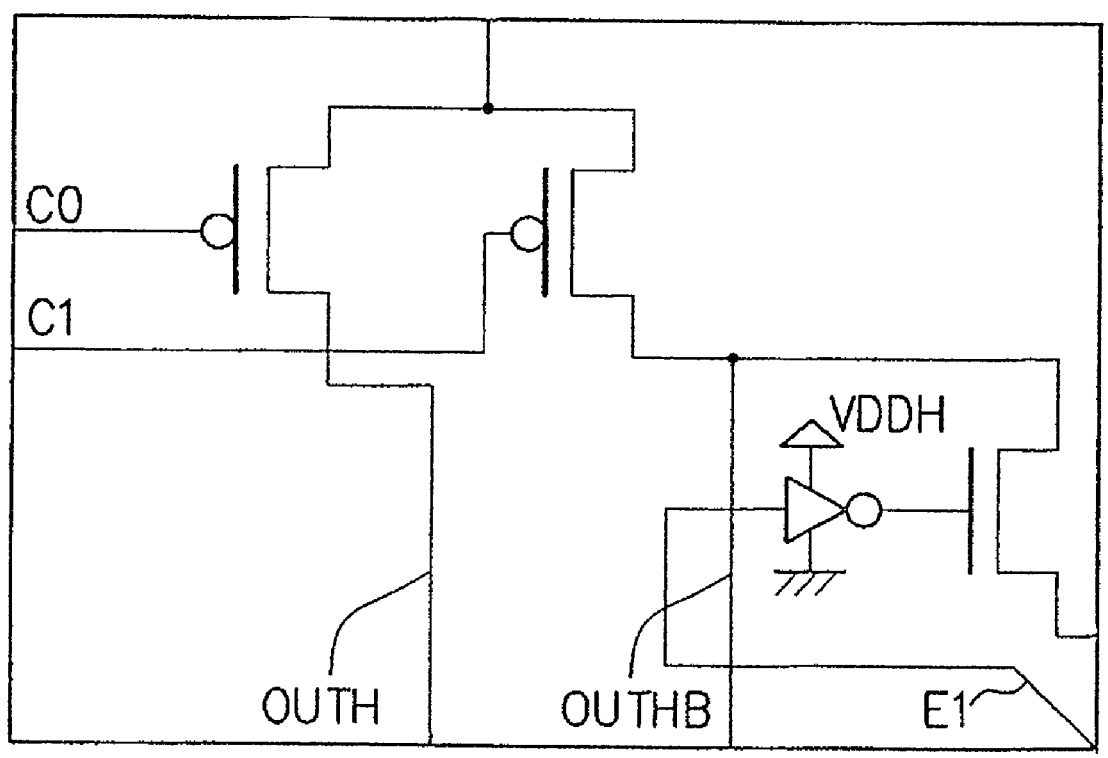
Figure 37:
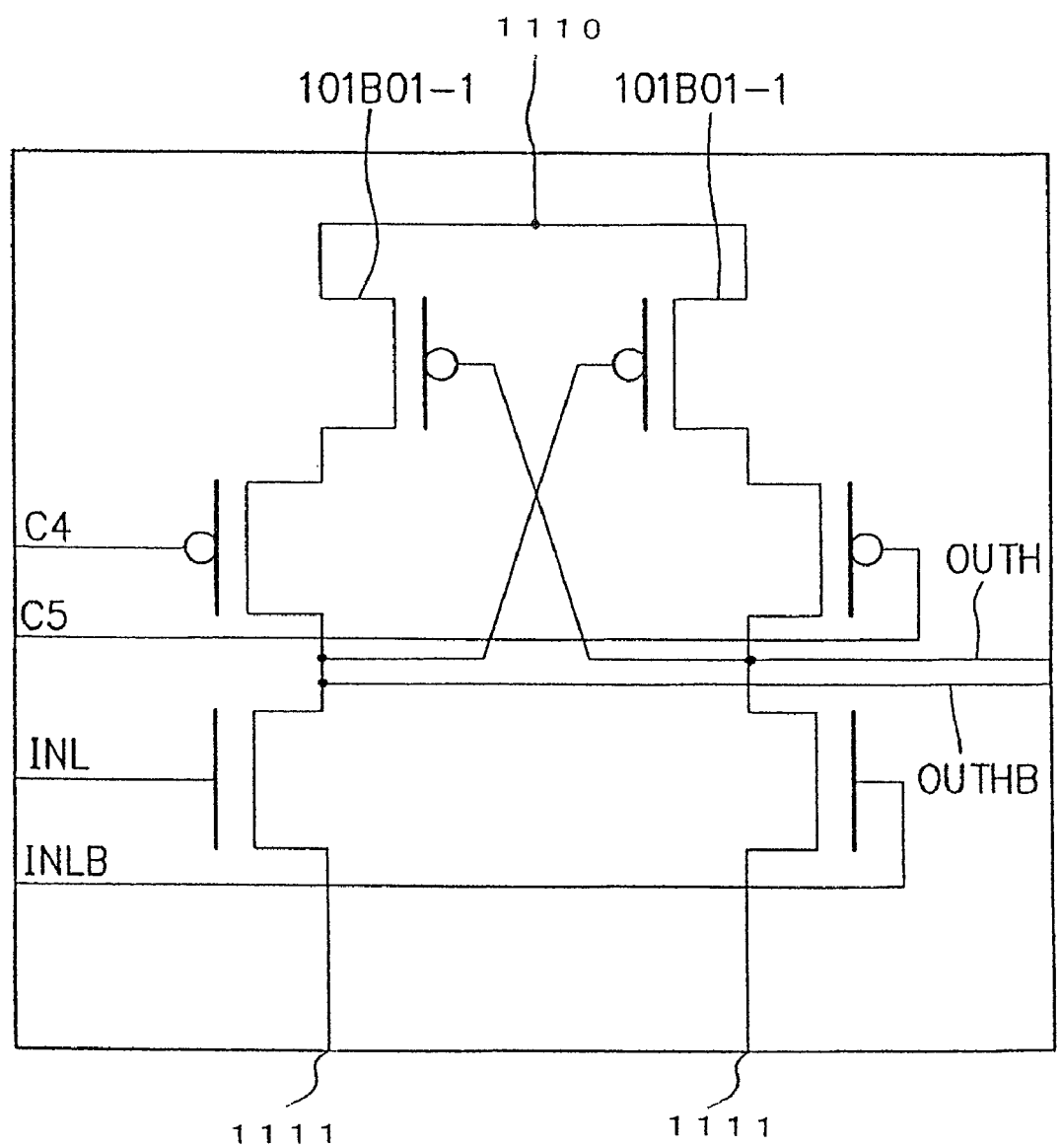
Figure 38:
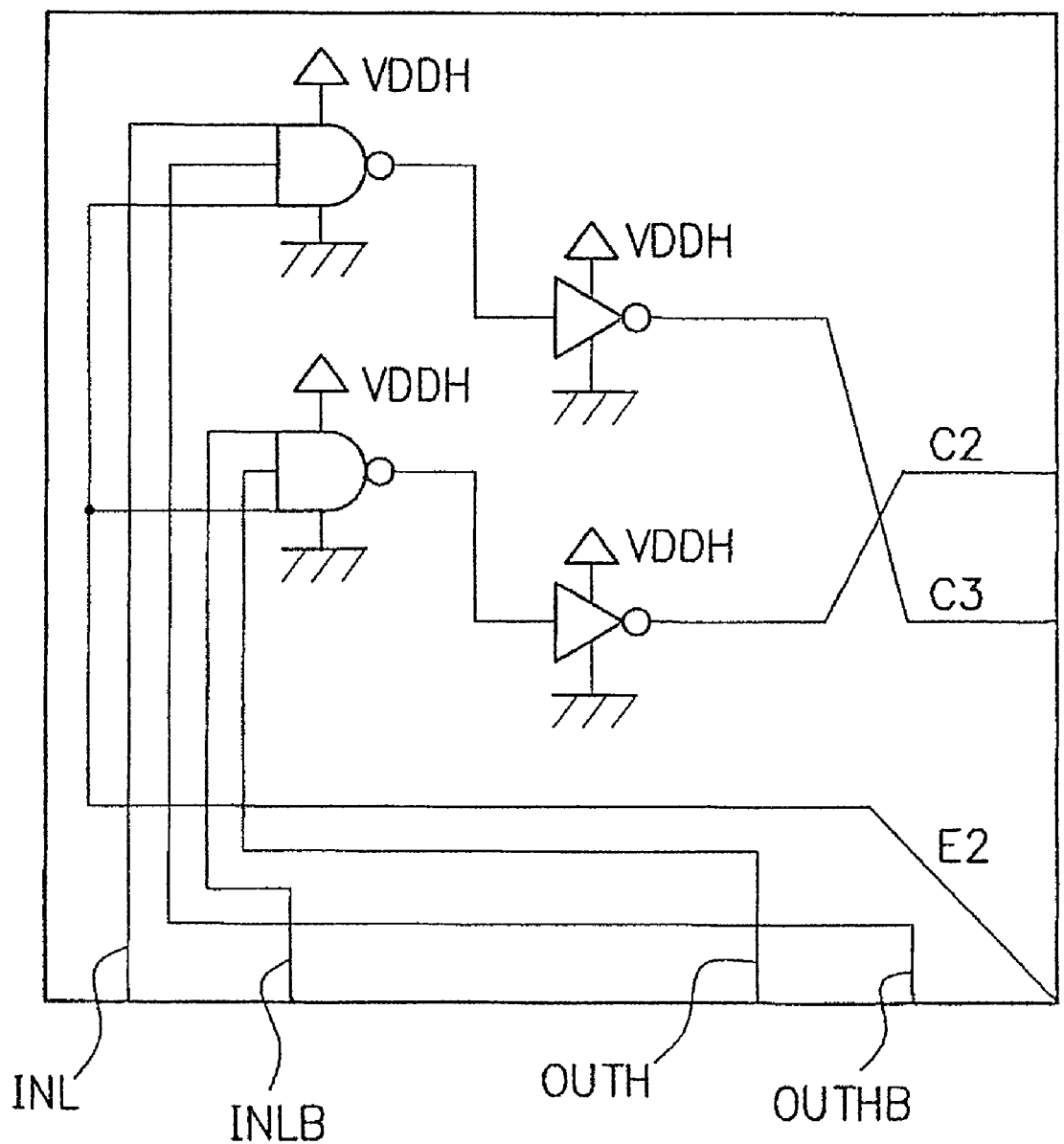
Figure 39:
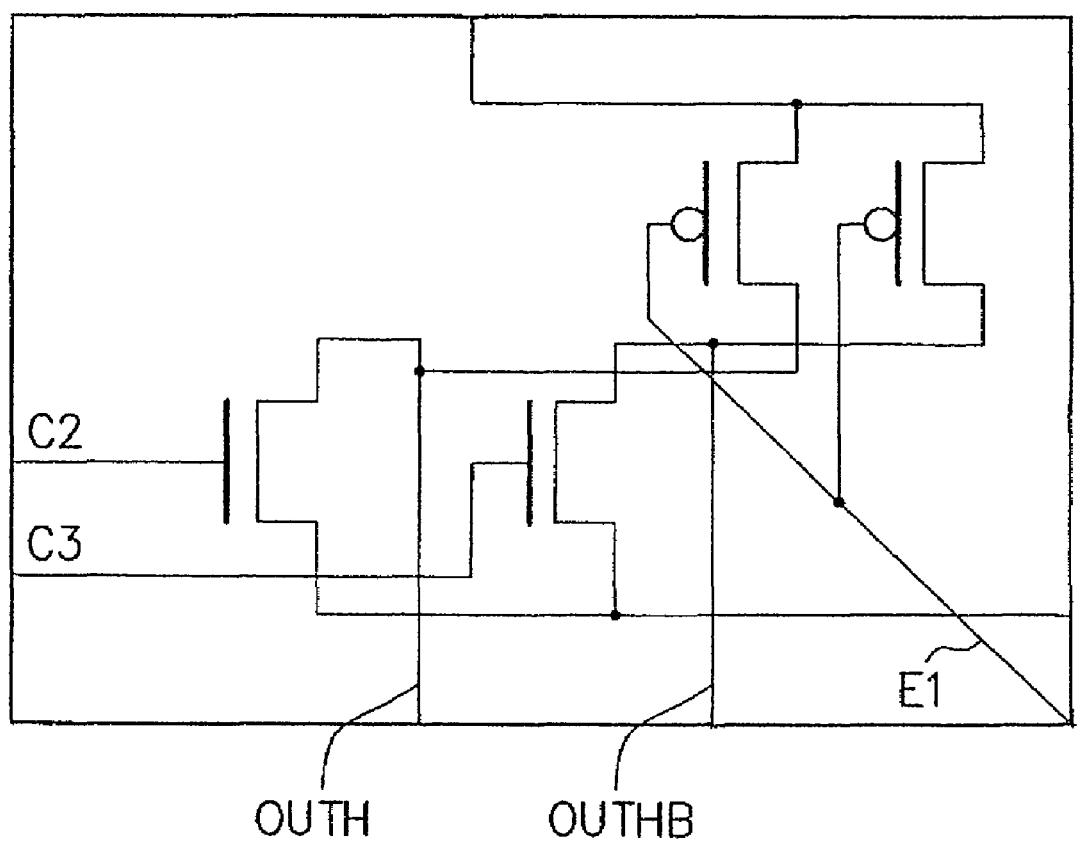
Figure 40:
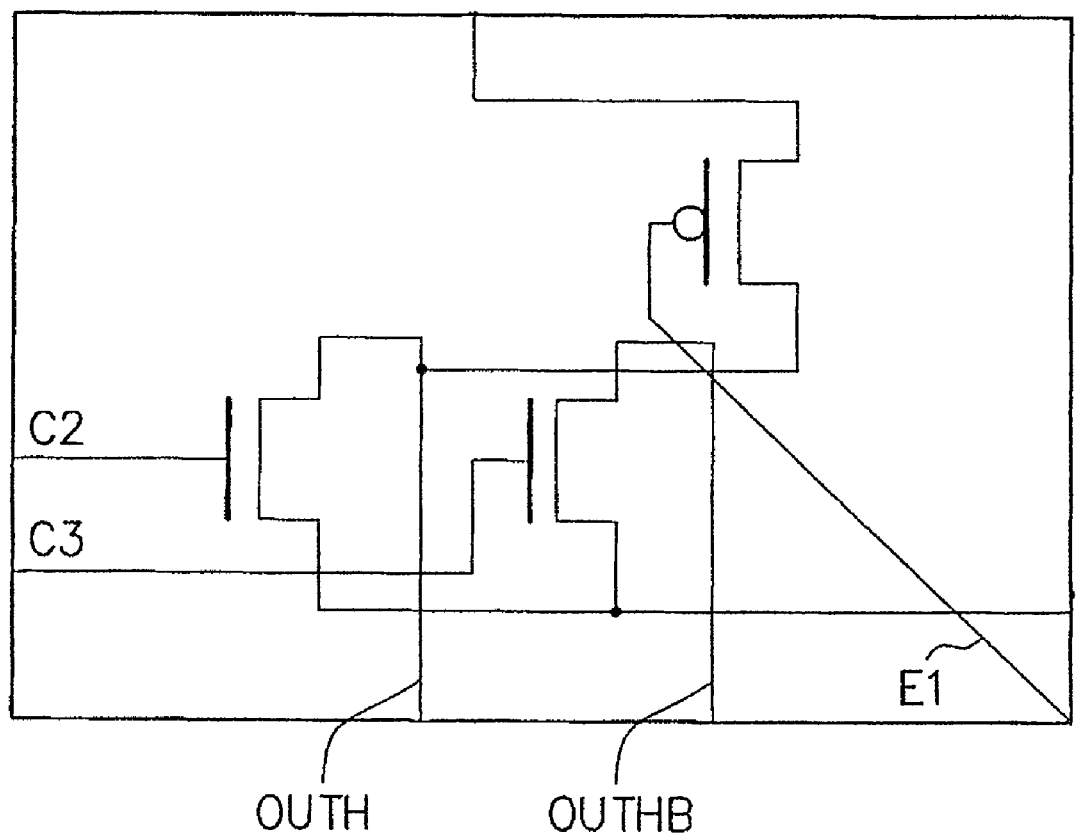
Figure 41:
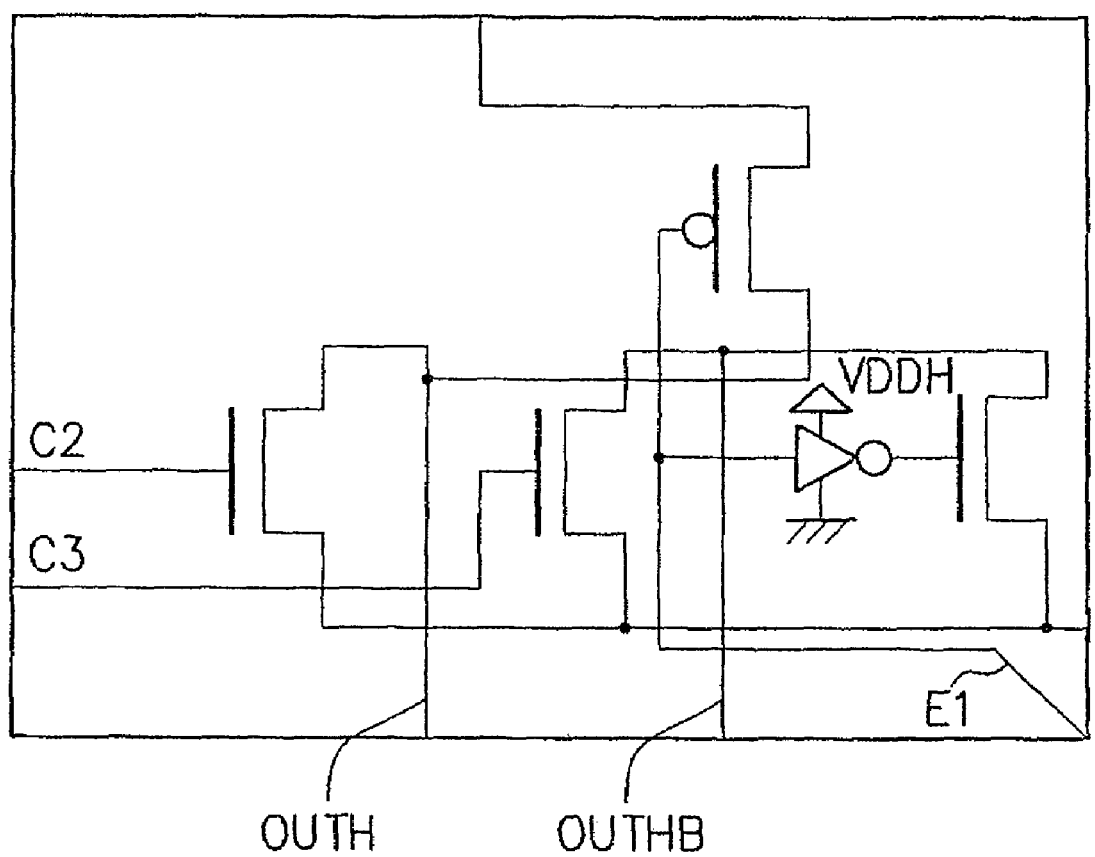
Figure 42:
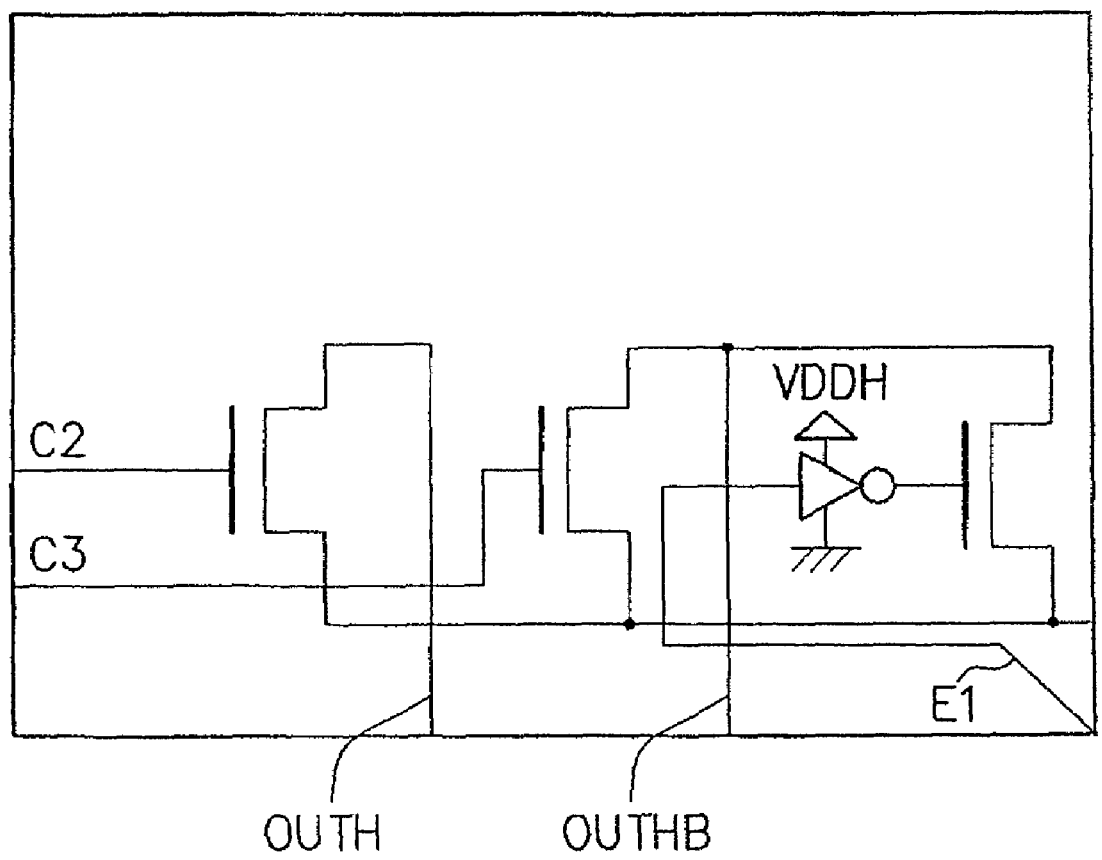

Furthermore, in the pull-up and/or pull-down circuit 3 used in the embodiment, when it is required to fix OUTH to High and OUTHB to Low, the circuit 3 may be replaced with the pull-up and/or pull-down circuit 3 shown in FIG. 30 or 31. In this case, however, it is required that either one of the level shift inputs INL and INLB is guaranteed to be Low when the first power source VDDL is controlled and hence occurrence of the short circuit current is prevented.

In the embodiment, to include only a pull-up circuit 3-1 at level shift, the control circuit 2 and the pull-up and/or pull-down circuit 3 may be respectively replaced by FIG. 32 and FIGS. 33 to 36 (a pull-up and/or pull-down circuit 3 capable of achieving 3-control-signal (two control signals selected from C0 to C3, such as C0 and C1 or C2 and C3, and the E1 signal) input, two-signal (OUTH and/or OUTHB) output).

Restrictions on the replacement by FIGS. 33 to 36 are similar to those of the case of FIG. 26 and FIGS. 29 to 31. This is not the case if the level shift core circuit 1 shown in FIG. 6, 15, 17, 19, or 37 described above is used and the n-MOS and the n-MOS of the switching circuit are respectively and independently connected in parallel.

To operate only the pull-down (3-2) function at level shift, the control circuit 2 and the pull-up and/or pull-down circuit 3 used in the embodiment may be respectively replaced by FIG. 38 and FIGS. 39 to 42.

Restrictions on the replacement by FIGS. 39 to 42 are similar to those of the case of FIG. 26 and FIGS. 29 to 31.

Figure 43:
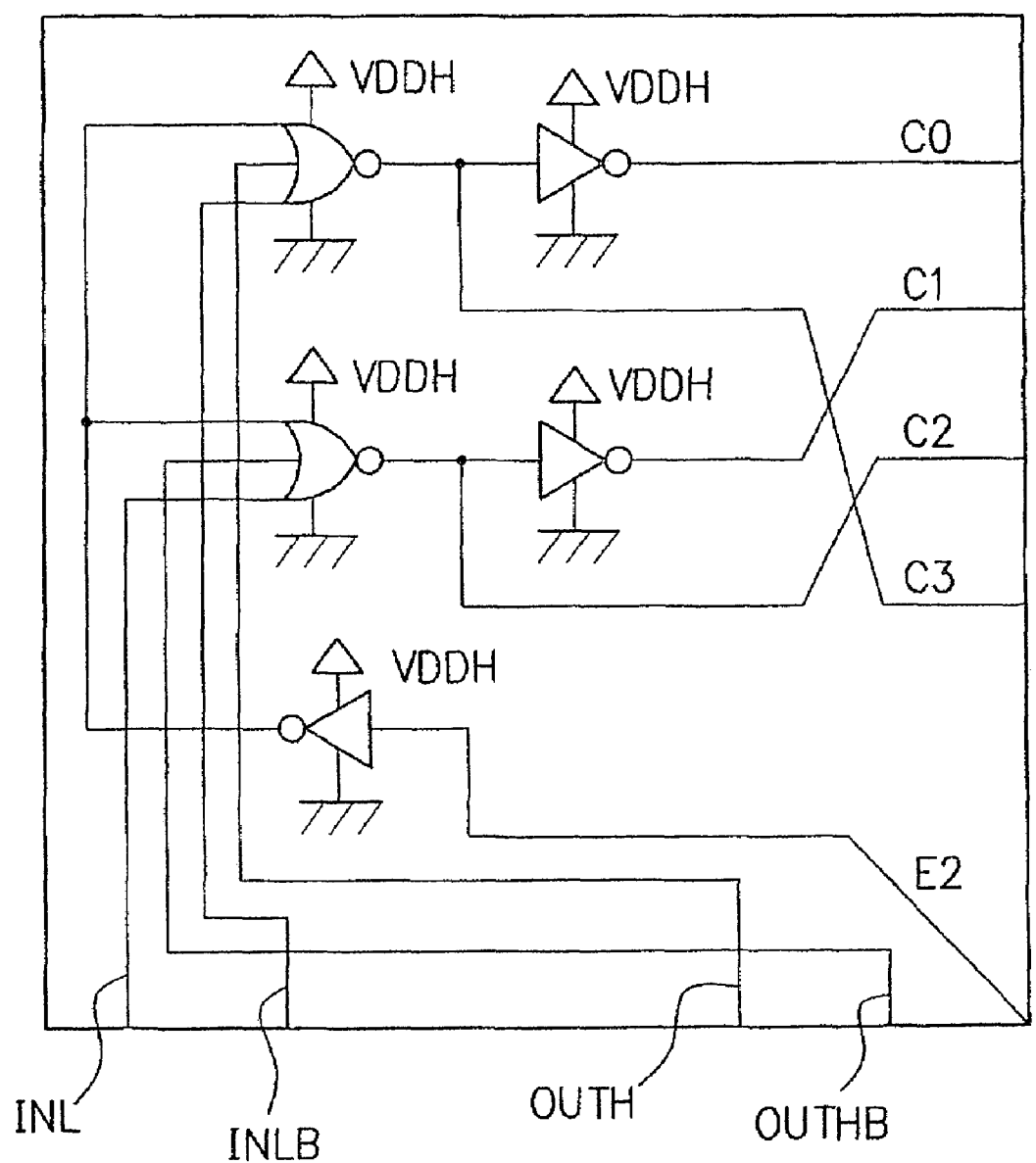
Figure 44:
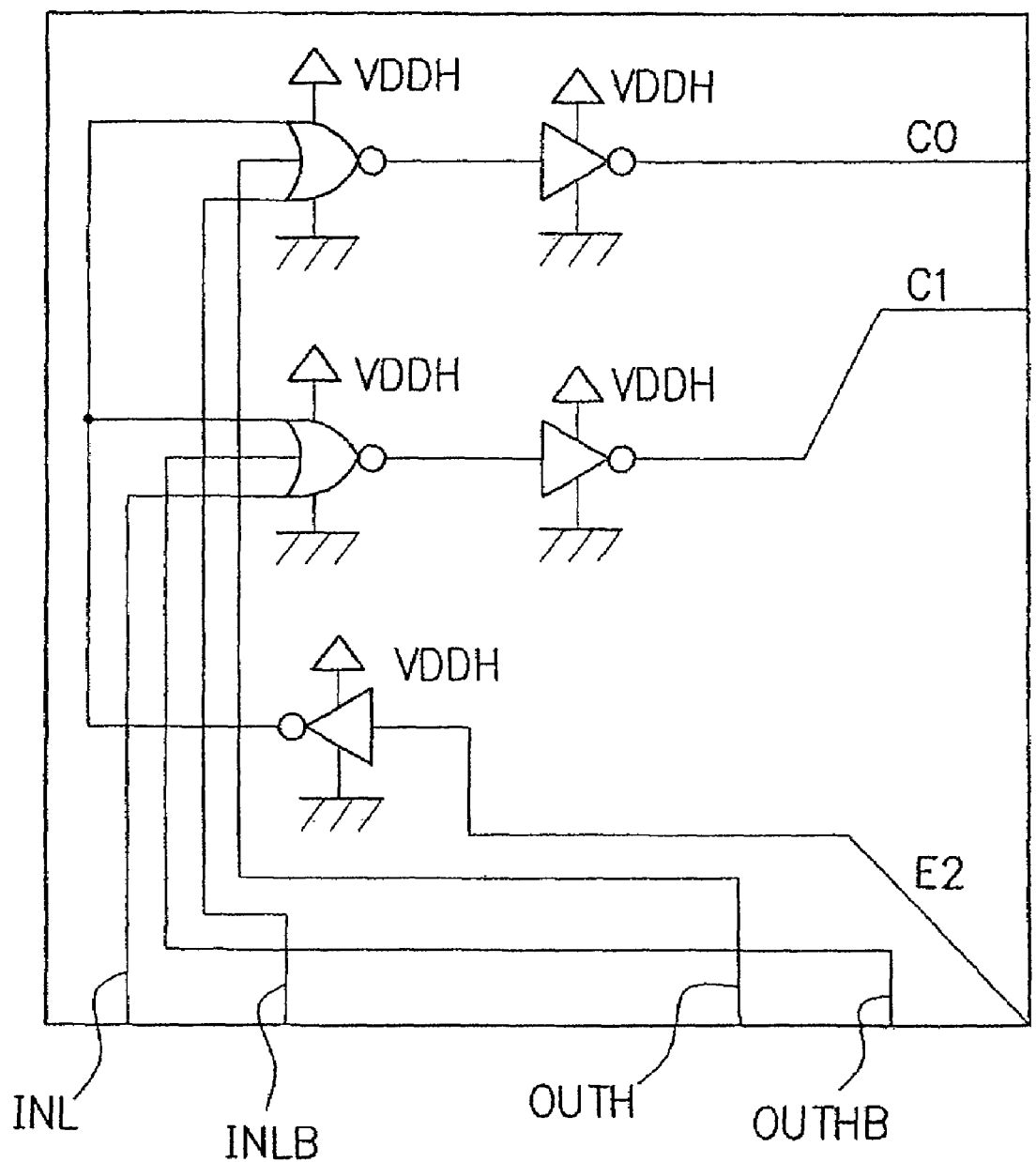
Figure 45:
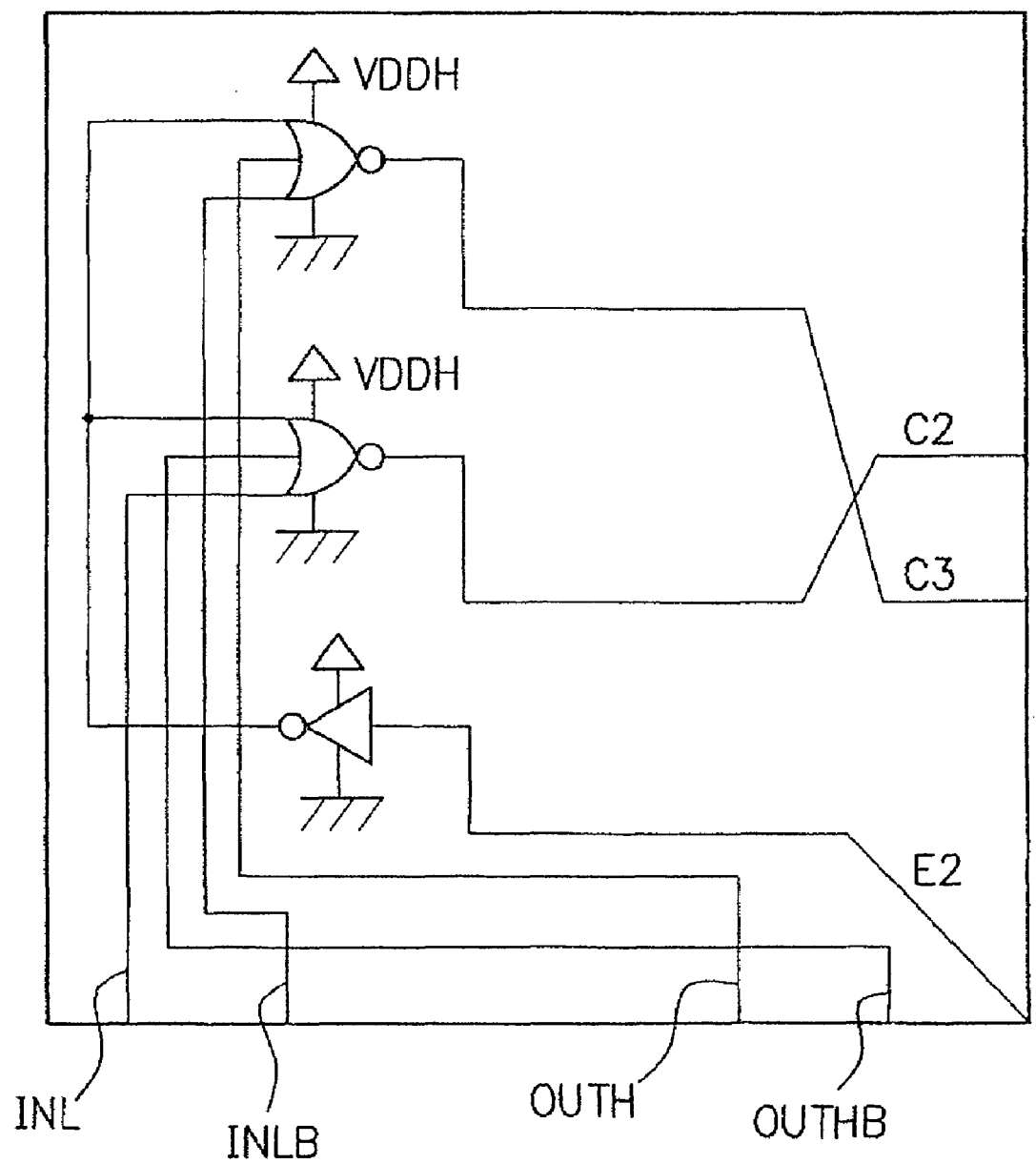

Moreover, the control circuit adopted in the embodiment may be respectively replaced by FIGS. 43 to 45. Functions and operations after the replacement by FIGS. 43 to 45 are similar respectively to those of FIGS. 25, 32, and 38, and hence description thereof will be avoided.

Figure 46:
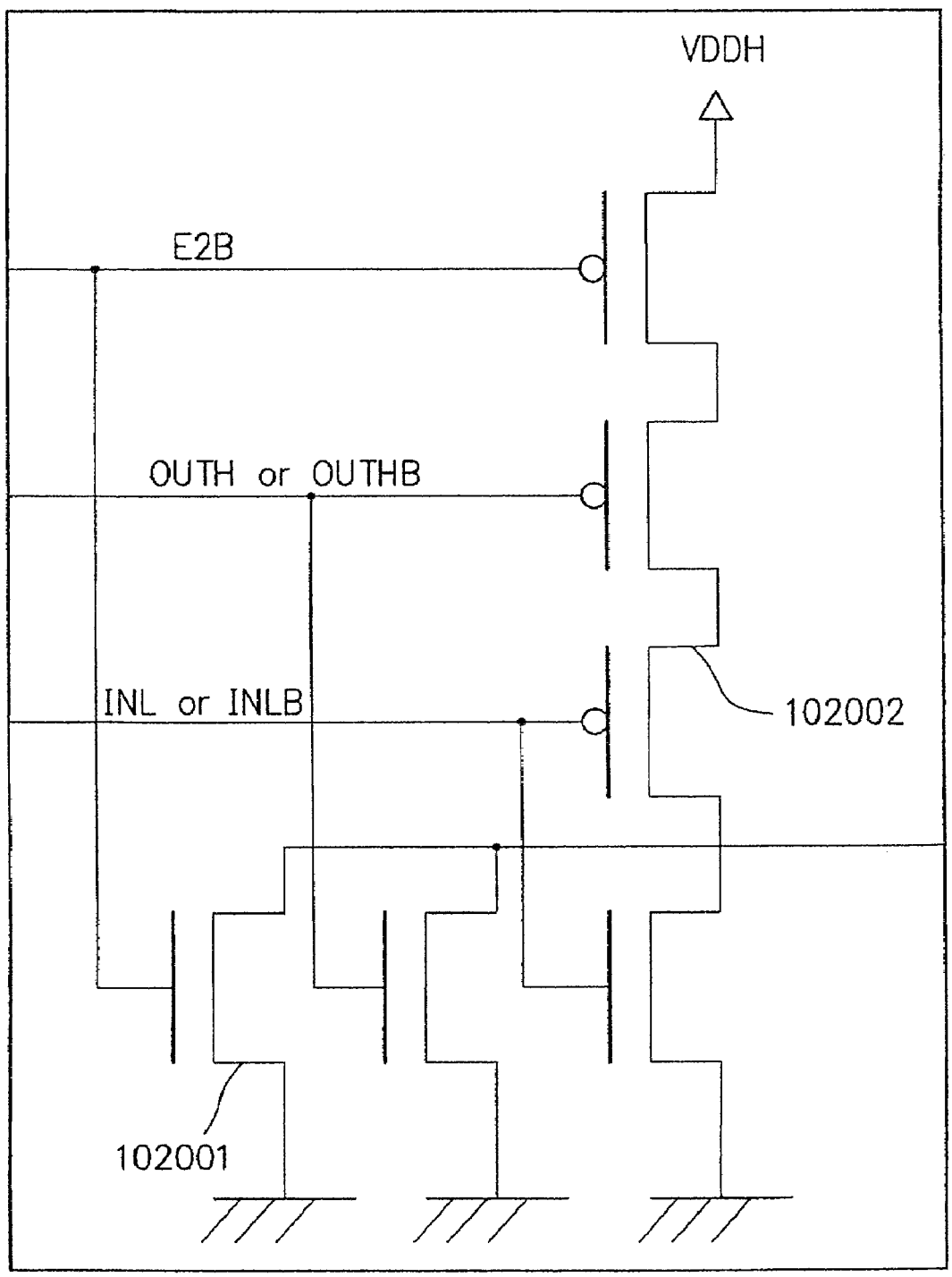

In conjunction with FIGS. 43 to 45, FIG. 46 shows an example of NOR circuits shown in FIGS. 43 to 45. In FIG. 46, a control signal E2B (an inverted signal of E2) is connected to a p-MOS 102601 most apart from an output terminal. This is because E2B has a weakest restriction with respect to delay. Furthermore, by connecting the level shift input (INL, INLB) to a p-MOS near the output terminal, the gate delay thereof can be reduced as compared with the case in which the input is connected to a p-MOS apart from the output terminal. However, it is not necessarily required to follow the input order of FIG. 46. In addition, for the p-MOS connected to the level shift input, the High level of the level shift input cannot reach the second power source voltage level, and hence the p-MOS does not turn on depending on its threshold value; moreover, the n-MOS does not fully turn on, and hence the NOR operation is difficult in some cases. In this situation, as described above, the NOR operation can be guaranteed by reducing a ratio of p-MOS channel width/length (W/L), by reducing the threshold value (VDDL-VDDH or less; by increasing the absolute value when the polarity is negative), by increasing W/L of the associated n-MOS, or by reducing the threshold value. Furthermore, even when the logic operation is possible, the NOR leakage can be suppressed by minimizing the W/L of the p-MOS or by reducing the threshold value (by setting the threshold value to VDDL-VDDH or less. That is, by setting the polarity to negative and by increasing the absolute value as described above).

Incidentally, in the description of the embodiment, the control signals E0 to E2 outputted from the third logic circuit are used in this case such that the pull-up and/or pull-down circuit uses E1, the control circuit utilizes E2, and the switching circuit 10 employs E0 for control. However, the control signals E0 to E2 inputted to the pull-up and/or pull-down circuit, the control circuit, and the switching circuit 10 may be respectively replaced by other control signals according to need. Additionally, the level shifter may also be configured by using either one of the OUTH signal and the OUTHB signal and by exchanging the layout of the level shift circuit 1 and the switching circuit in an example of change from the first embodiment 1 to the second embodiment.

FOURTH EMBODIMENT

Figure 47:
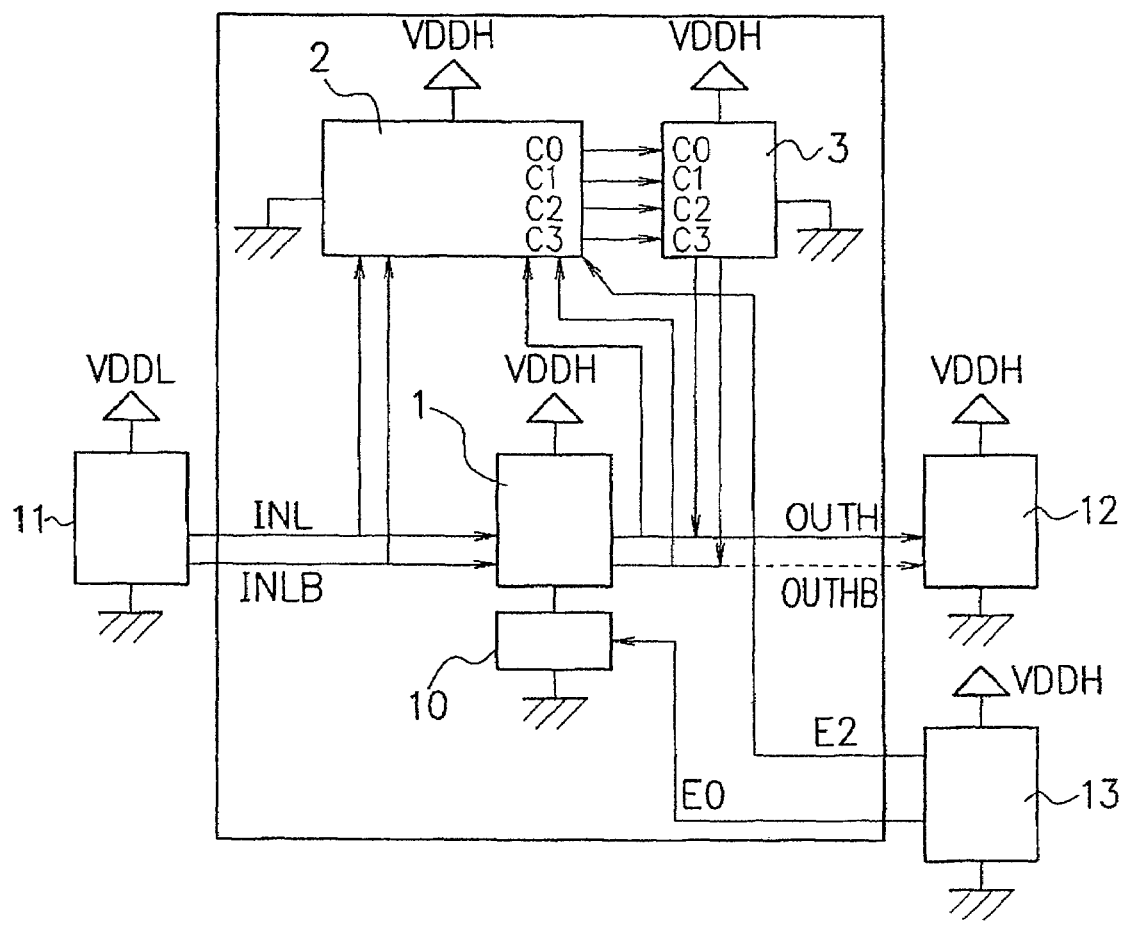
FIG. 47 is a configuration diagram showing a configuration example in a fourth embodiment of a level shifter of the present invention.

The fourth embodiment of the present invention is implemented by devising the control circuit 2 such that the control signal E1 is removed from the third logic circuit 13 and the pull-up and/or pull-down circuit 3 is simplified, adopting other fundamental configurations similar to one of the embodiments described above. FIG. 47 shows the configuration.

Figure 48:
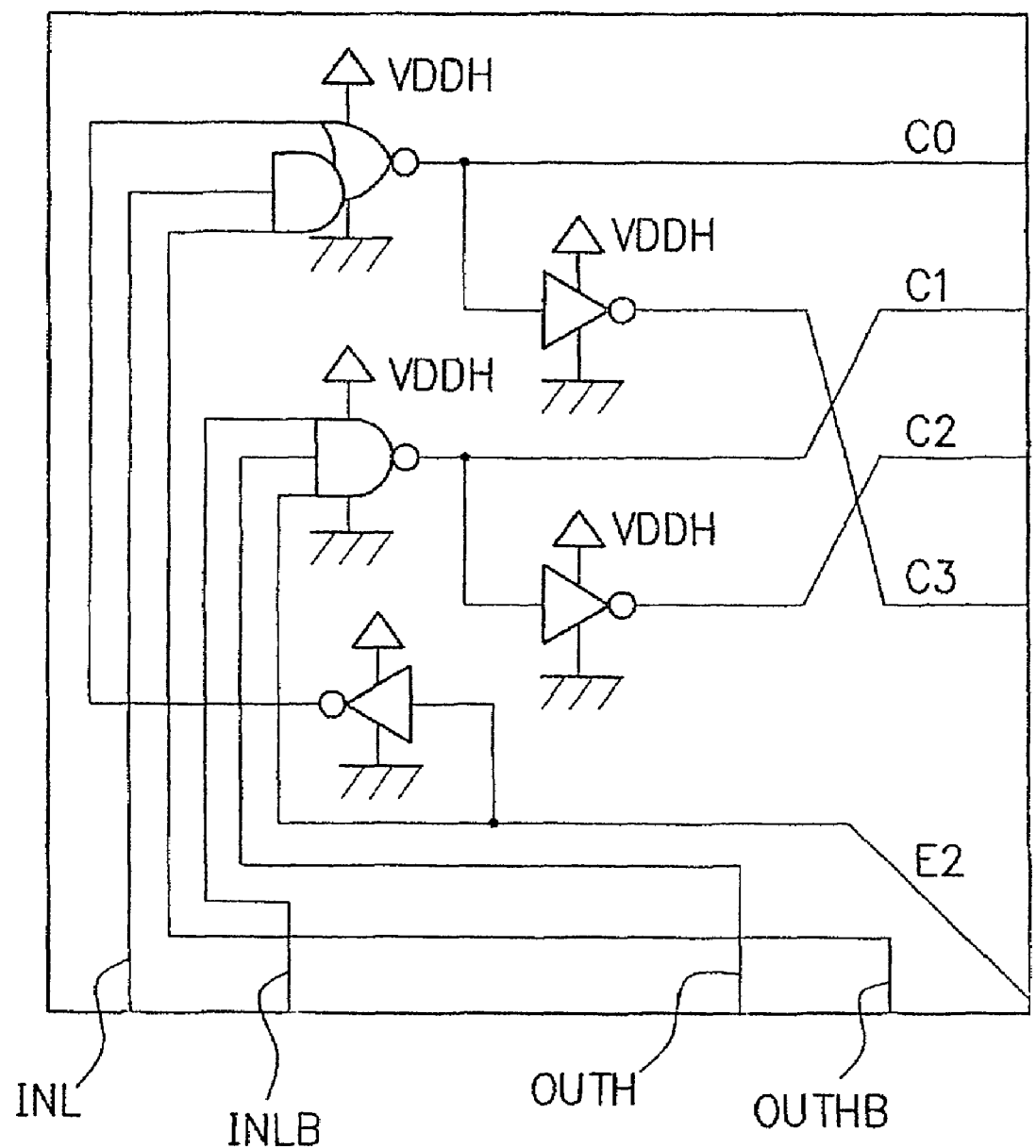

FIG. 48 shows the control circuit 2 used in the level converter shown in FIG. 47. As shown in FIG. 48, the control circuit 2 used in the embodiment is configured as below. That is, when compared with FIG. 25, the NAND circuit to output C0 is replaced by an AND-NOR circuit and an inverted signal (E2B) of E2 is inputted to a NOR section of the AND-NOR circuit. As a result, when E2 becomes Low, C0 is set to High, and C3 is set to Low. Excepting the change in the signal functions, the embodiment operates in a way similar to that of the third embodiment described above.

Figure 49:
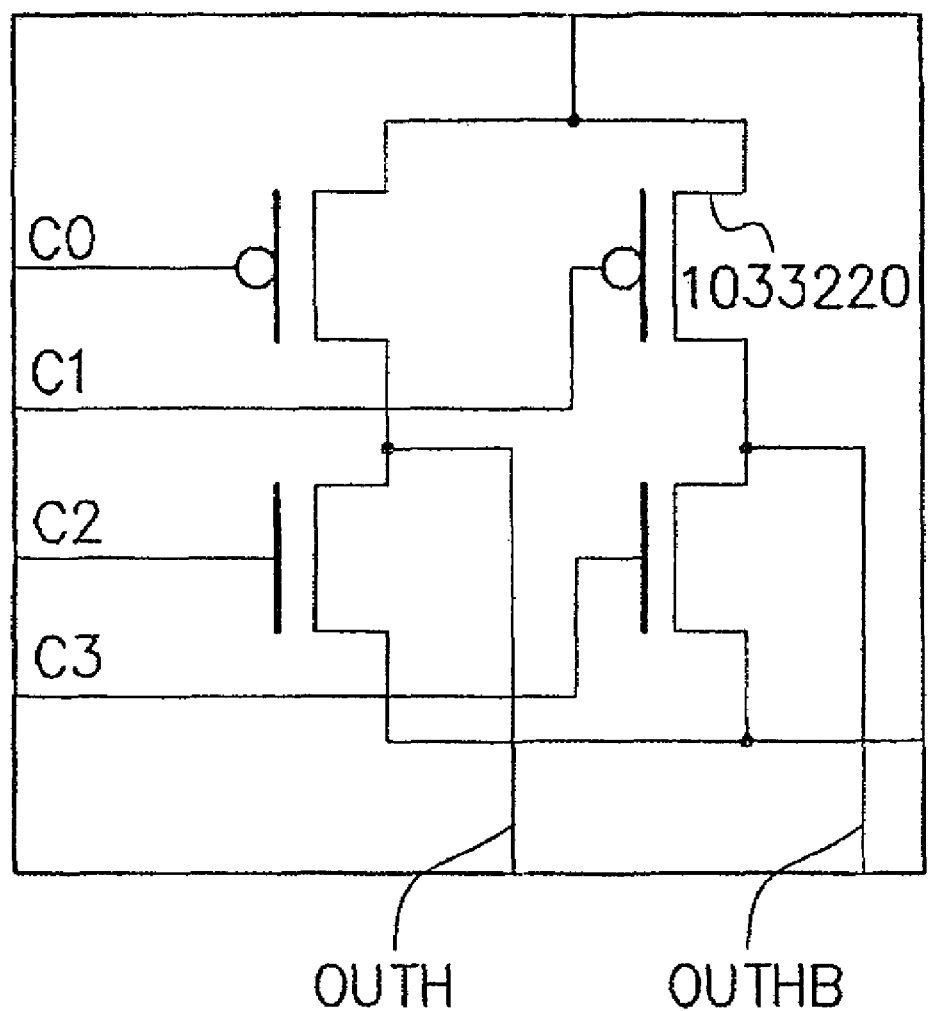

FIG. 49 shows the pull-up/pull-down circuit 3 used in the level converter shown in FIG. 47. The configuration of the circuit will be next described. That is, as compared with FIG. 30, the p-MOS 103322 including a gate terminal to which E1 is inputted, the inverter 103326, and the n-MOS 103325 including a gate terminal connected to an output from the inverter can be removed. However, like in FIG. 30, this applies only to a case in which either one of the level shift inputs INL and INLB is guaranteed to be at Low when the first power source VDDL is controlled and the occurrence of the short circuit current is prevented.

Figure 50:
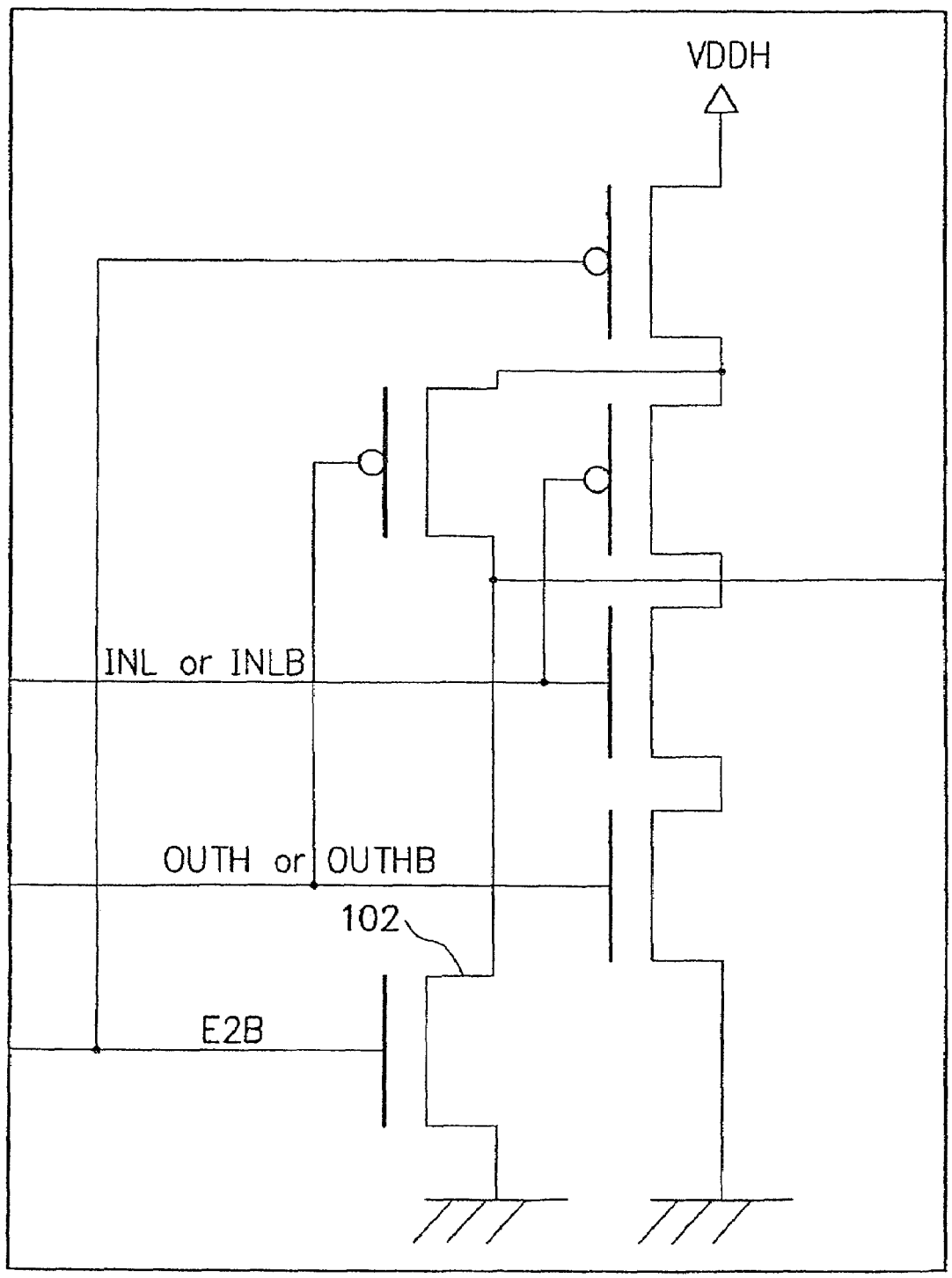

The AND-NOR circuit of FIG. 48 is configured, for example, as shown in the diagram, as below. That is, a p-MOS 102 including a gate terminal connected to the inverted signal E2B of the control signal E2 is disposed on the power source side. This is because E2B has a weak restriction with respect to delay. The other configurations are similar to those of the NAND circuit of FIG. 27. In FIG. 50, INL or INLB and OUTH or OUTHB are respective inputs to two n-MOS; this indicates that the input signal is a combination of INL and OUTH, INL and OUTHB, INLB and OUTH, or INLB and OUTHB. When INL or INLB and OUTH or OUTHB are used, the input signals are indicated as the combinations as above in this specification.

Figure 51:
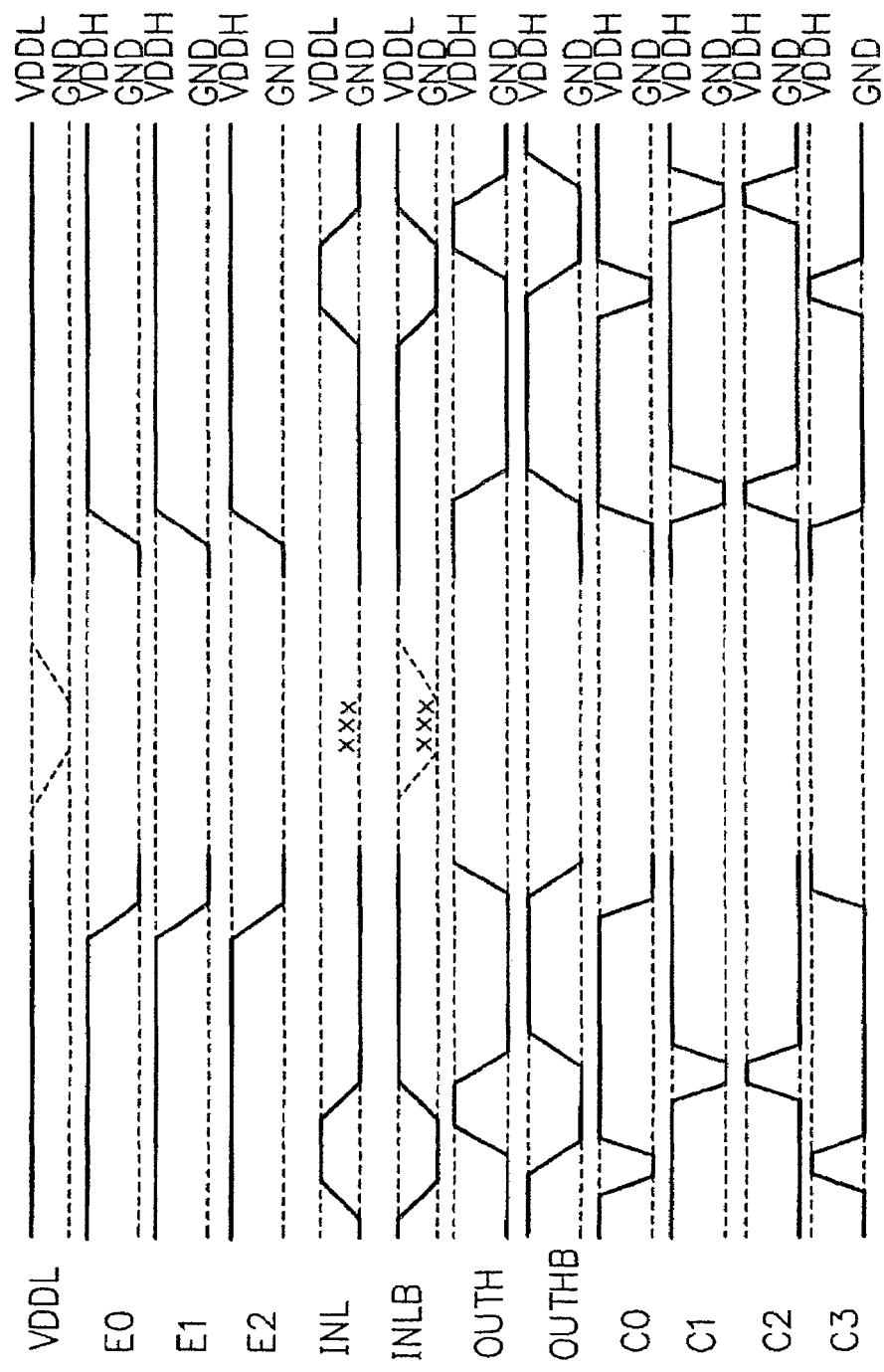
FIG. 51 is a timing chart showing an operation example of the level shift core circuit of the fourth embodiment.

The timing chart of FIG. 51 shows an operation example of the level shifter shown in FIG. 47.

Figure 52:
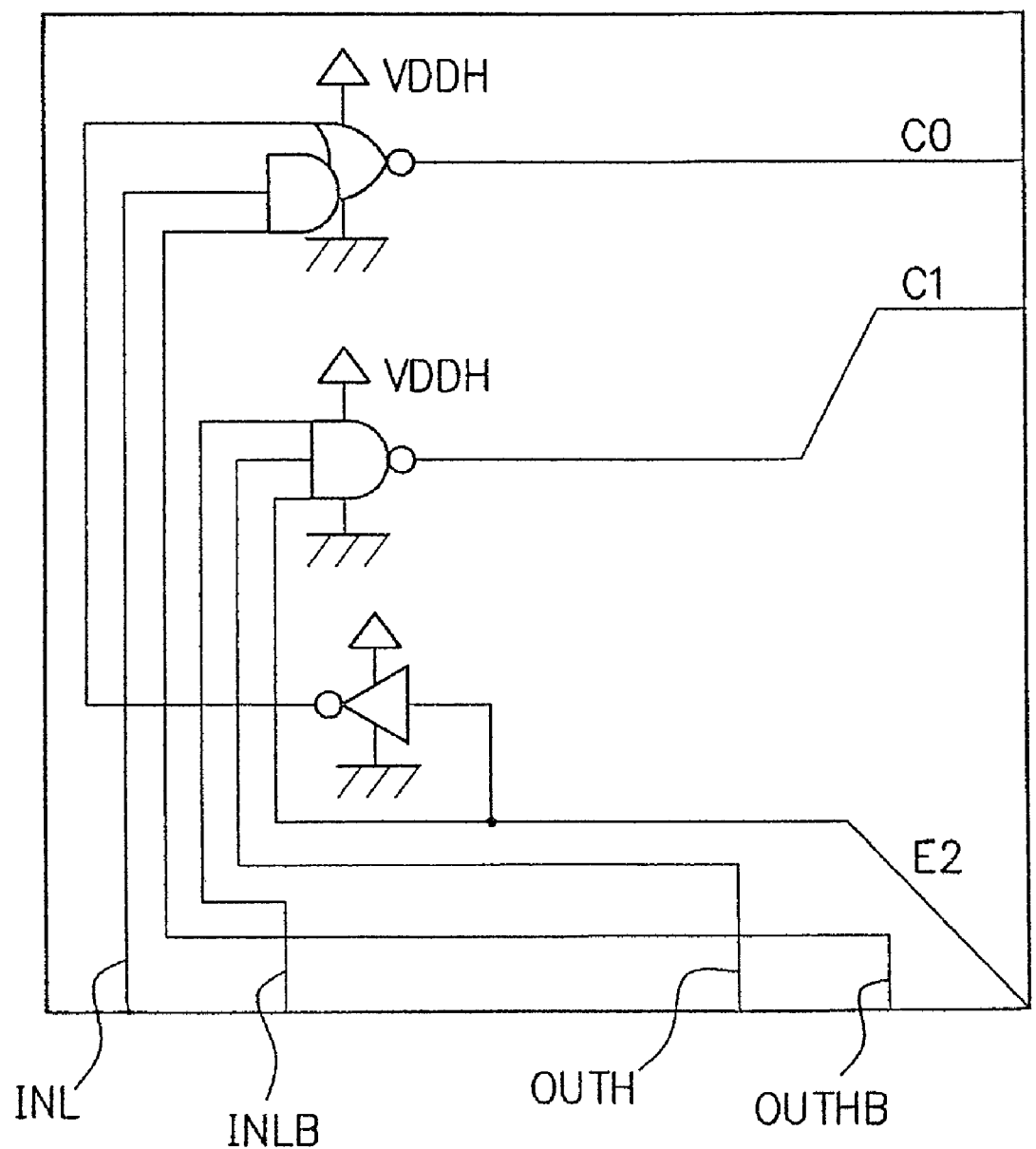
Figure 53:
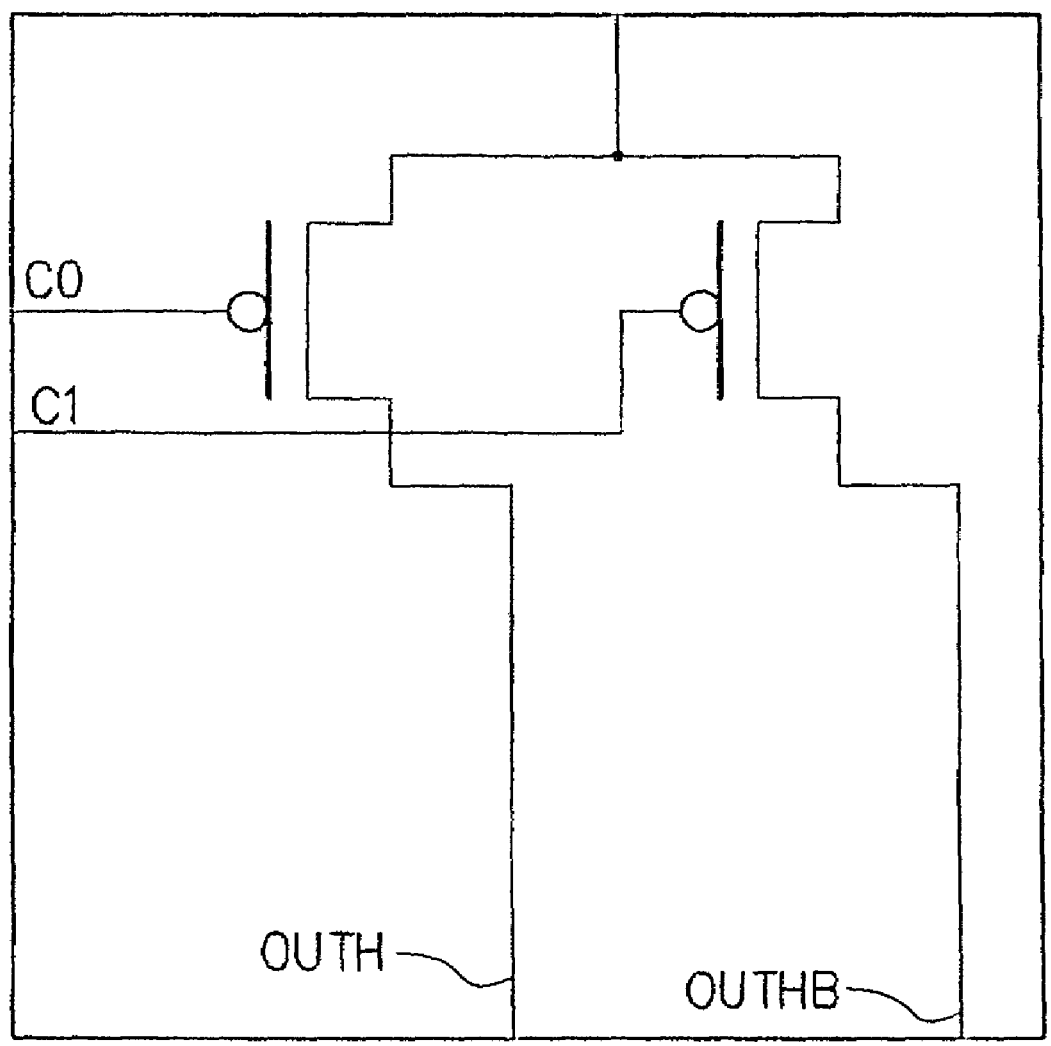
Figure 54:
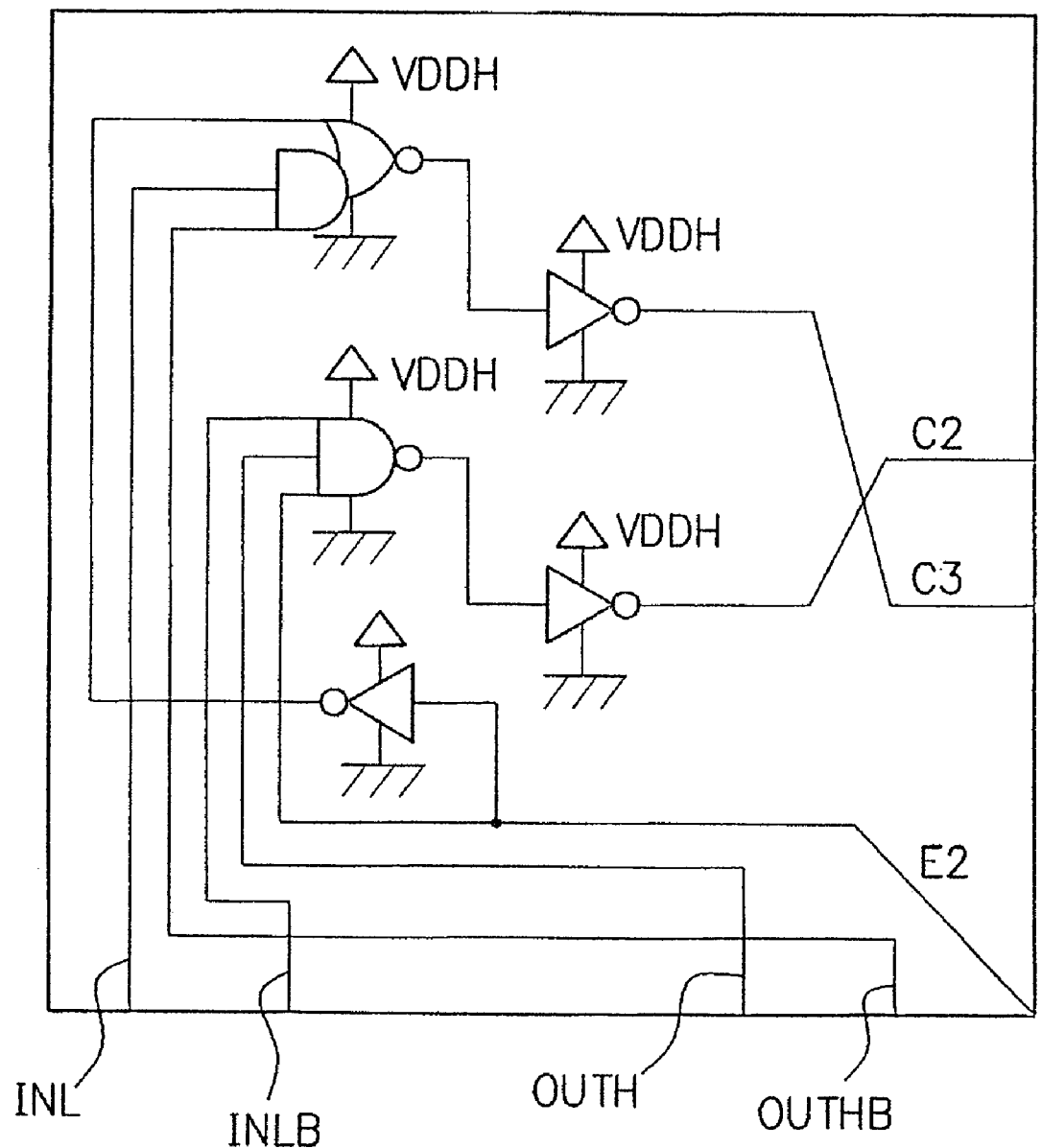
Figure 55:
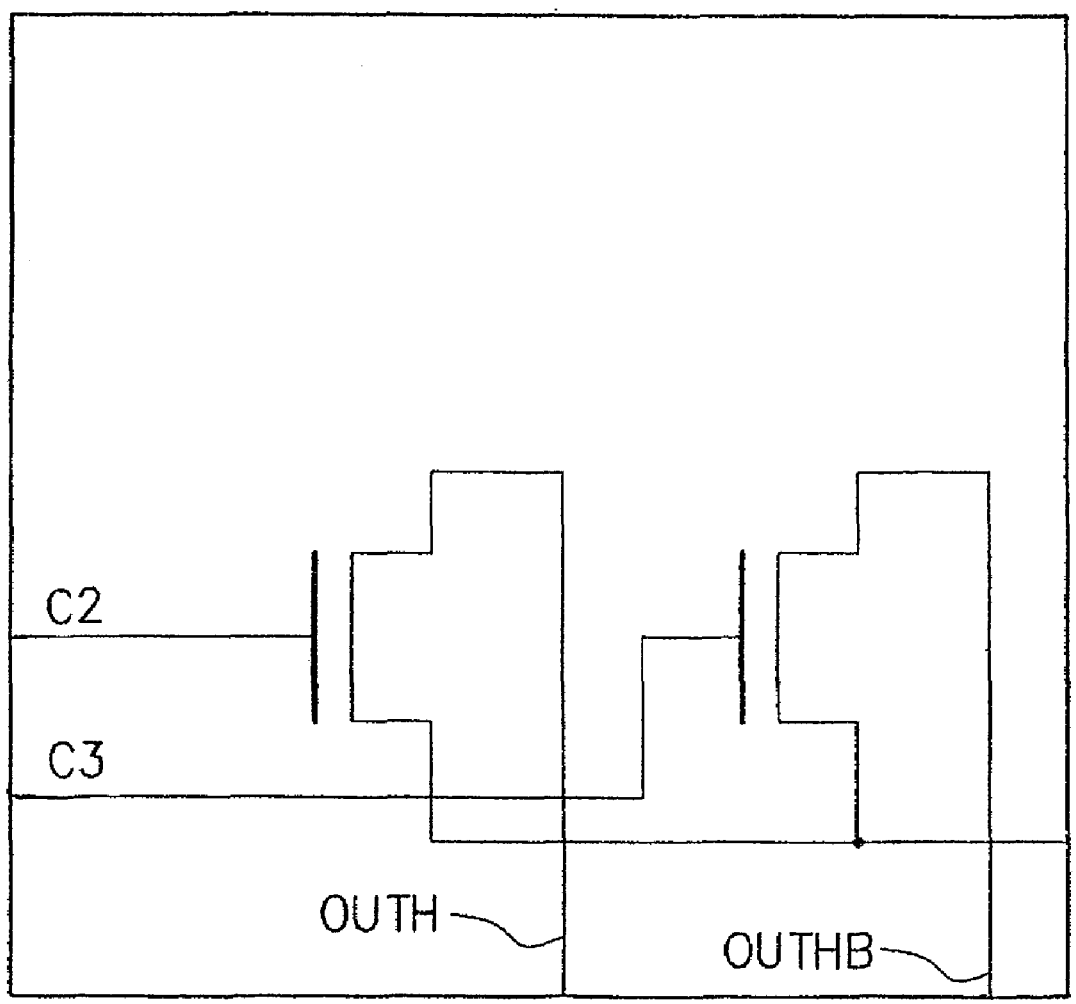

The control circuit 2 and the pull-up/pull-down circuit 3 used in the embodiment may be replaced by the circuits respectively shown in FIGS. 52 and 53 in a case in which only OUTH of the level shift outputs is fixed to a High level when the first power source is off to achieve only the pull-up (3-1) function at level shift. The control circuit 2 and the pull-up/pull-down circuit 1 (reference is to be made to FIG. 53) used in the embodiment may be replaced by the circuit configurations respectively shown in FIGS. 54 and 55 in a case in which only the pull-up (3-1) function is used at level shift and OUTH of the level shift outputs is fixed to High and OUTHB is fixed to Low when the first power source is off. Additionally, the control circuit 2 used in the embodiment may be replaced by any one of FIGS. 56 to 58. The level shifter thus replaced operates in a way similar to that described in the paragraphs of FIGS. 48, 52, and 54 and achieves a function similar to that of the circuit before the replacement.

Figure 56:
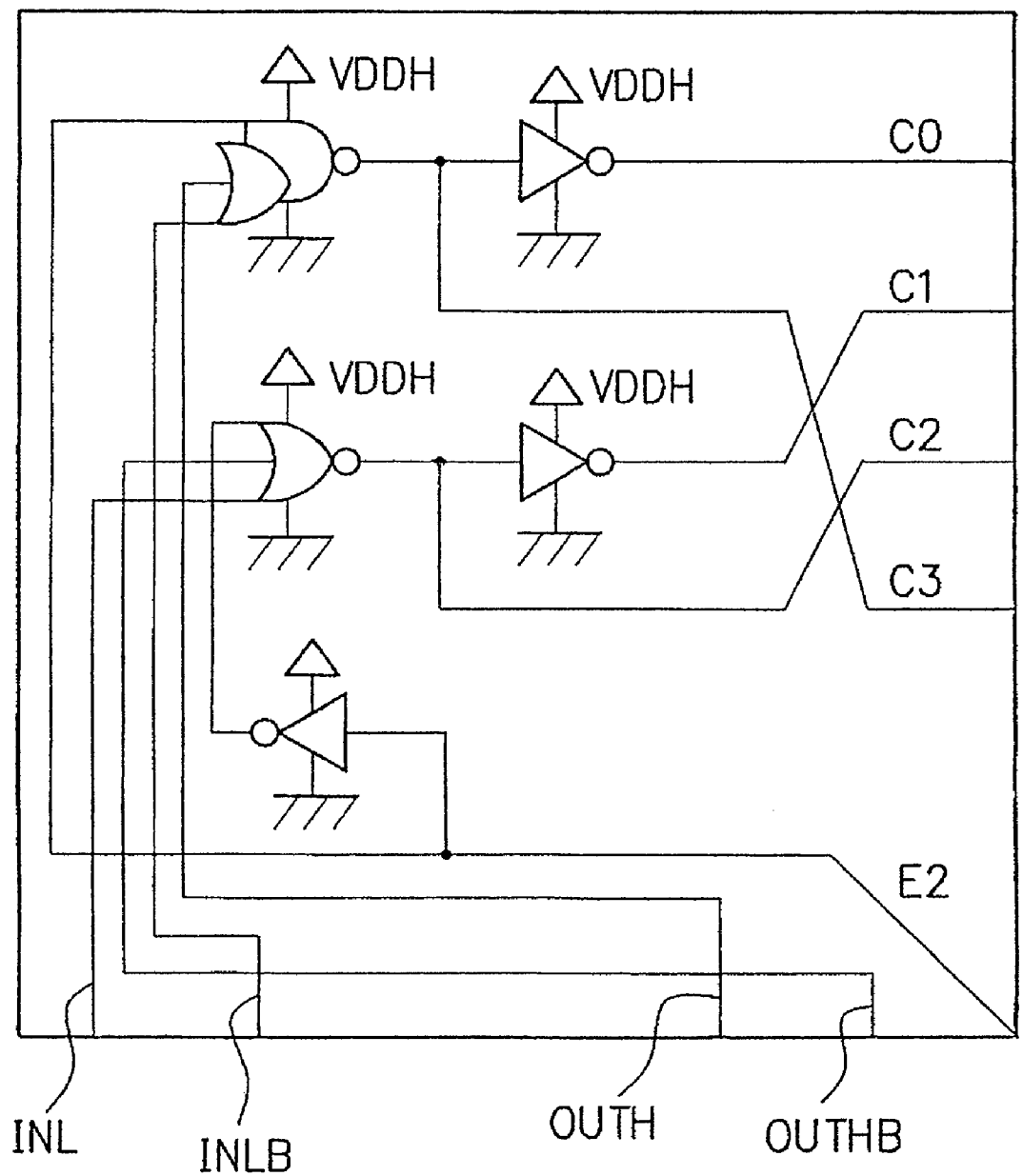
Figure 57:
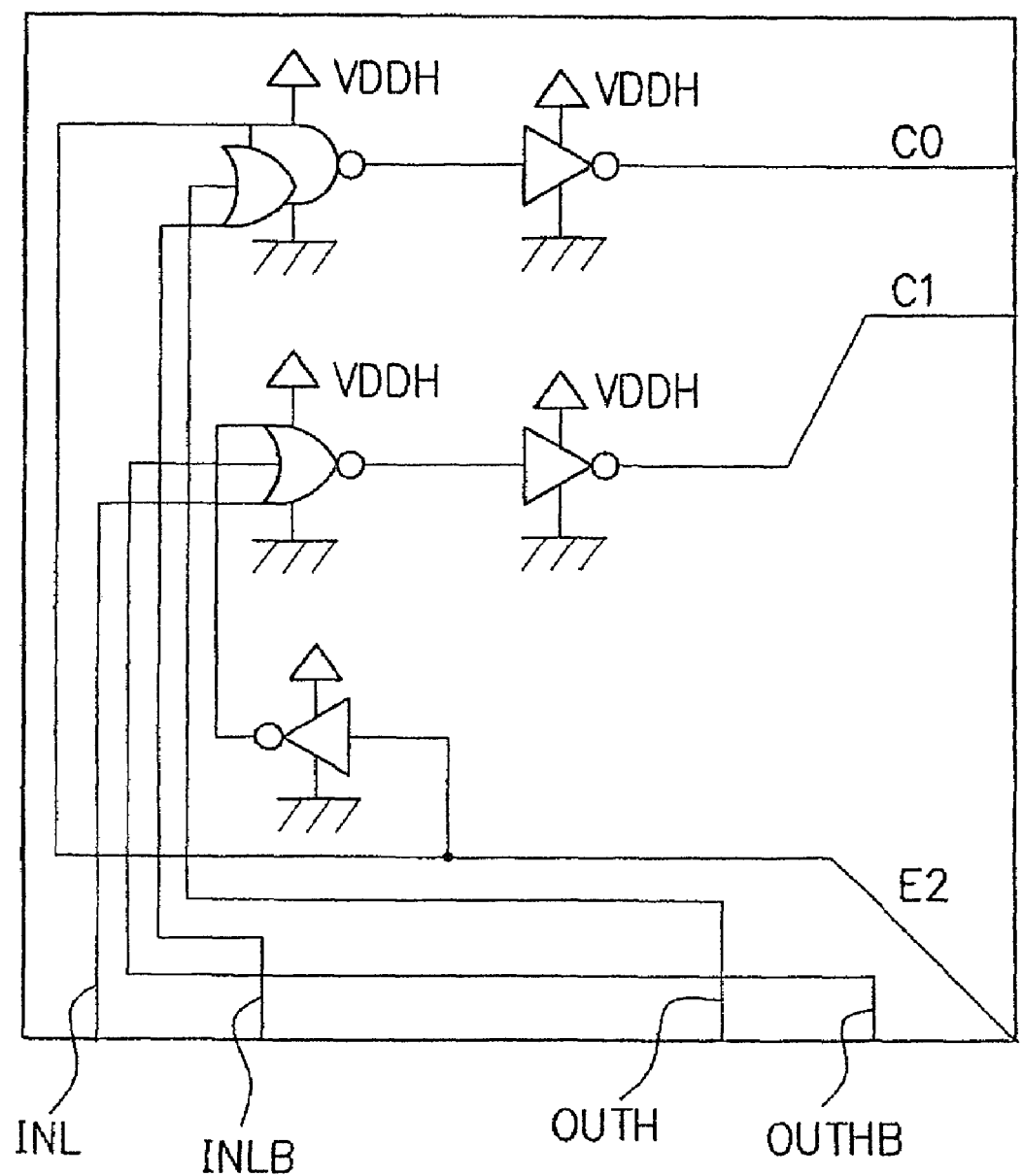
Figure 58:
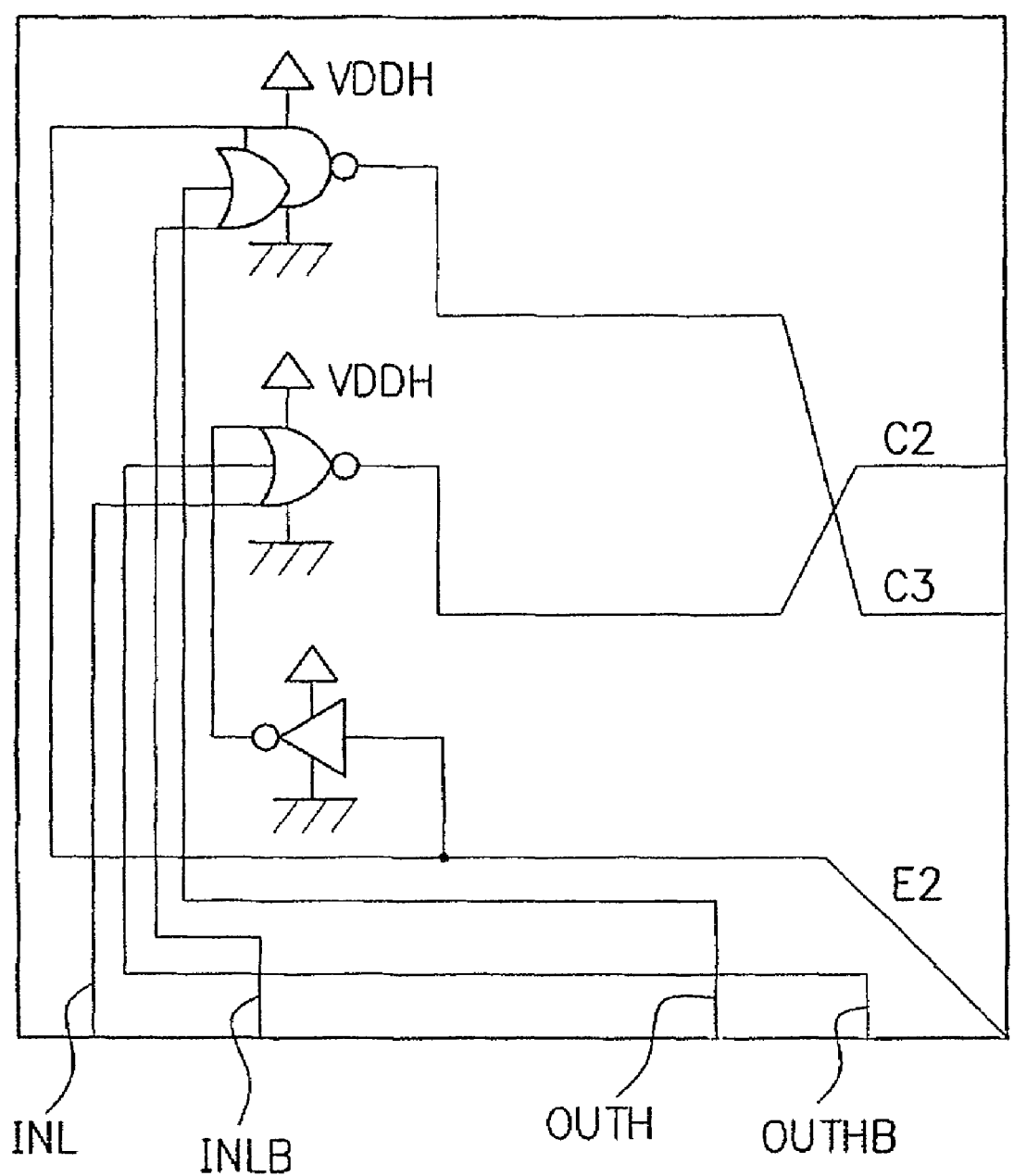
Figure 59:
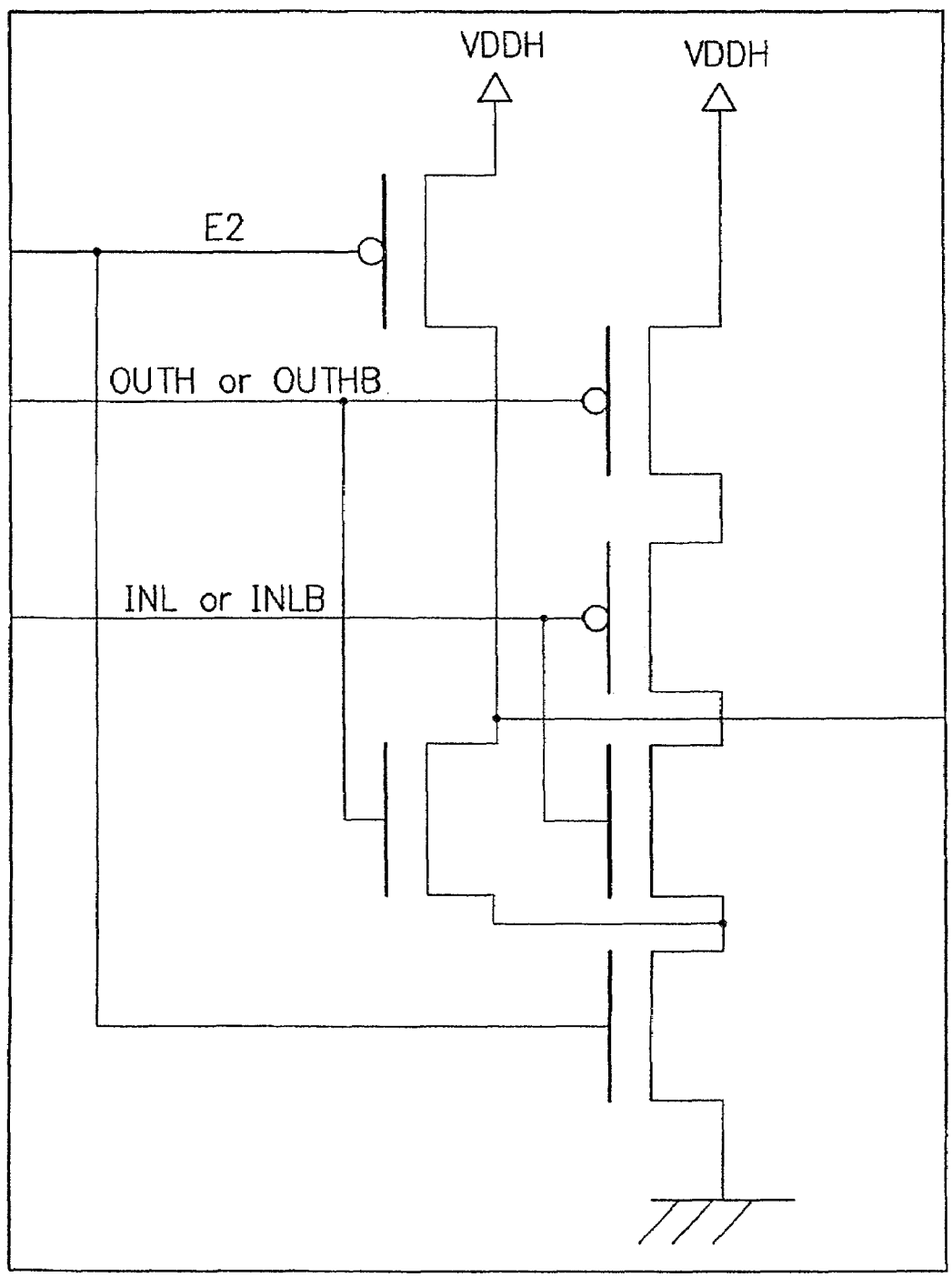

The OR-NOR circuit used in FIGS. 56 to 58 is configured, for example, as shown in the diagrams, as below. That is, an n-MOS including a gate terminal connected to the control signal E2 is disposed on the GND power source side. This is because E2 has a weak restriction with respect to delay. The other configurations are similar to those of the NOR circuit of FIG. 46.

Figure 60:
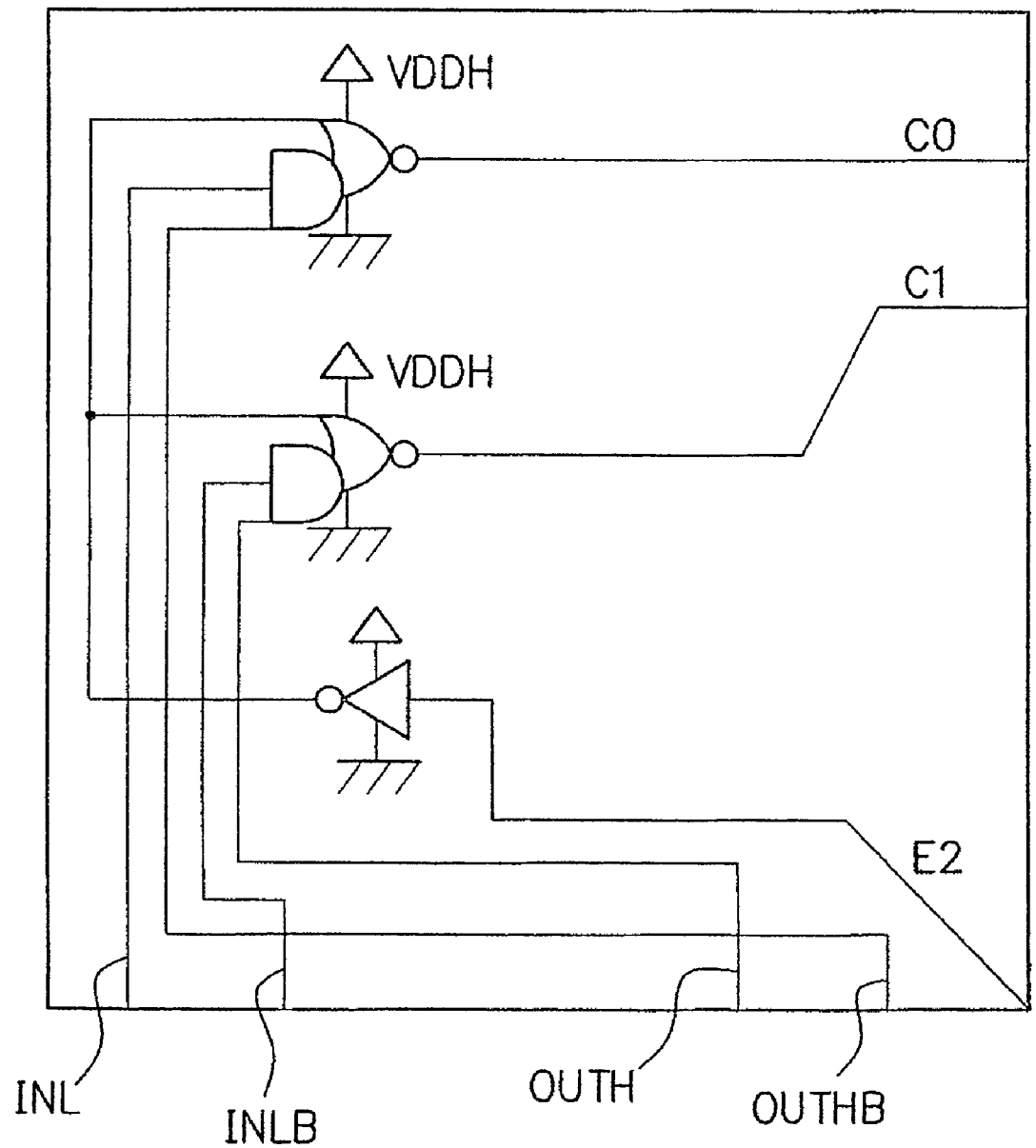
Figure 61:
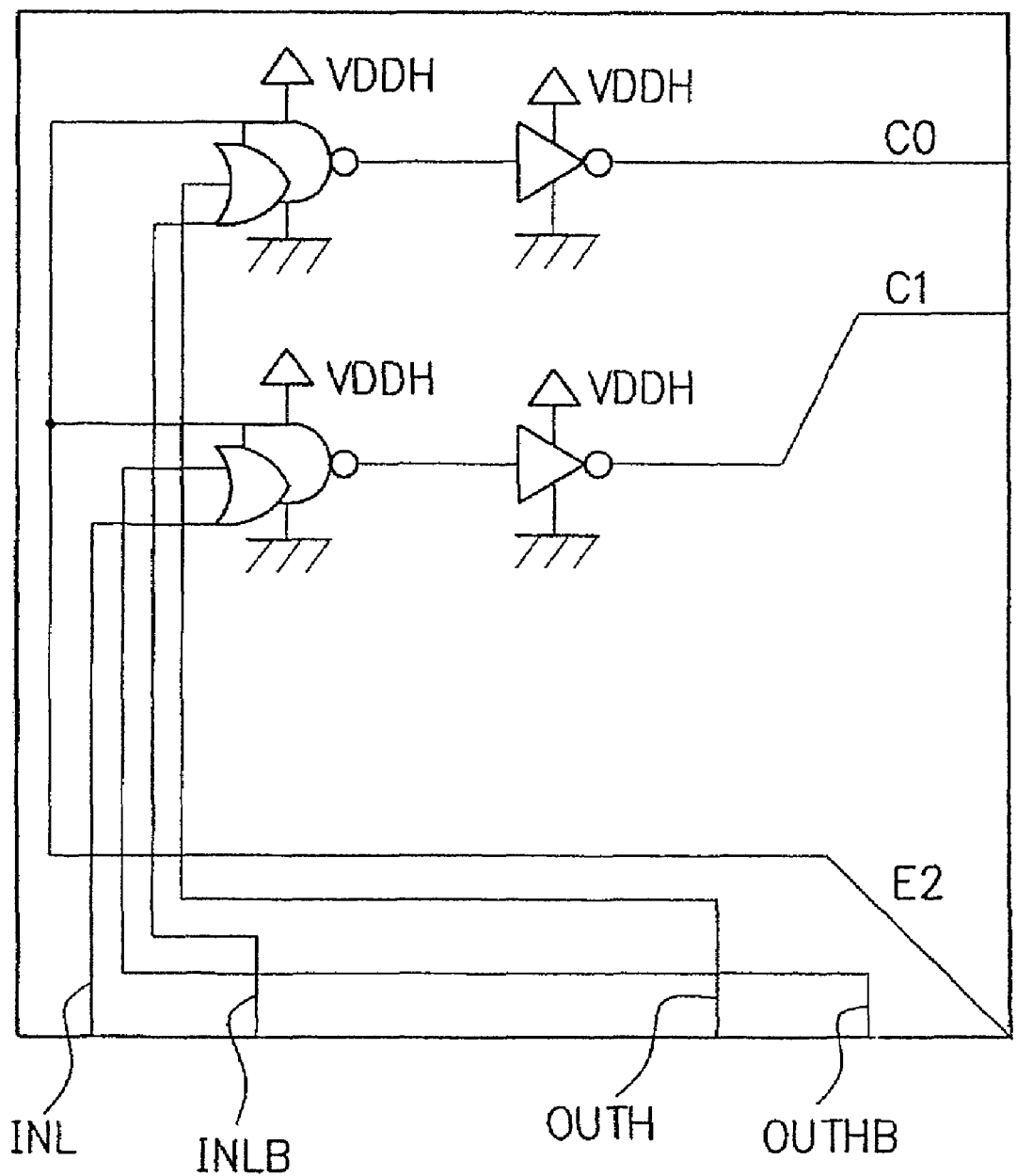
Figure 62:
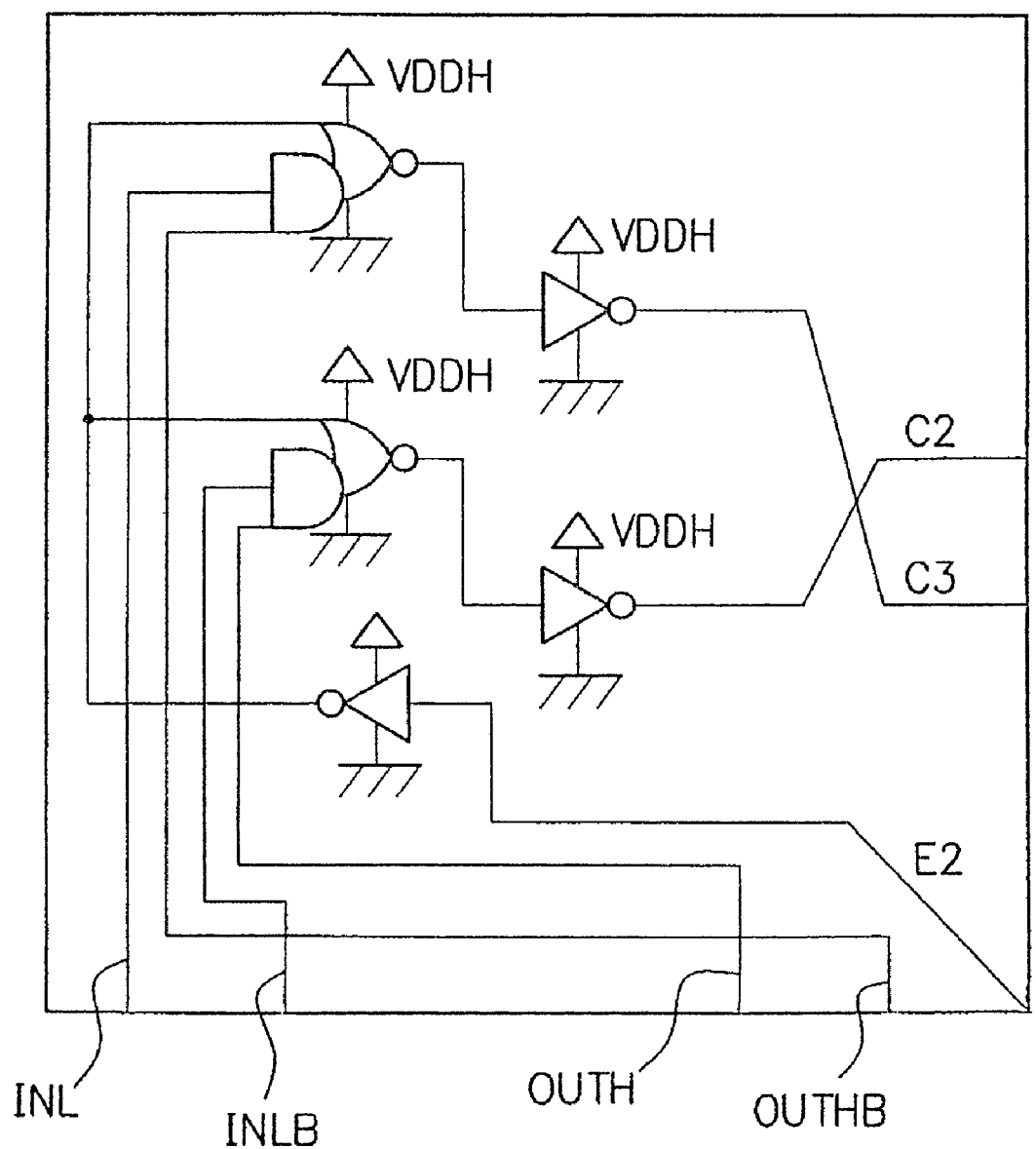
Figure 63:
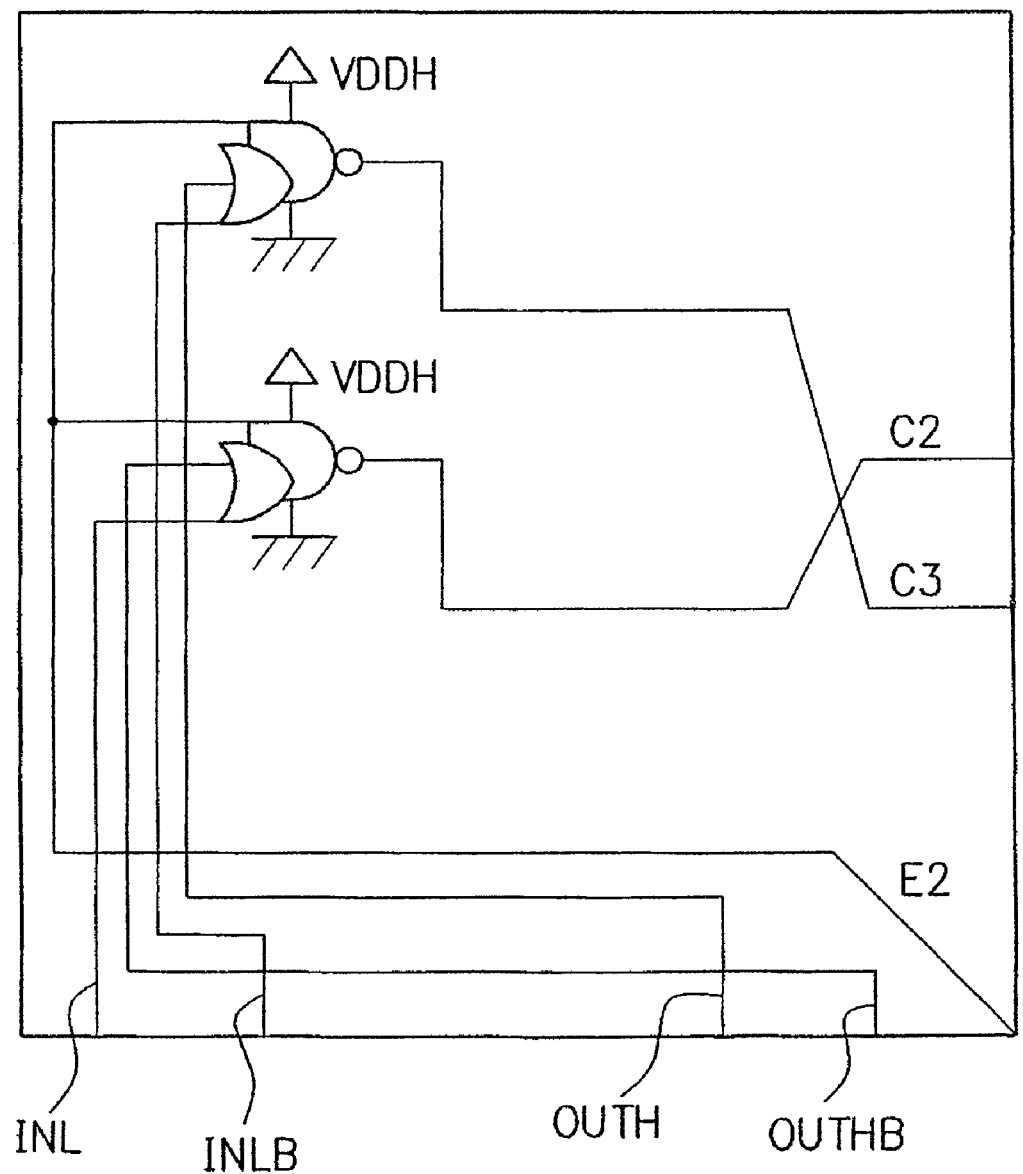

The control circuit 2 used in the embodiment may be replaced by any either one of FIGS. 60 and 61 in a case in which OUTH and OUTHB of the level shift outputs are fixed to High when the first power source is off to enable operation of only the pull-up (3-1) function or the pull-down (3-2) function or in a case in which OUTH and OUTHB are fixed to Low for the pull-down (3-2). However, this applies only to a case in which the short circuit current is absent when the switching circuit is disposed at a position on the power source side.

FIFTH EMBODIMENT

Figure 64:
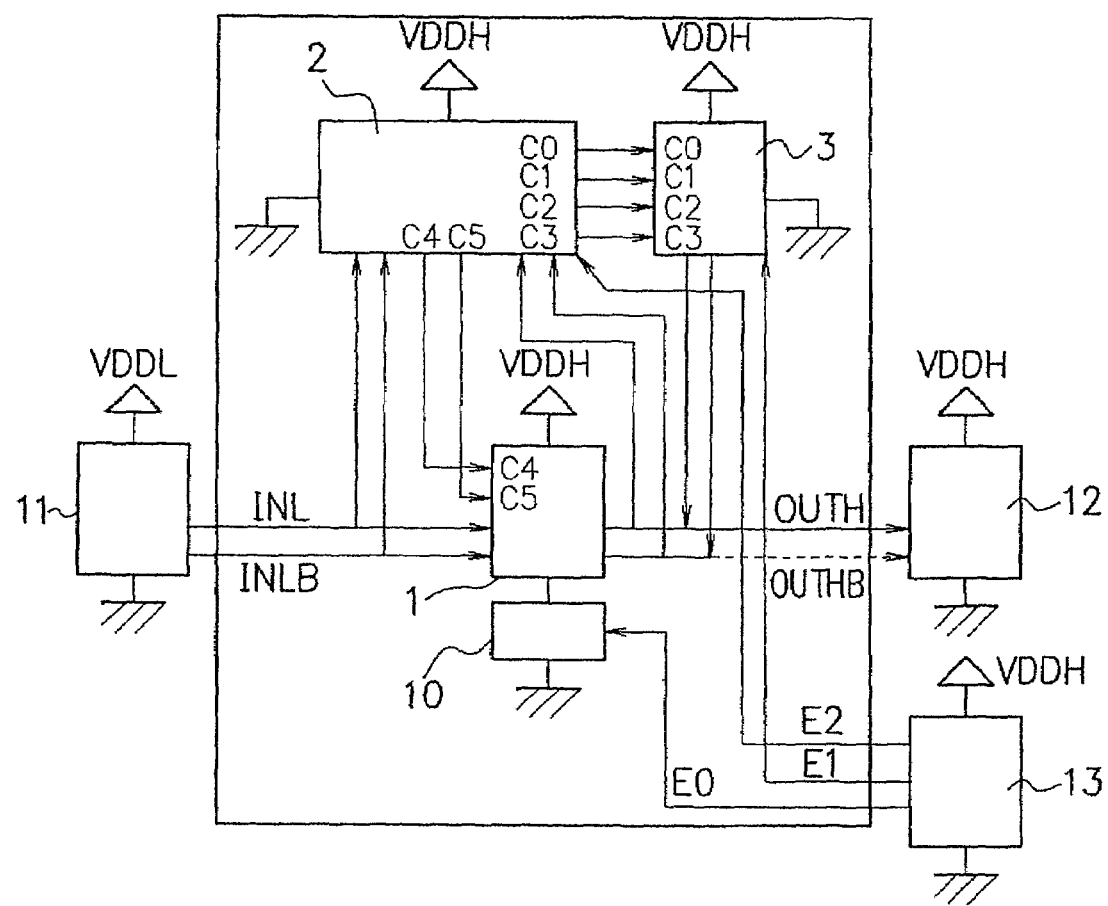
FIG. 64 is a diagram showing a configuration example of a fifth embodiment of a level shifter of the present invention.

The fifth embodiment of the present invention has devised control in a configuration of a level shifter capable of improving the level shift margin when a large potential difference exists between the first and second power sources, the circuit including a control circuit 2 to which the second power source is supplied and a pull-up/pull-down circuit 3 to which the second power source is supplied. In this embodiment, control of a level shift core circuit 1 is particularly devised. FIG. 64 shows a configuration thereof. In FIG. 64, as compared with FIG. 24, the control circuit 2 prepares control signals C4 and C5 to control the core circuit 1.

Figure 65:
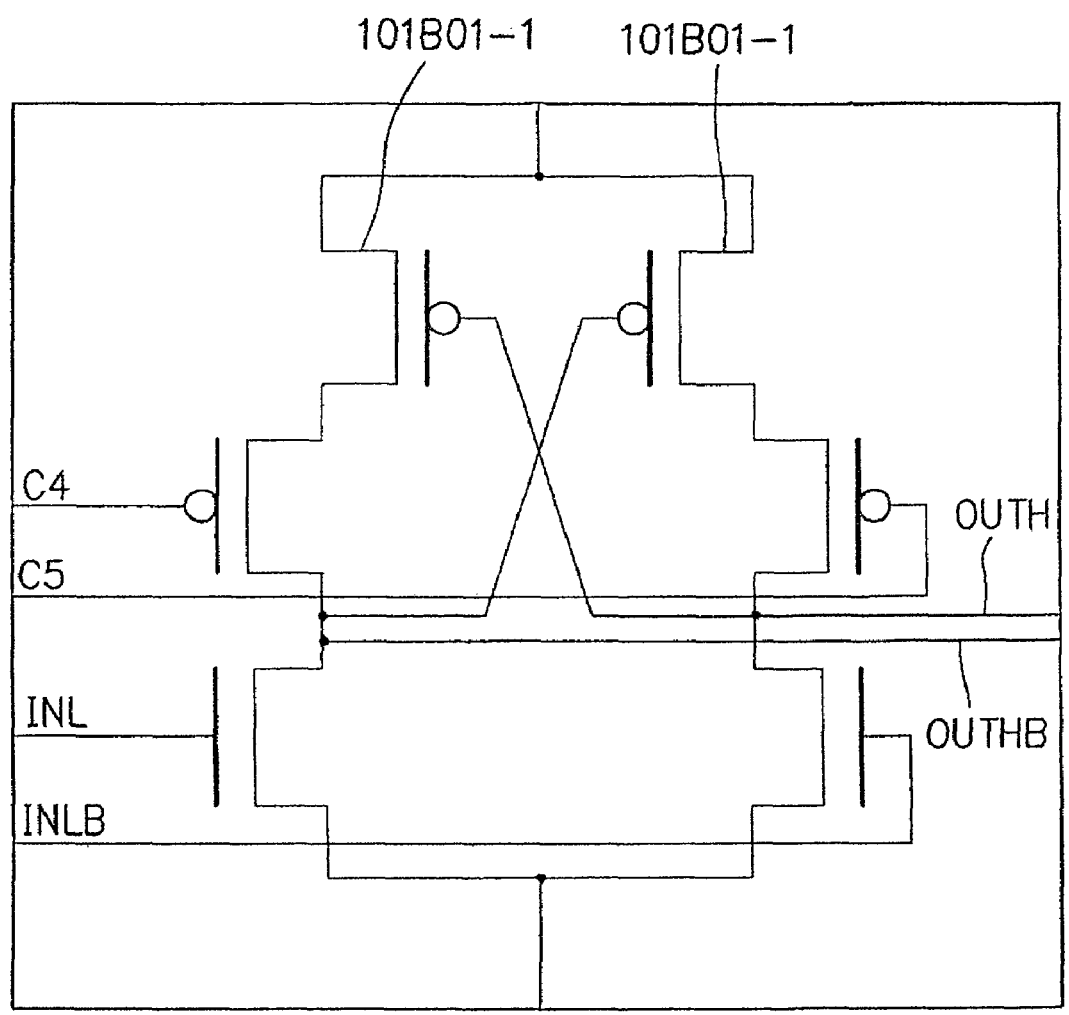

The level shift core circuit adopted in the level converter of FIG. 64 is configured, as shown in FIG. 65, as below. That is, when the embodiment adopts FIG. 18 or 19 showing a configuration example of the level shift core circuit 10, the configuration is modified such that the control signals C4 and C5 from the control circuit 2 control gate terminals of two p-MOS switches including drain terminals connected to outputs.

Figure 66:
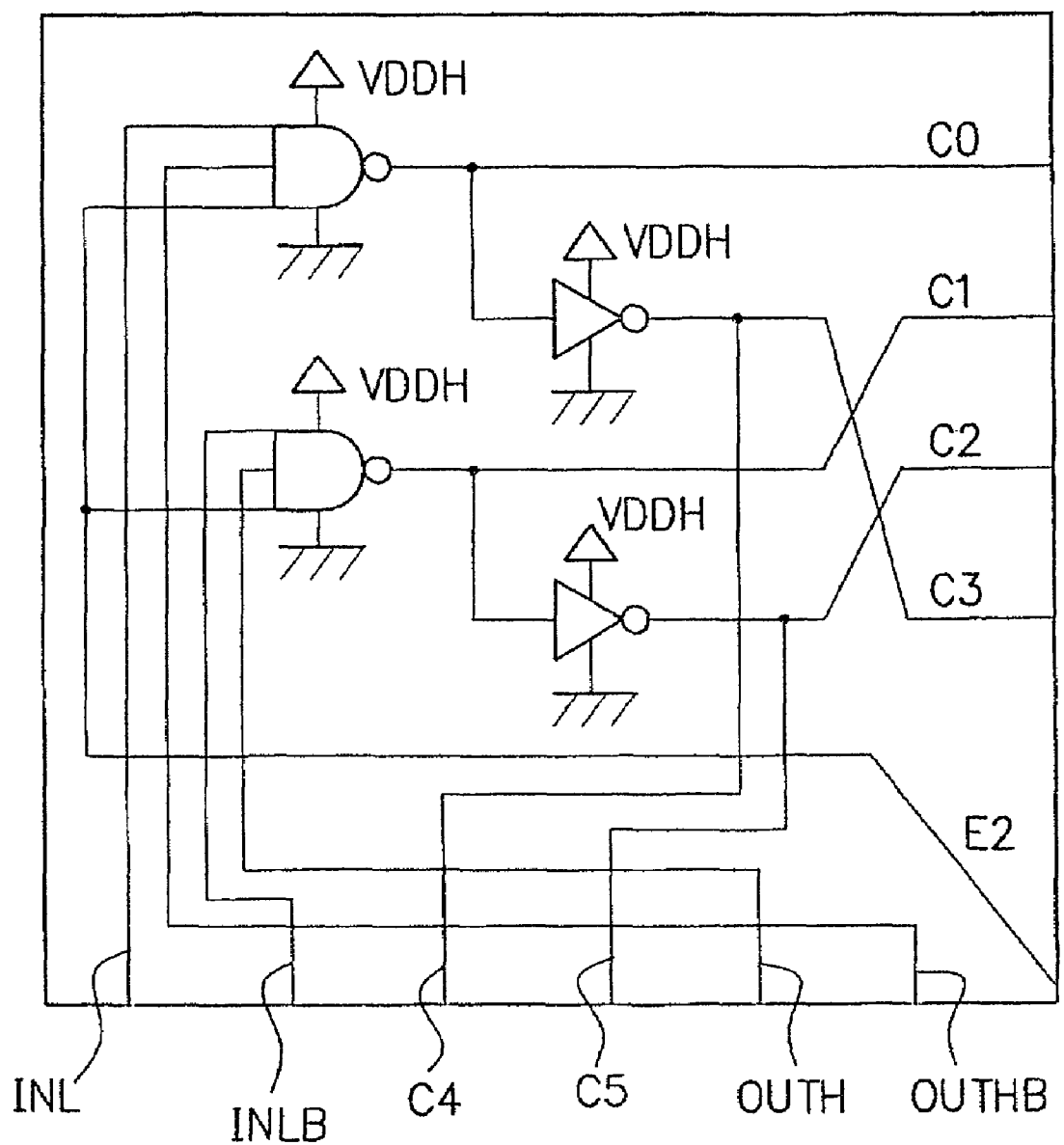

In addition, FIG. 66 shows another embodiment of the level shifter. The control circuit 2 used in FIG. 66 is configured, as shown in FIG. 64, as below. That is, as compared with the circuit shown in FIG. 25, the configuration produces C4 and C5 in addition to C3 and C2. For the configuration of the pull-up/pull-down circuit 3 which can be used in the embodiment, there can be employed, for example, FIG. 26; furthermore, in place of the pull-up/pull-down circuit, the pull-up/pull-down circuit shown in one of FIGS. 29 to 31 can be adopted. Operation thereof is similar to that of the cases described above.

Figure 67:
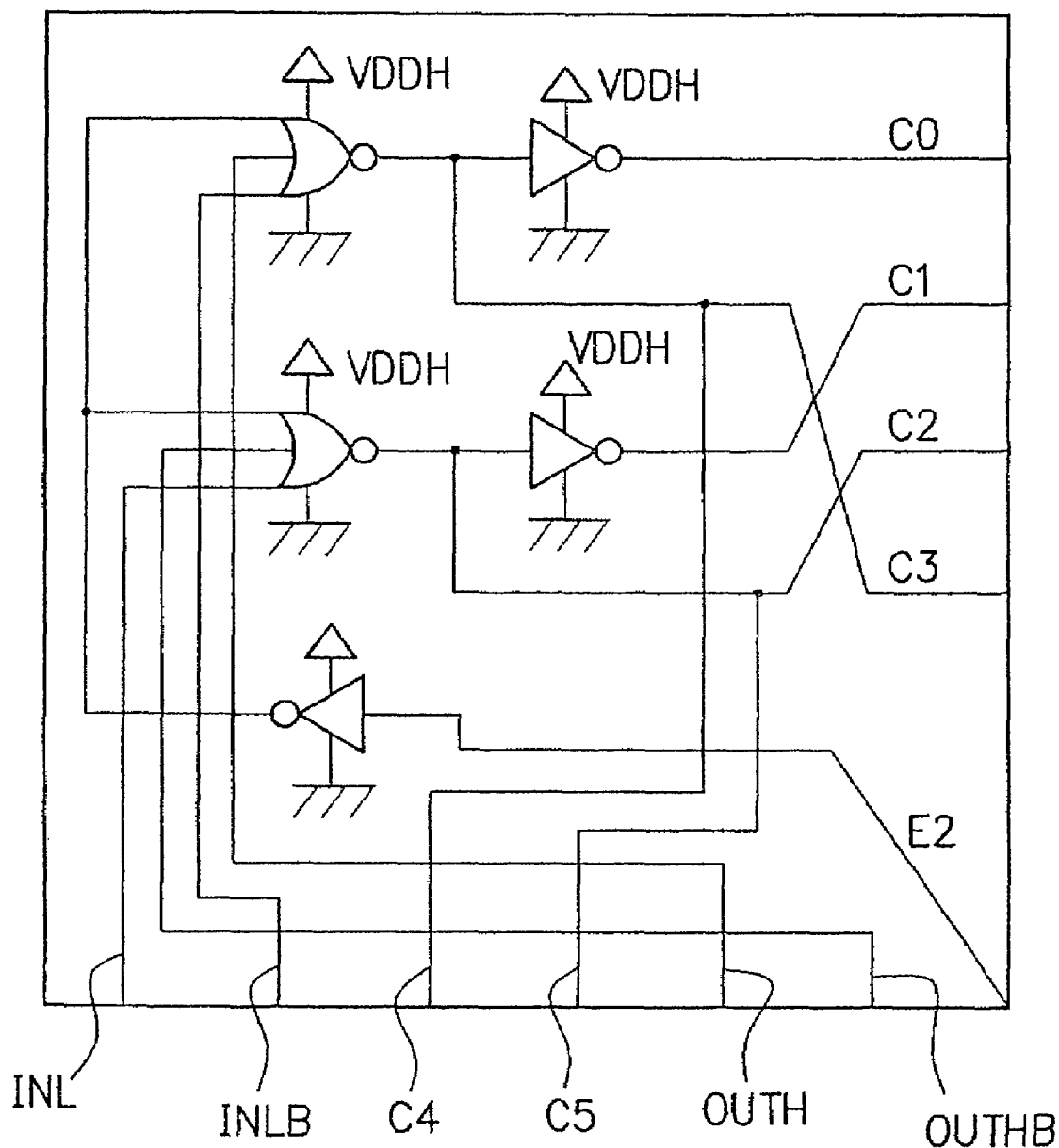
Figure 68:
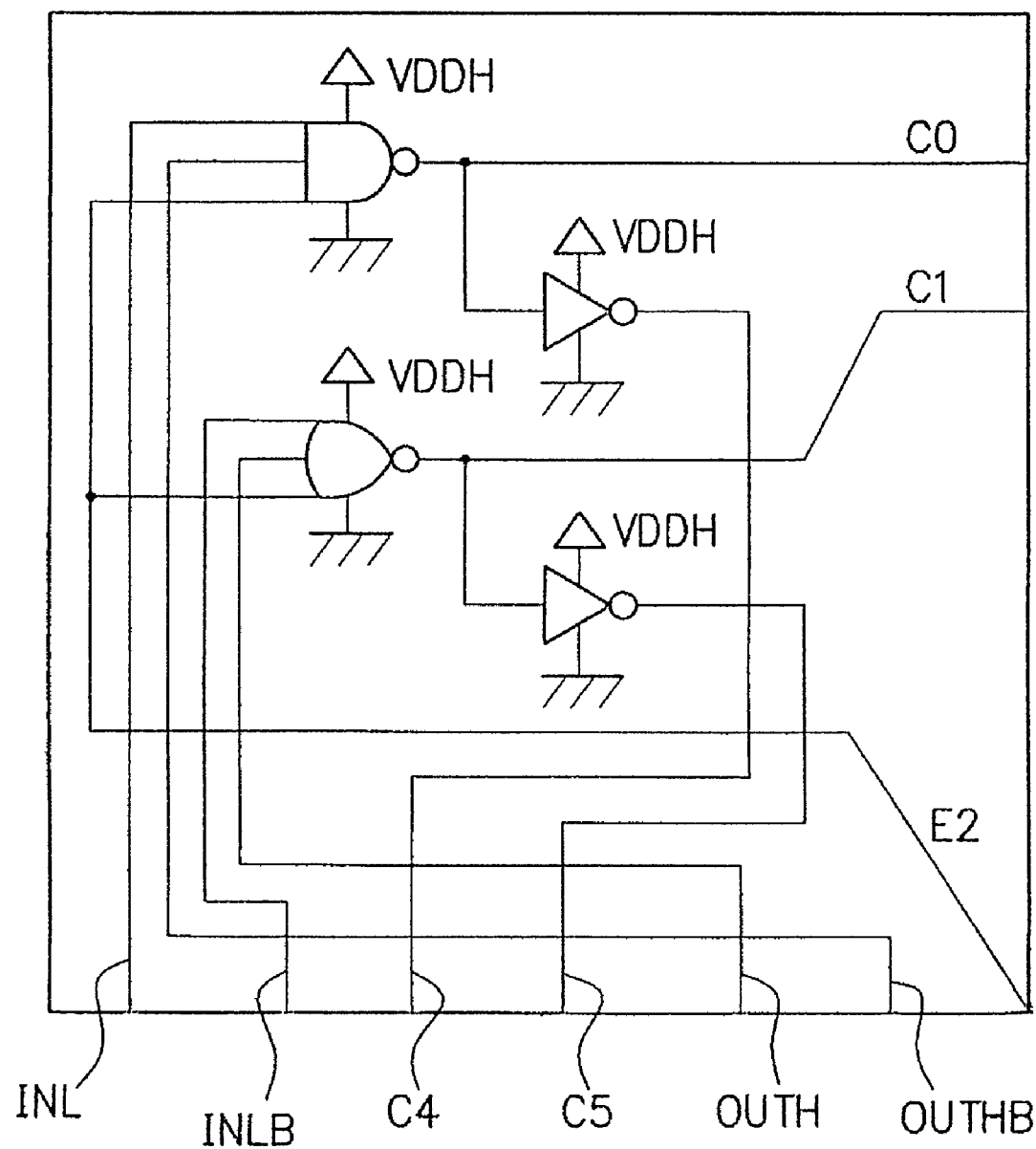
Figure 69:
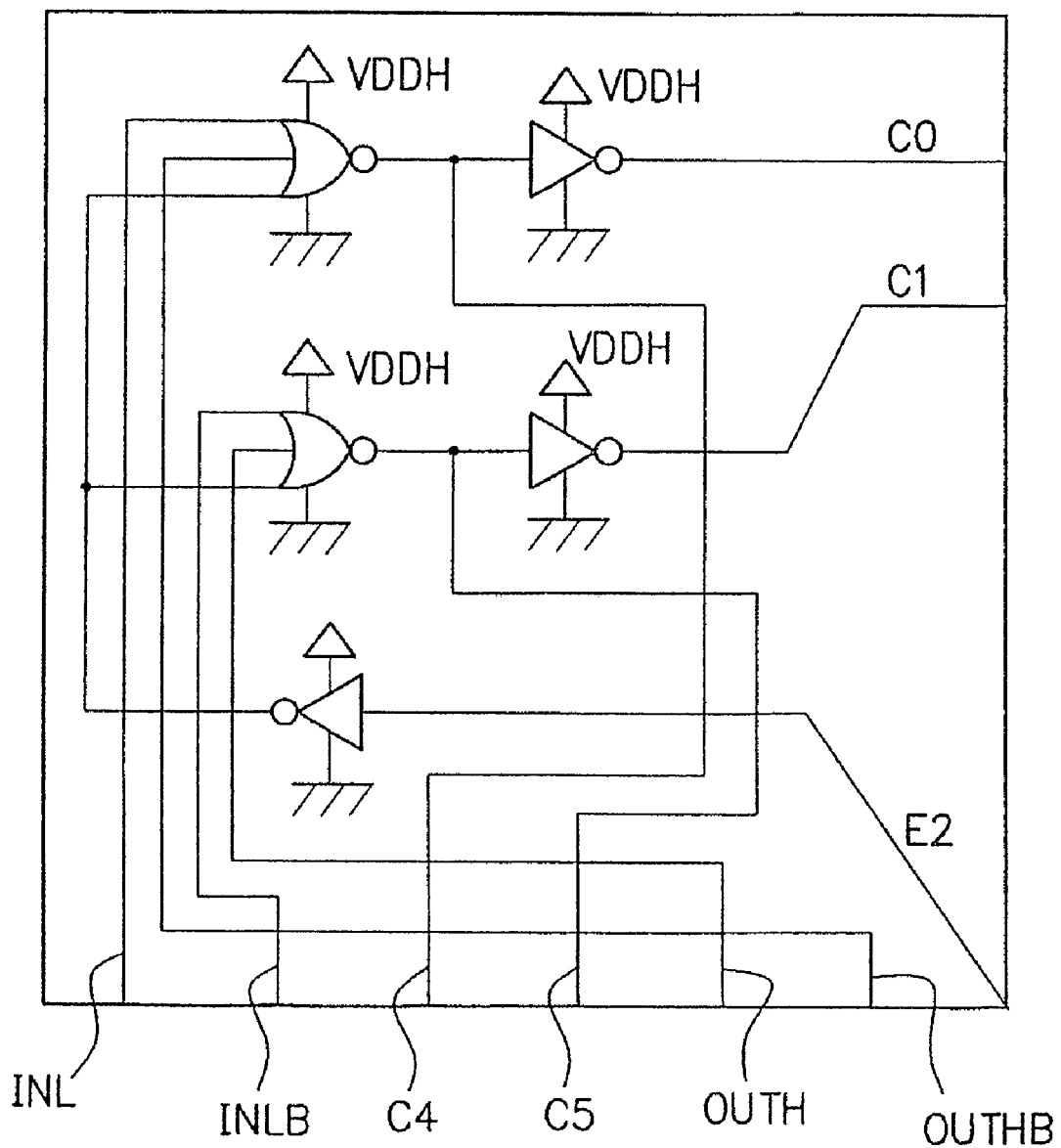
Figure 70:
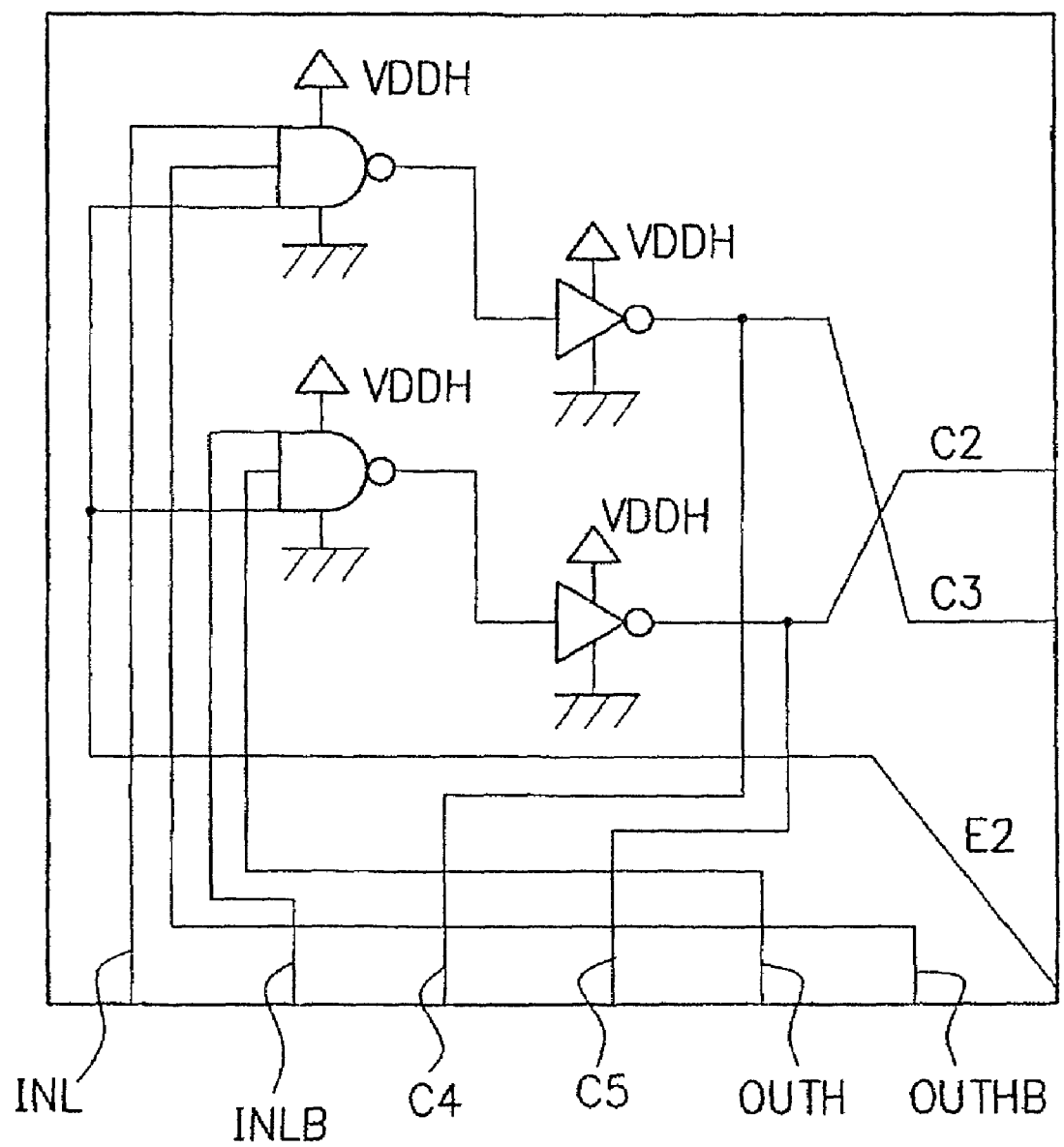
Figure 71:
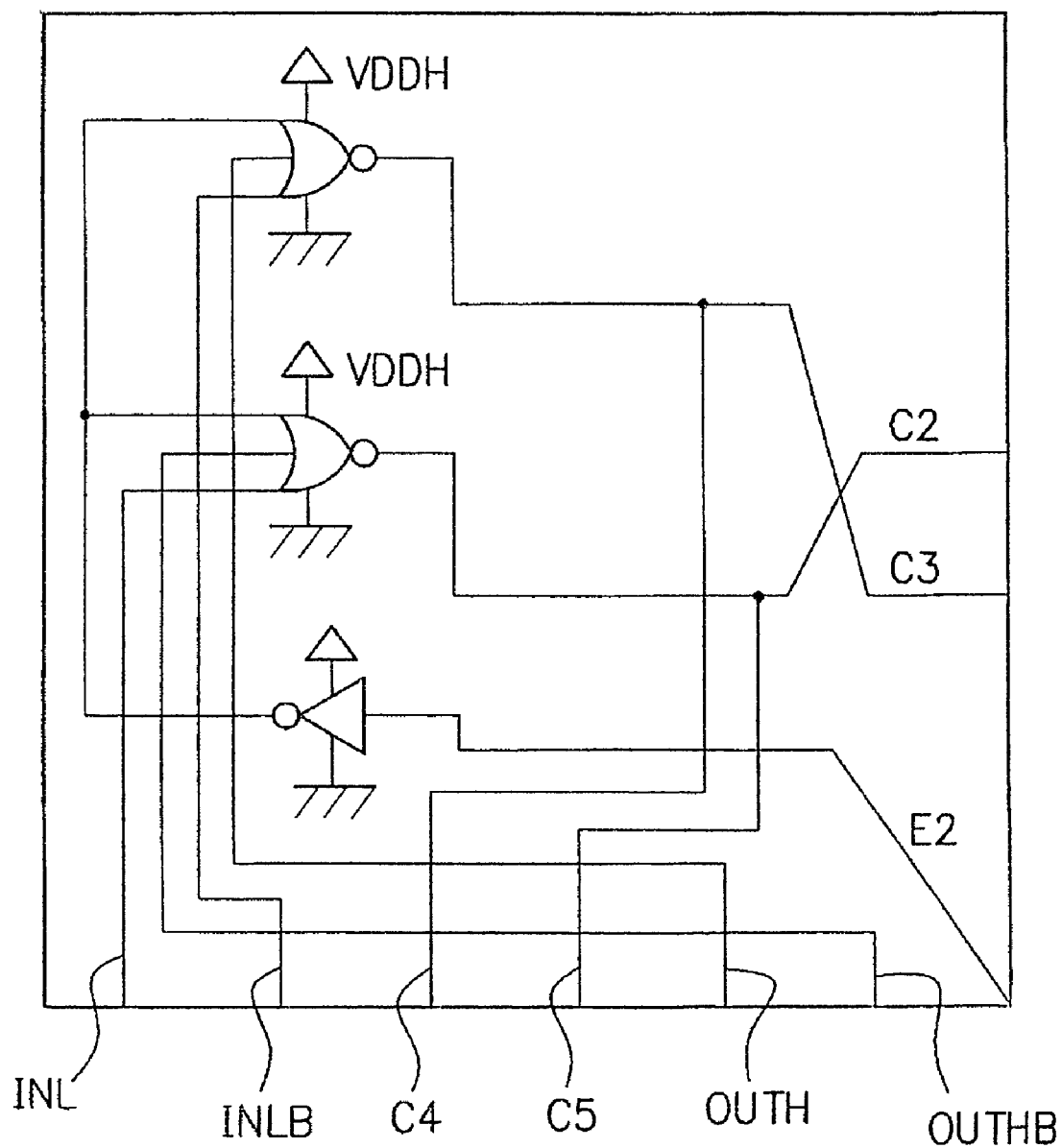
Figure 72:
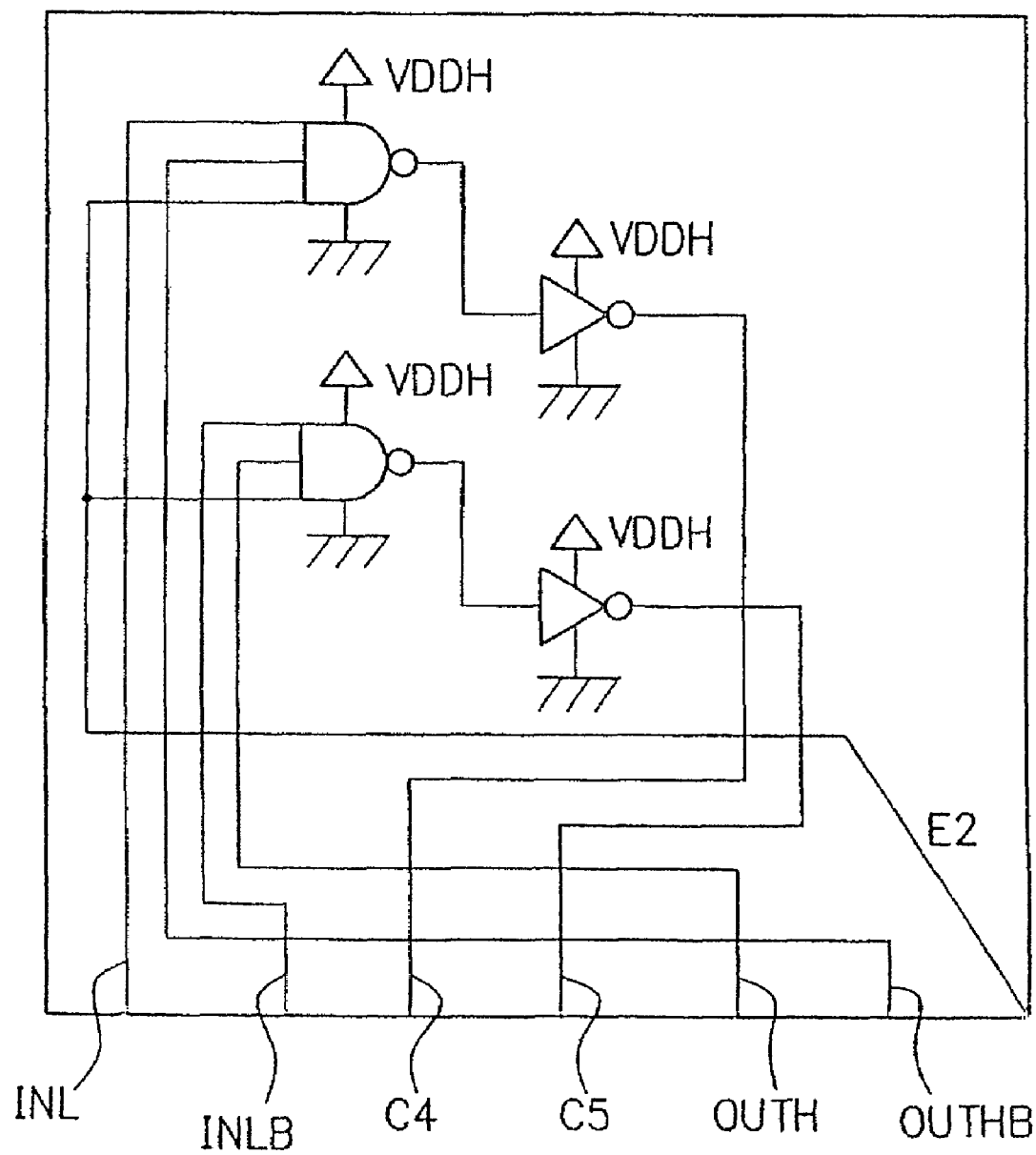
Figure 73:
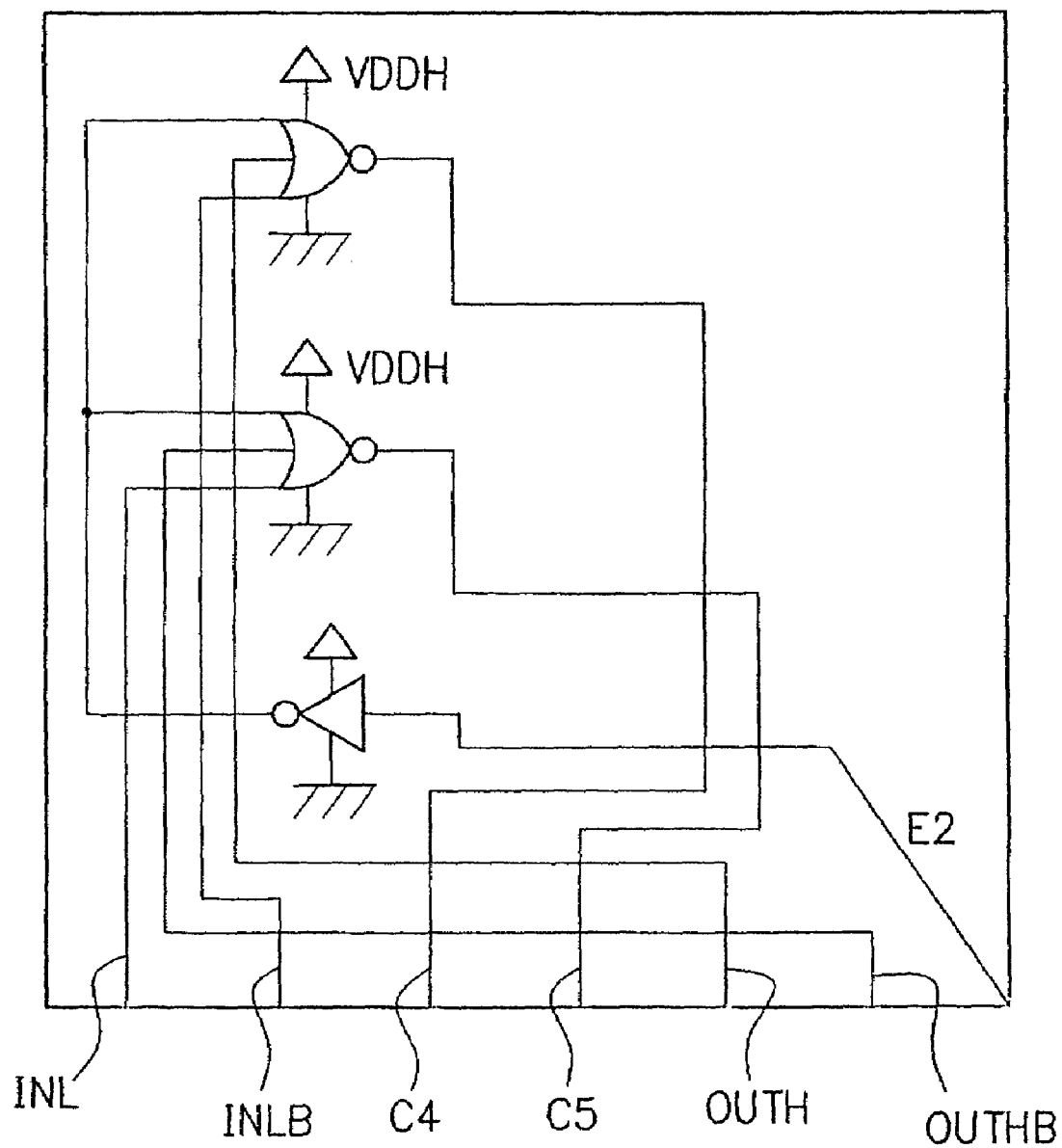

The control circuit 2 used in the embodiment may also be replaced by, in place of the control circuit 2 shown in FIG. 66, the circuit shown in FIG. 67. Also, to achieve only the pull-up function at level shift, the control circuit 2 can be replaced by, in place of the control circuit shown in FIG. 66, the circuit configuration shown in FIG. 68 or 69. Furthermore, to achieve only the pull-down 3-2 function at level shift, the control circuit 2 can be replaced by, in place of the control circuit shown in FIG. 66, the circuit configuration shown in FIG. 70 or 71. Additionally, when neither the pull-up function nor the pull-down 3-2 function is employed, the control circuit 2 can be replaced by, in place of the control circuit shown in FIG. 66, the circuit configuration shown in FIG. 72 or 73. To achieve the pull-up function when these control circuits are adopted, it is possible to utilize FIGS. 33 and 34 or FIGS. 35 and 36 (also including the pull-down function). In this regard, although these pull-up and/or pull-down circuits receive the control signals C0 and C1 as inputs thereto, when the signals are replaced by C2 and C3, any one of the pull-up and/or pull-down circuits of FIGS. 39 to 42 can be used. Besides, operations of the control circuit 2 and the pull-up and/or pull-down circuit 3 are similar to those of the embodiments described above; the level shifter may also be configured (modified) including any combination other than those above of the control circuit and the pull-up and/or pull-down circuit, which is also included in the present invention. In short, according to the embodiment, excepting the restriction to produce the control signals C4 and C5, no restriction exists for the other control signals to be produced, and the control signals can be freely selected; in a case in which the C0 to C5 signals (C0 to C3 signals as the other control signals) are selected as such other control signals like in FIG. 66 as shown in, for example, FIG. 67, there can be considered an example of the control circuit in which an NOR circuit is adopted in place of the NAND circuit of FIG. 66. Moreover, FIG. 68 shows an example of the control circuit which selects the C0 and C1 signals as the other control signals to select the NAND circuit. Like FIG. 68, FIG. 69 shows an example of the control circuit which selects the C0 and C1 signals as the other control signals to select the NOR circuit. Next, FIG. 70 shows an example of the control circuit which selects the C2 and C3 signals as the other control signals to select the NAND circuit, and FIG. 71 shows an example of the control circuit which selects the C2 and C3 signals as the other control signals to select the NOR circuit. Additionally, FIG. 72 shows an example of the control circuit including a NAND circuit configuration which does not produce the other control signals and which produces only the C4 and C5 signals as the control signals; FIG. 73 shows the control circuit including a NOR configuration.

In an operation example of the fifth embodiment described above, in a case in which INL is Low, INLB is High, OUTH is Low, and OUTHB is High, when the INL signal produced from the first logic circuit becomes High (INLB is Low), the control circuit 2 receives the INL signal as an input thereto and then produces a C0 signal and the like. The C0 signal thus produced is Low and then the p-MOS in the pull-up and/or pull-down circuit 3 connected to OUTH turns on to pull up OUTH; at the same time, the control circuit 2 produces C3 of High. As a result, the n-MOS connected to OUTHB in the pull-up and/or pull-down circuit 3 turns on to pull down OUTHB; the control circuit 2 produces C4 of High to turn a p-MOS switch in the pull-up and/or pull-down circuit 3 connected to OUTHB off to suppress the pull-up of OUTHB; at the same time, when OUTHB is reduced to Low by an operation of the level shift core circuit 1, the control circuit 2 produces C0 of High to turn the n-MOS in the pull-up and/or pull-down circuit 3 to finish the pull-up, and the control circuit p2 produces C3 of Low to turn the n-MOS in the pull-up and/or pull-down circuit 3 off to finish the pull-down; the control circuit 2 produces C4 of Low to turn the p-MOS switch in the pull-up and/or pull-down circuit 3 on. Resultantly, INL is High, INLB is Low, OUTH is High, and OUTHB is Low.

Next, when an external first logic circuit 4 sets INLB to High (INL is Low), this signal is fed to the controller 2 and the controller 2 produces C1 of Low to turn on the p-MOS in the pull-up and/or pull-down circuit 3 connected to OUTHB to pull up OUTHB; moreover, the controller 2 produces C2 of High to turn on the n-MOS in the pull-up and/or pull-down circuit 3 connected to OUTH to pull down OUTH; the controller 2 produces C5 of High to turn on the p-MOS in the pull-up and/or pull-down circuit 3 connected to OUTH to suppress the pull-up of OUTH; at the same time, when OUTH is reduced to Low by an operation of the level shift core circuit 1, the control circuit 2 produces C1 of High to turn the p-MOS in the pull-up and/or pull-down circuit 3 off to finish the pull-up; furthermore, the control circuit 2 produces C2 of Low to turn the n-MOS in the pull-up and/or pull-down circuit 3 off to finish the pull-down; the control circuit 2 produces C5 of Low to turn the p-MOS switch in the pull-up and/or pull-down circuit 3 on. As a result, INL is Low, INLB is High, OUTH is Low, and OUTHB is High. In this connection, description has been given of a case in which the configuration shown in FIG. 7 described above is adopted for the n-MOS (transistor) and the p-MOS (transistor) of the pull-up and/or pull-down circuit 3. However, in a case in which the n-MOS is replaced by the p-MOS and/or the p-MOS is replaced by the n-MOS, the operation is conducted by changing the connection between the OUTH signal and the OUTHB signal and by interpreting also the description of the operation according to the change.

SIXTH EMBODIMENT

Figure 74:
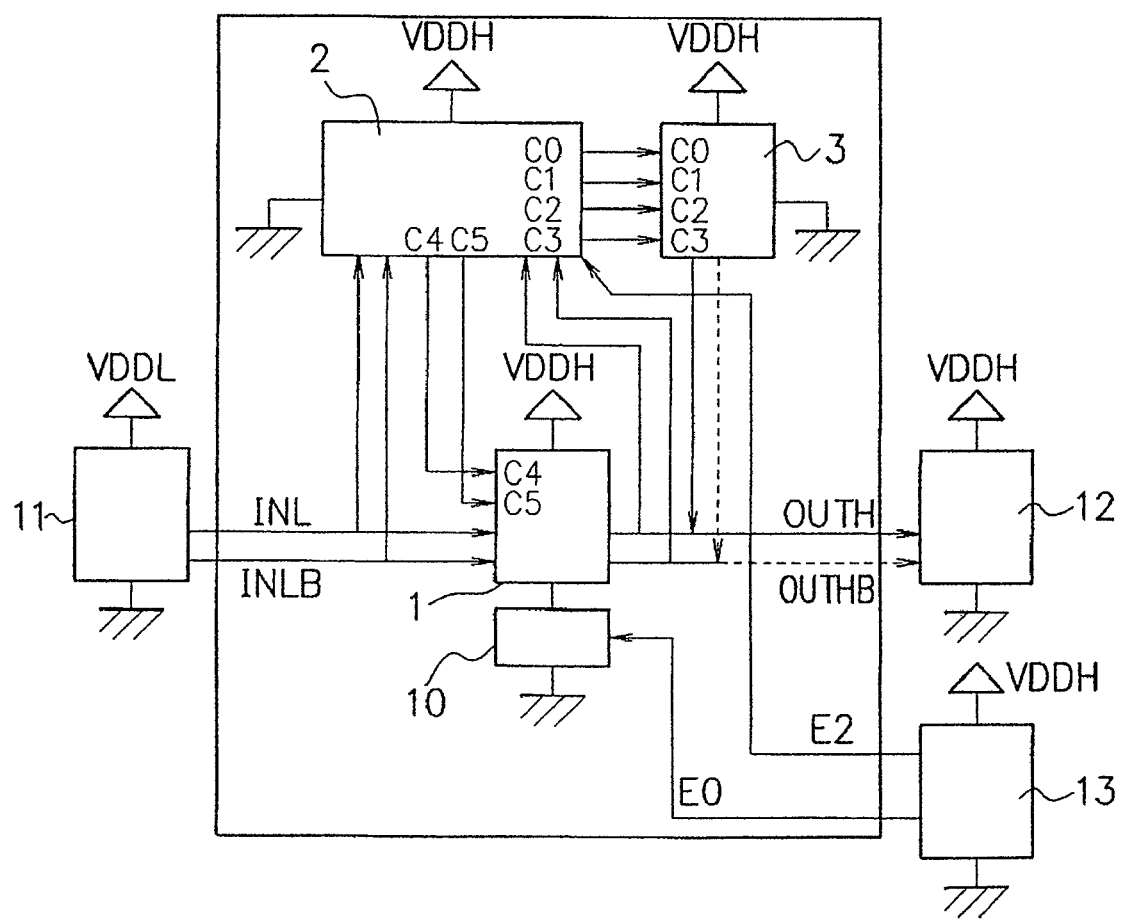
FIG. 74 is a diagram showing a configuration example of a sixth embodiment of a level shifter of the present invention.
Figure 75:
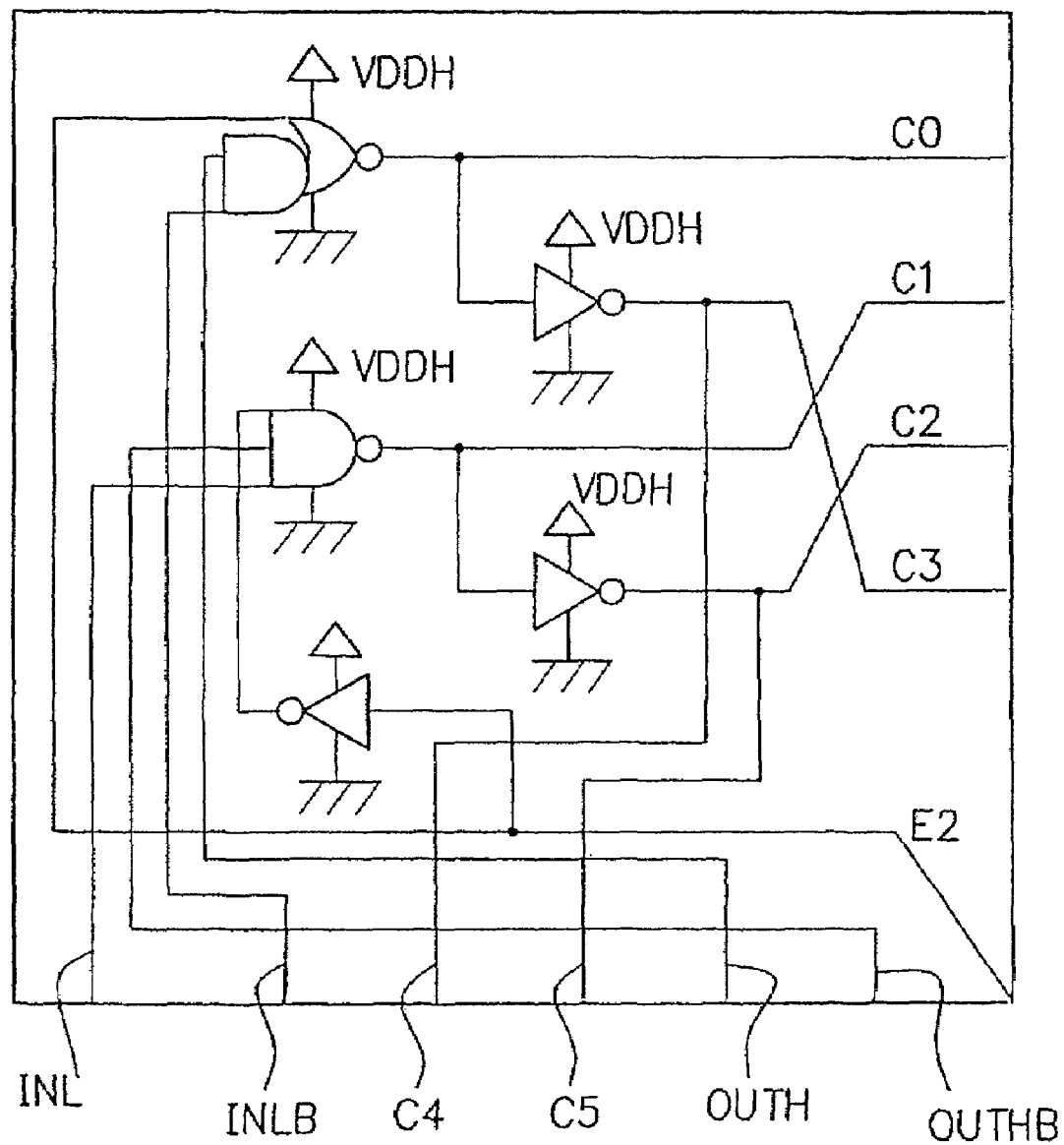

In the sixth embodiment of the present invention, the idea or the device of FIG. 47 is applied to FIG. 64. FIG. 74 shows a configuration concretely representing the idea. In this diagram, the control circuit 2 shown in FIG. 75 is devised as below. That is, the embodiment does not require E1 controlling the pull-up/pull-down circuit 3 and simplifies the pull-up/pull-down circuit 3.

As shown in FIG. 75, the control circuit 2 used in the level shifter according to FIG. 74 is configured as below. That is, as compared with FIG. 48, there are produced C4 and C5 in addition to C3 and C2. As the pull-up/pull-down circuit 3 adopted in FIG. 74 may be similar to that used in the level converter circuit of the fourth embodiment shown in FIG. 47.

Figure 76:
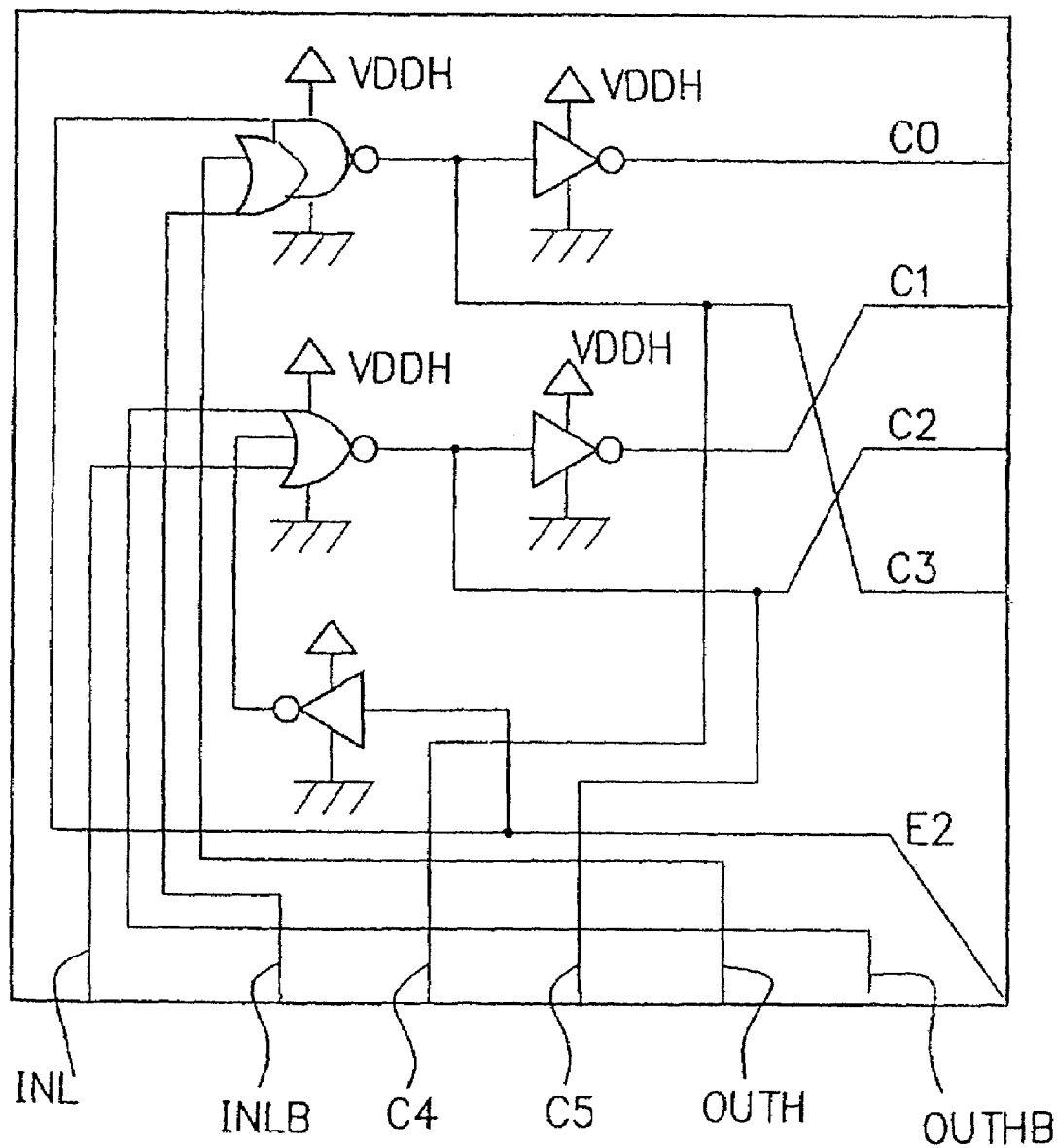
Figure 77:
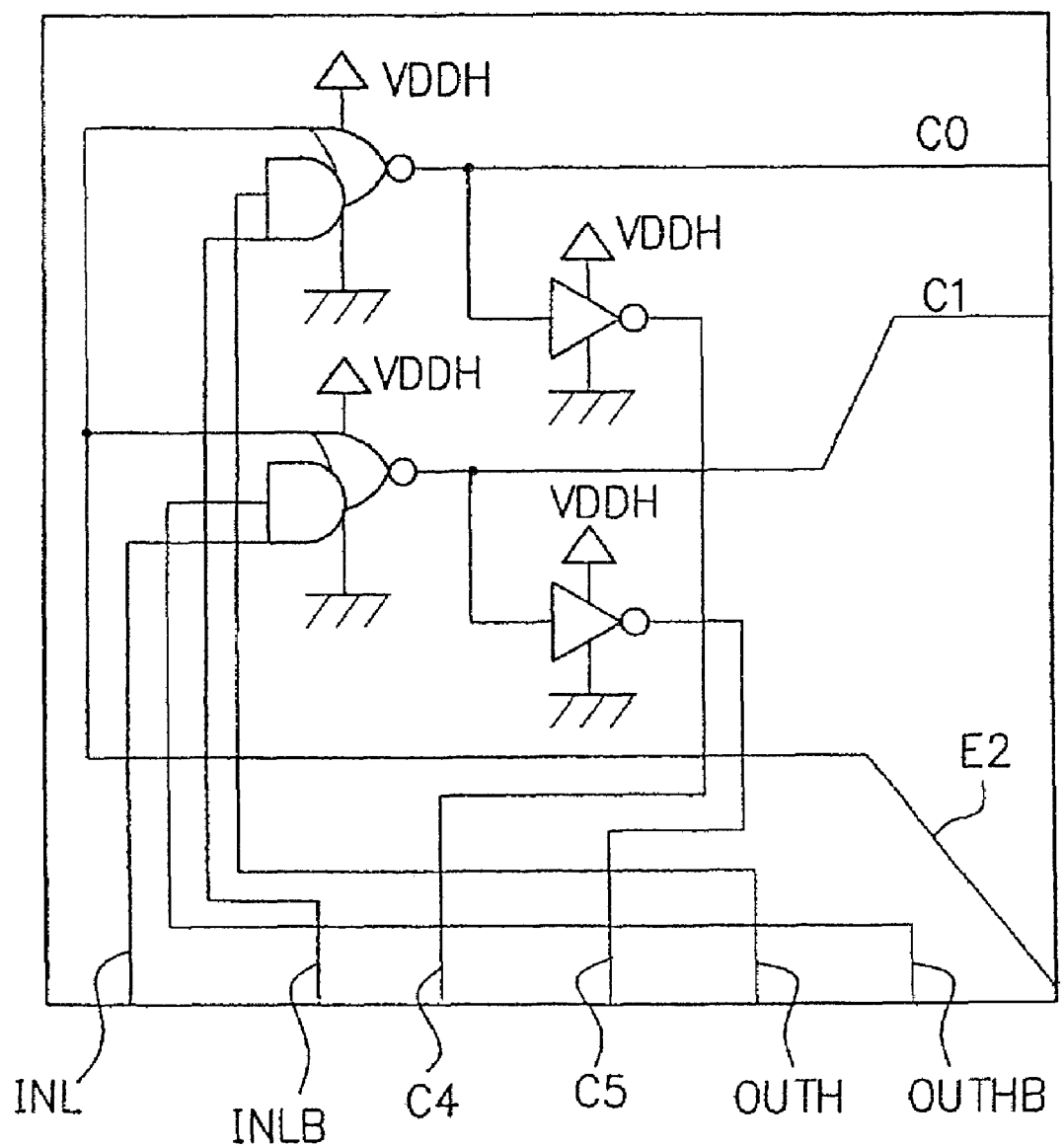
Figure 78:
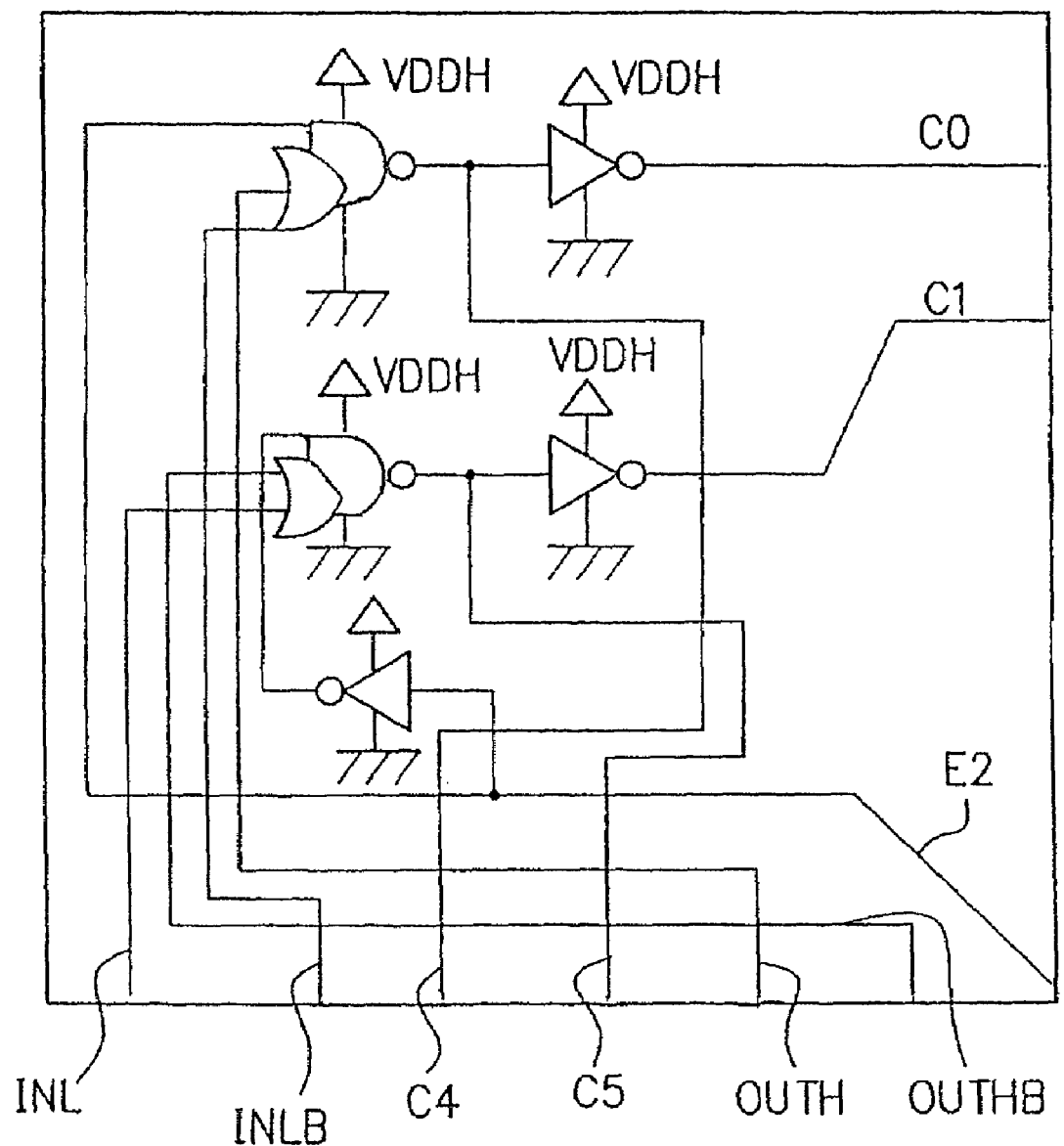
Figure 81:
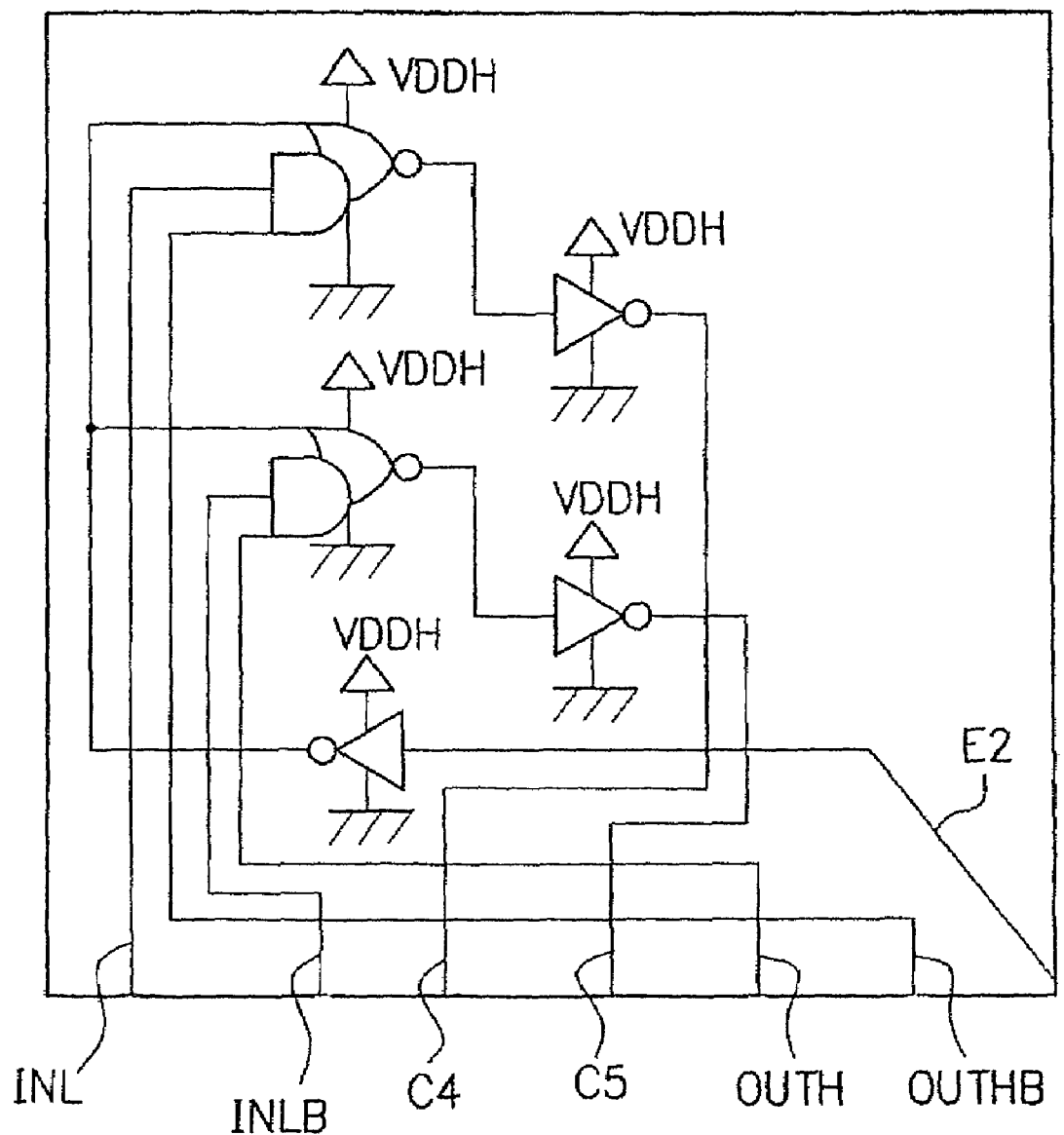
Figure 82:
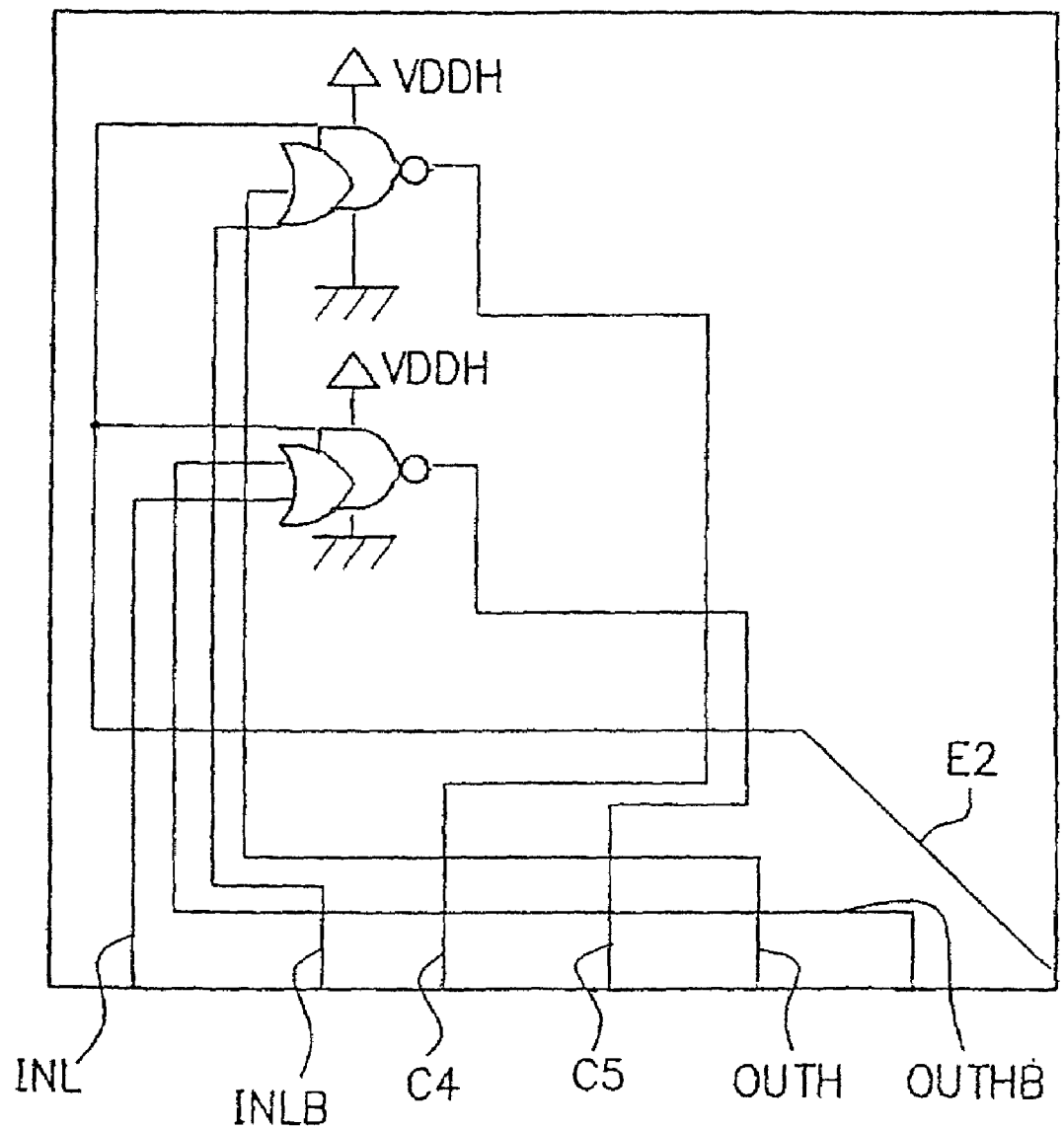

The control circuit 2 shown in FIG. 75 and used in the embodiment may be replaced by the control circuit 2 shown in FIG. 76. Furthermore, when only the pull-up (3-1) function is achieved at level shift, the control circuit 2 can be replaced with FIG. 77 or 78; additionally, when only the pull-down (3-2) function is achieved at level shift, the control circuit 2 can be replaced with FIG. 79 or 80; also, when neither the pull-up function nor the pull-down function is used at level shift, the control circuit 2 can be replaced with FIG. 81 or 82.

Operation of the embodiment is similar to that of the operation of the embodiments described above.

SEVENTH EMBODIMENT

Figure 79:
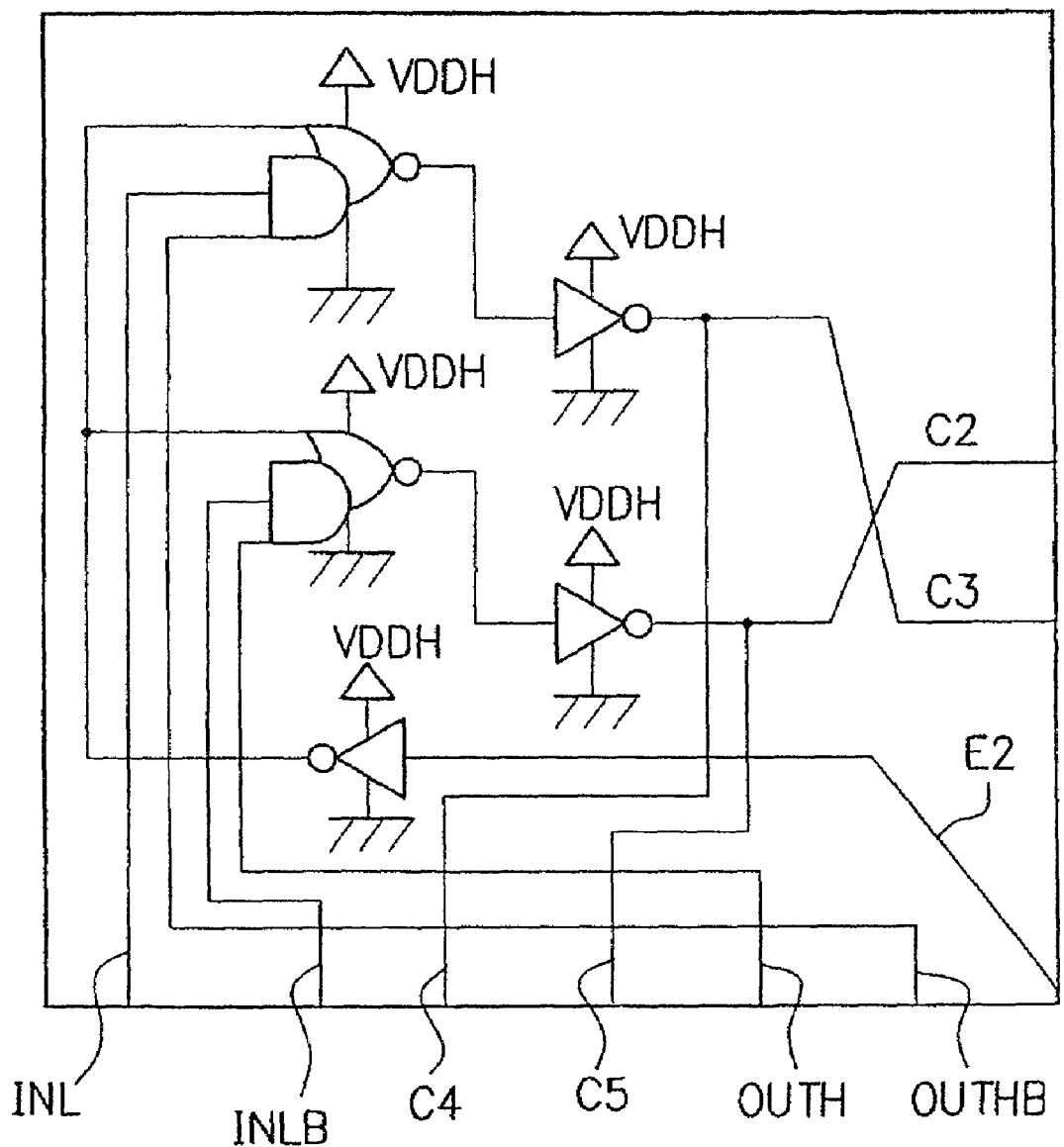
Figure 80:
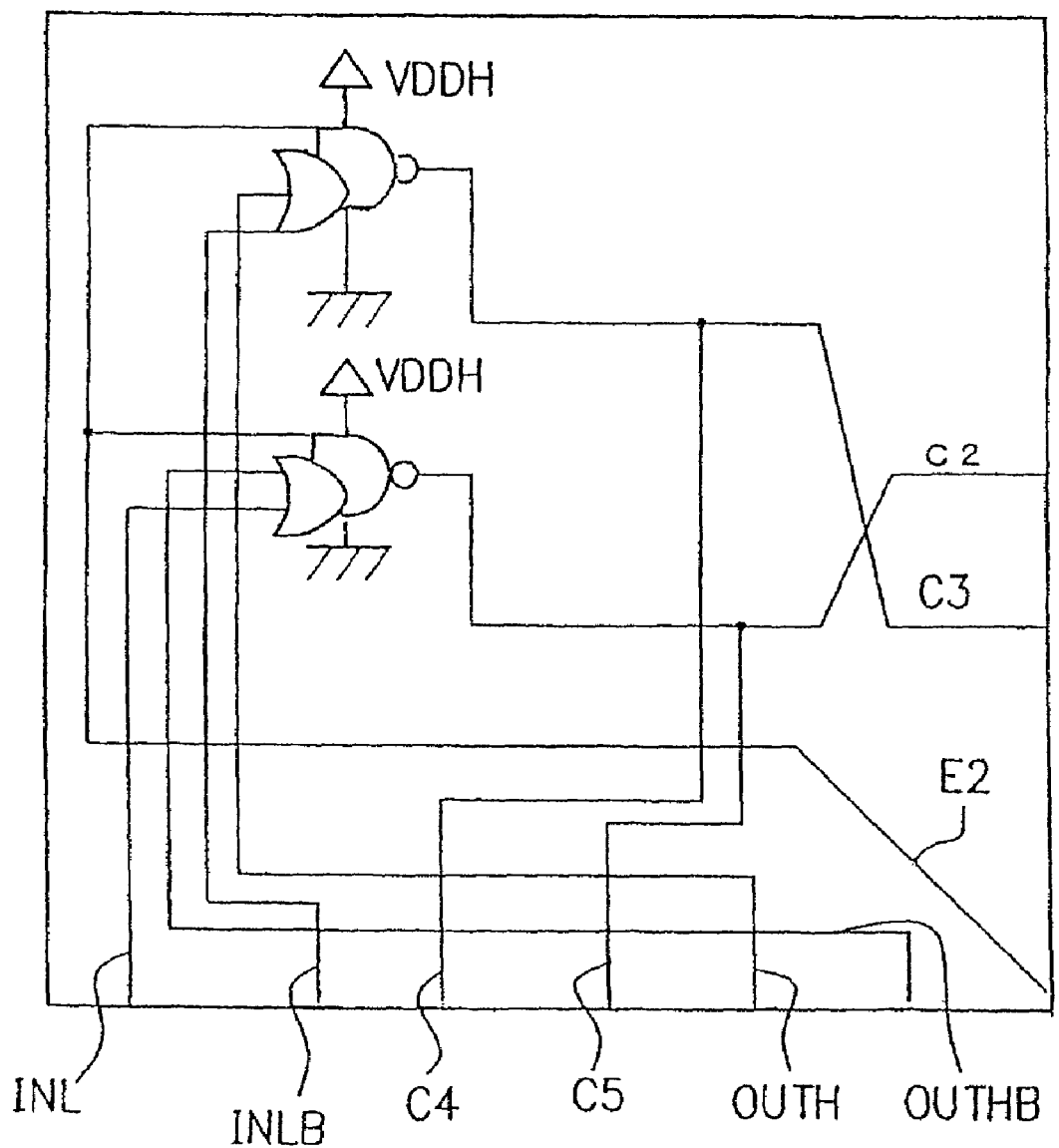
Figure 83:
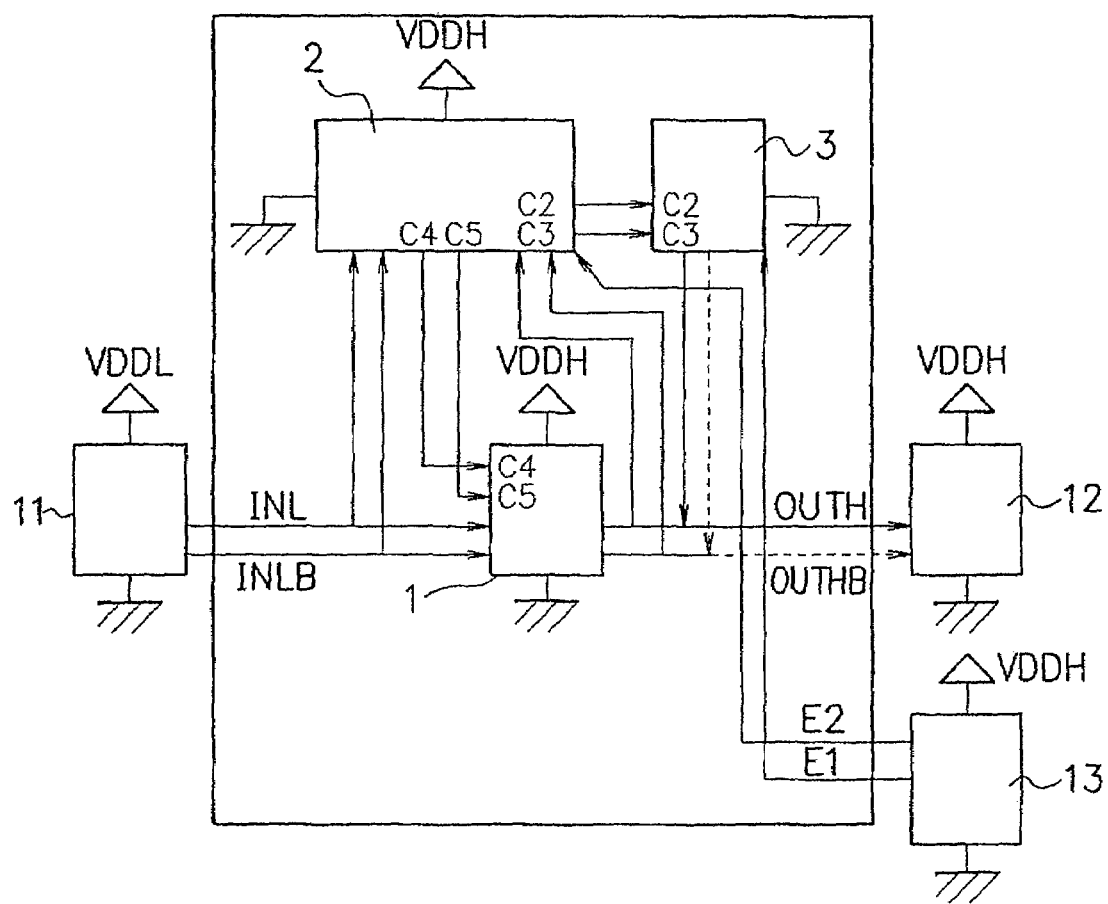
FIG. 83 is a diagram showing a configuration example of a seventh embodiment of a level shifter of the present invention.
Figure 84:
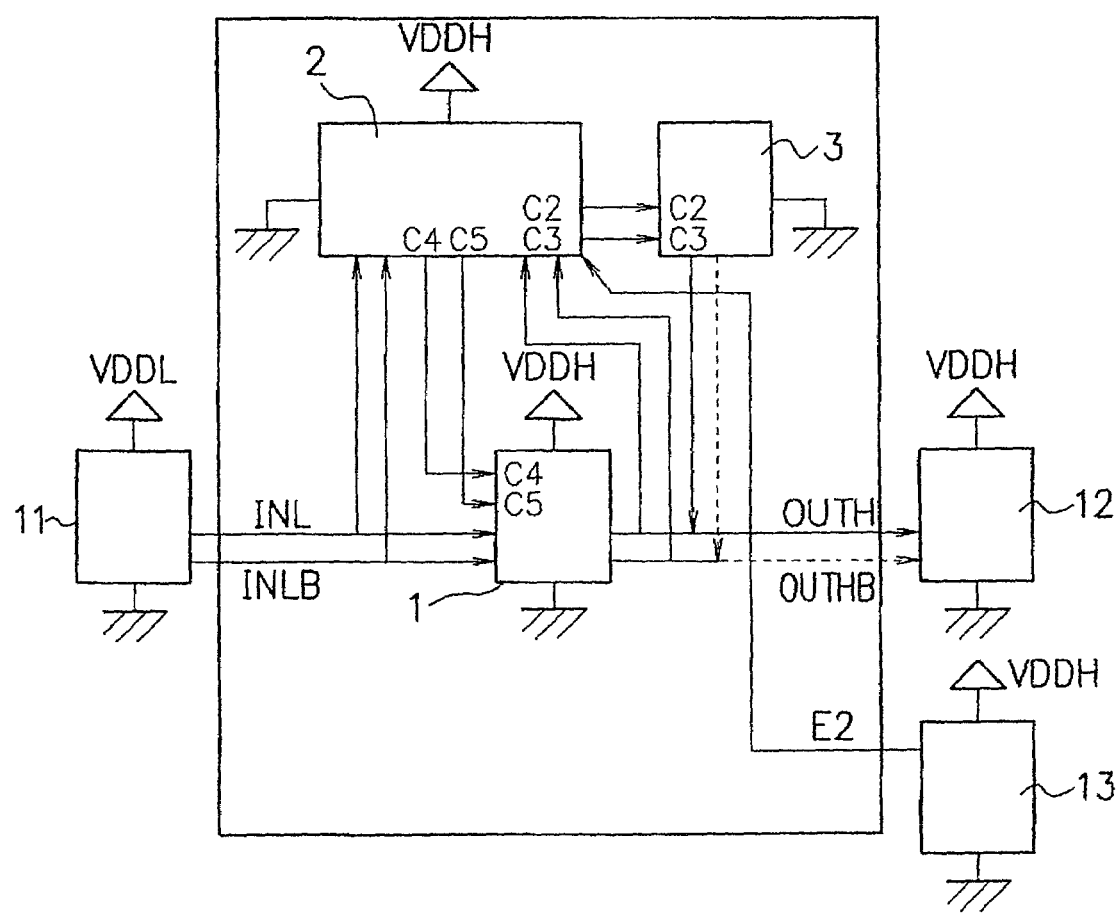
FIG. 84 is a diagram showing another configuration example of the seventh embodiment of a level shifter of the present invention.
Figure 85:
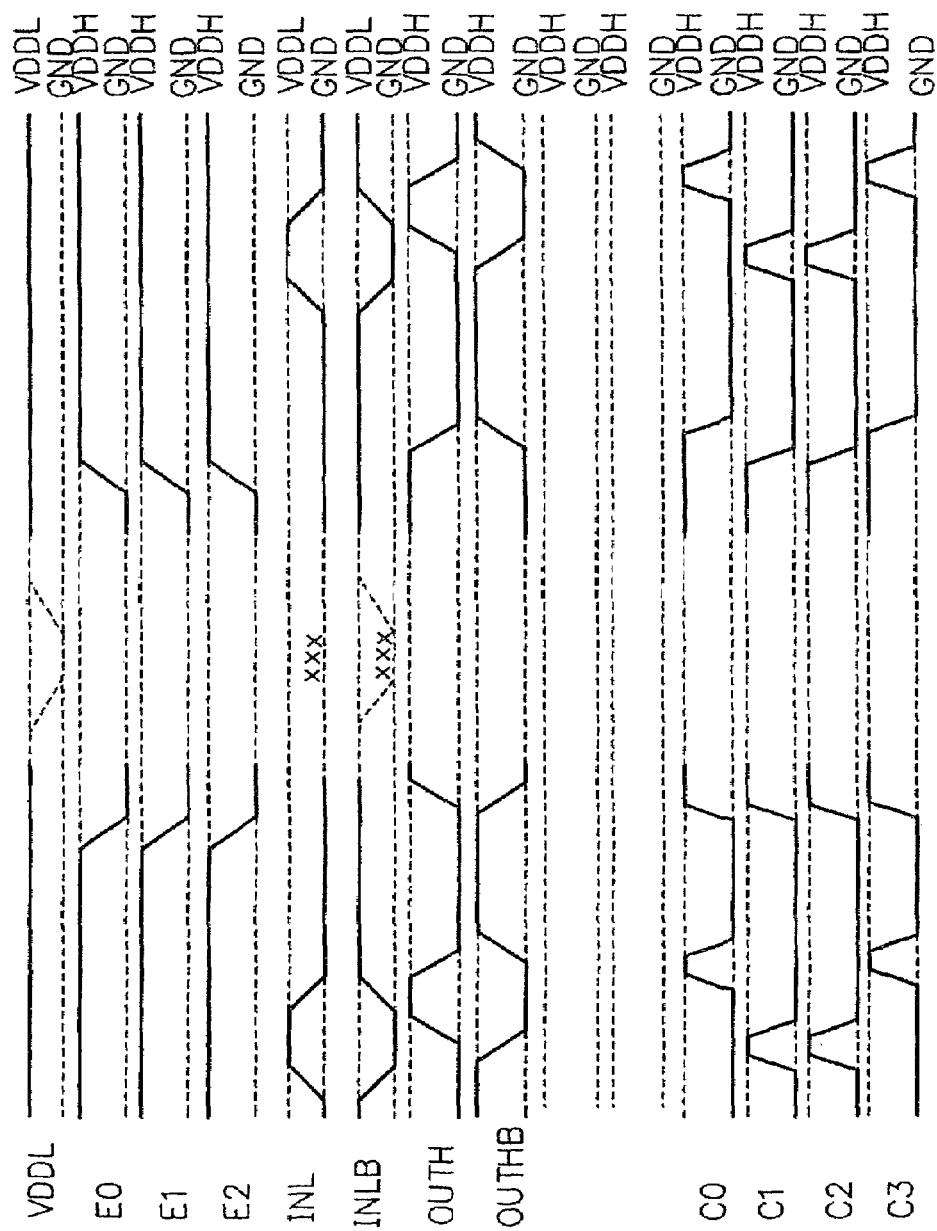
FIG. 85 is a timing chart showing an operation example of the level shifter of the seventh embodiment.

As shown in FIGS. 83 and 84, in the seventh embodiment of the present invention, the control circuit 2 is devised as compared with FIGS. 64 and 74. FIGS. 79 and 80 show configurations thereof. In these diagrams, when the pull-up/pull-down circuit 3 achieves only the pull-down (3-2) function, the switching circuit is not required. As an example of the control circuit, a circuit similar to that of FIG. 79 or 80 may be used; as shown in FIG. 85, a timing example of the level shifter of FIG. 85 is represented as below.

That is, when E2 is Low, C4 and C5 are at a High level, and the p-MOS of the level shift core circuit 1 including a gate terminal connected thereto functions as a switch disposed on the power source side to turn these signals off. Through this operation, resultantly, the power source GND short circuit current path can be prevented regardless of the level shift input.

Moreover, in the embodiment described above, it is assumed that the control signal outputs (E0, E1, E2) from the third logic circuit 13 are set to Low when the first power source is turned off; however, the control circuit and the pull-up/pull-down circuit 3 can also be respectively simplified by appropriately using inverted signals. In the diagrams used to described the embodiments, p-MOS (transistor) has a circle (○) on the gate section. Incidentally, the present invention is not restricted by the embodiments, and the embodiments can be appropriately modified within a scope of the technical idea of the present invention, and those modified embodiments are also included in the invention of this application. Additionally, E0, E1, and E2 can be collectively used as one signal when they have common timing. Moreover, in the timing charts of FIGS. 10, 28, etc., the section indicated by X represents an indefinite state.

INDUSTRIAL APPLICABILITY

As described above, in accordance with the present invention, short circuit current and the delay increase can be suppressed on the basis of a fundamental configuration of a level shifter for converting a signal level of a first logic circuit to which a first power source is supplied into a signal level of a second logic circuit to which a second power source is supplied, characterized by including a switching circuit between a GND power source terminal (ground power source terminal) of a level shift core circuit and a GND power source (ground power source), the switching circuit being controlled by a third logic circuit which generates a control signal under control of the first power source, and a pull-up and/or pull-down circuit at an output of the level shift core circuit, the pull-up and/or pull-down circuit being controlled by the third logic circuit. In this connection, as the basic configurations of the level shift core circuit 1, the switching circuit 10, the control circuit 2, and the pull-up and/or pull-down circuit 3, those described above can be adopted; however, these may be used such that two or more circuits are connected in parallel in a circuit configuration; for example, it is also possible that two or more level shift core circuits or the like are connected in parallel to be utilized as a level shift core circuit.

The invention claimed is:

1. A level converting circuit for converting a signal level of a first logic circuit to which a first power source is supplied into a signal level of a second logic circuit to which a second power source is supplied, comprising:
   a pull-down circuit at a level conversion output of a level conversion core circuit;
   a control circuit to which the second power source is supplied and which receives as inputs thereto a level conversion input signal, and the level conversion output signal of the level conversion core circuit to produce control signals for the pull-down circuit and the level conversion core circuit; and
   a third logic circuit which generates control signals in accordance with control of the first power source,
   wherein the pull-down circuit and the control circuit are connected to respective control signals from the third logic circuit.

2. A level converting circuit in accordance with claim 1, wherein
   the control circuit comprises:
      a first OR-NAND circuit to which the second power source is supplied and which receives as inputs thereto an inverted signal of the level conversion input signal, a positively inverted signal of the level conversion output signal, and a control circuit control signal of the third logic circuit; and
      a second OR-NAND circuit to which the second power source is supplied and which receives as inputs thereto a positively inverted signal of the level conversion input signal, an inverted signal of the level conversion output signal, and the control signal of the third logic circuit,
   wherein each output signal from the first and second OR-NAND circuits is produced as pull-down control signal,
   each output signal from the first and second OR-NAND circuits is produced as control signals of the level conversion core circuit, and
   the pull-down circuit comprises at least two n-MOS each of which comprises a source terminal connected to a GND power source, a gate terminal connected to a control signal from the control circuit, and a drain terminal connected to the level conversion output signal.

3. A level converting circuit in accordance with claim 1, wherein:
   the control circuit comprises:
      a first AND-NOR circuit to which the second power source is supplied and which receives as inputs thereto a positively inverted signal of the level conversion input signal, an inverted signal of the level conversion output signal, and either a control signal control output of the third logic circuit or an inverted signal of the control signal of the third logic circuit,
      a second AND-NOR circuit to which the second power source is supplied and which receives as inputs thereto an inverted signal of the level conversion input signal, a positively inverted signal of the level conversion, output, and either the control signal of the third logic circuit or the inverted signal of the control signal, of the third logic circuit and
      at least two inverters to which the second power source is supplied and which respectively receive as inputs thereto outputs from respective AND-NOR circuits, wherein each output signal from the inverters is produced as control signals.

4. A level converting circuit in accordance with claim 1, wherein:
   the control circuit comprises:
      a first OR-NAND circuit to which the second power source is supplied and which receives as inputs thereto an inverted signal of the level conversion input signal, a positively inverted signal of the level conversion output signal, and a control circuit control signal of the third logic circuit, and
      a second OR-NAND circuit to which the second power source is supplied and which receives as inputs thereto a positively inverted signal of the level conversion input signal, an inverted signal of the level conversion output, and the control signal of the third logic circuit,
   wherein each output signal from the OR-NAND circuits is produced as control signals.

5. A level converting circuit in accordance with claim 4, wherein:
   the OR-NAND circuit is of a CMOS circuit configuration, and
   a p-MOS to which the level conversion input signal is connected has either a small ratio of a channel width to channel length, or a threshold value which is of a negative polarity and which is a large absolute value.

6. A level converting circuit in accordance with claim 4, wherein:
   the OR-NAND circuit is of a CMOS circuit configuration, and
   the control signal from the third logic circuit is connected to an n-MOS on a GND power source side.

7. A level converting circuit in accordance with claim 1, wherein:
   the level conversion core circuit comprises:
      a p-MOS cross-coupled latch comprising at least two p-MOS in which each source terminal is connected to the second power sources, and the gate terminal is connected to the level conversion output signal,
      at least two p-MOS switches comprising a source terminal connected to a drain terminal of the p-MOS cross-coupled latch, each gate terminal connected to receive the control signals from the control circuit, and each drain terminal connected to the level conversion output, and a differential n-MOS switch comprising at least two n-MOS each of which includes a source terminal connected to a GND power source, a drain terminal connected to the level conversion output, and a gate terminal connected to the level conversion input.

8. A level converting circuit in accordance with claim 1, wherein:
the third logic circuit controls the control circuit by a control circuit control signal from the third logic circuit, and
the control circuit produces control signals to control the pull-down circuit and the level conversion core circuit.

9. A level converting circuit in accordance with claim 1, wherein:
the control circuit produces control signals to control the pull-down circuit.

10. A level converting circuit in accordance with claim 1, wherein:
the pull-down circuit comprises:
at least two n-MOS each of which comprises a source terminal connected to the GND power source, a gate terminal connected to a control signal from the control circuit, and a drain terminal connected to the level conversion output, and
an n-MOS including a source terminal connected to the GND power source, a gate terminal connected to a control signal from the third logic circuit or to an inverted signal of the control signal from the third logic circuit, and a drain terminal connected to the level conversion output.

11. A level shifter in accordance with claim 1, wherein:
the pull-down circuit further comprises:
at least two n-MOS each of which comprises a source terminal connected to the GND power source, a gate terminal connected to a control signal from the control circuit, and a drain terminal connected to the level conversion output.

12. A level converting circuit in accordance with claim 1, wherein:
the control circuit comprises:
a first AND-NOR circuit to which the second power source is supplied and which receives as inputs thereto a positively inverted signal of the level conversion input signal, an inverted signal of the level conversion output signal, and a control circuit control signal of the third logic circuit or an inverted signal of the control signal of the third logic circuit,
a second AND-NOR circuit to which the second power source is supplied and which receives as inputs thereto an inverted signal of the level conversion input signal, a positively inverted signal of the level conversion output, and the control signal of the third logic circuit or the inverted signal of the control signal of the third logic circuit, and
at least two inverters to which the second power source is supplied and which receive as inputs thereto outputs from the respective AND-NOR circuits, wherein each output signal from the inverters is produced as control signals and each output signal from the inverters is produced as control signals of the level conversion core circuit, and
the pull-down circuit comprises at least two n-MOS each of which comprises a source terminal connected to the GND power source, a gate terminal connected to a control signal from the control circuit, and a drain terminal connected to the level conversion output.

13. A level converting circuit in accordance with claim 1, wherein:
the control circuit comprises:
a first OR-NAND circuit to which the second power source is supplied and which receives as inputs thereto an inverted signal of the level conversion input signal, a positively inverted signal of the level conversion output signal, and a control circuit control signal of the third logic circuit, and
a second OR-NAND circuit to which the second power source is supplied and which receives as inputs thereto a positively inverted signal of the level conversion input signal, an inverted signal of the level conversion output, and the control signal of the third logic circuit,
wherein each output signal from the first and second OR-NAND circuits is produced as control signals, each output signal from the OR-NAND circuits is produced as control signals of the level conversion core circuit, and
the pull-down circuit comprises at least two n-MOS each of which includes a source terminal connected to the GND power source, a gate terminal connected to a control signal from the control circuit, and a drain terminal connected to the level conversion output.

14. A level converting circuit in accordance with claim 1, wherein:
the control circuit comprises:
a first AND-NOR circuit to which the second power source is supplied and which receives as inputs thereto a positively inverted signal of the level conversion input signal, an inverted signal of the level conversion output signal, and a control circuit control signal of the third logic circuit or an inverted signal of the control signal, of the third logic circuit
a second AND-NOR circuit to which the second power source is supplied and which receives as inputs thereto an inverted signal of the level conversion input signal, a positively inverted signal of the level conversion output, and the control signal of the third logic circuit or the inverted signal of the control signal, of the third logic circuit and
at least two inverters to which the second power source is supplied and which receive as inputs thereto outputs from the respective AND-NOR circuits, wherein each output signal of the inverters is produced as control signals of the level conversion core circuit.

15. A level converting circuit in accordance with claim 1, wherein:
the control circuit comprises:
a first OR-NAND circuit to which the second power source is supplied and which receives as inputs thereto an inverted signal of the level conversion input signal, a positively inverted signal of the level conversion output signal, and a control circuit control output of the third logic circuit, and
a second OR-NAND circuit to which the second power source is supplied and which receives as inputs thereto a positively inverted signal of the level conversion input signal, an inverted signal of the level conversion output, and the control output of the third logic circuit,
wherein each output signal from the OR-NAND circuits is produced as control signals of the level conversion core circuit.

16. A level converting circuit in accordance with claim 1, wherein:
the control circuit comprises:
a first OR-NAIND circuit to which the second power source is supplied and which receives as inputs thereto an inverted signal of the level conversion input signal, a positively inverted signal of the level conversion output signal, and a control signal of the third logic circuit,
a second OR-NAND circuit to which the second power source is supplied and which receives as inputs thereto a positively inverted signal of the level conversion input signal, an inverted signal of the level conversion output, and the control signal of the third logic circuit, and
the pull-down circuit comprises at least two n-MOS each of which includes a source terminal connected to the GND power source, a gate terminal connected to a control signal from the control circuit, and a drain terminal connected to the level conversion output.

* * * * *